(12) United States Patent
Cyr et al.

(10) Patent No.: US 7,580,684 B2
(45) Date of Patent: Aug. 25, 2009

(54) PROGRAMMABLE RADIO TRANSCEIVER

(75) Inventors: Russell J. Cyr, Pepperell, MA (US); Geoffrey C. Dawe, Newburyport, MA (US)

(73) Assignee: BitWave Semiconductor, Inc., Lowell, MA (US)

( * ) Notice: Subject to any disclaimer, the term of this patent is extended or adjusted under 35 U.S.C. 154(b) by 731 days.

(21) Appl. No.: 11/055,589

(22) Filed: Feb. 10, 2005

(65) Prior Publication Data
US 2005/0227627 A1 Oct. 13, 2005

Related U.S. Application Data

(60) Provisional application No. 60/543,418, filed on Feb. 10, 2004.

(51) Int. Cl.
*H04B 1/40* (2006.01)
(52) U.S. Cl. .................. 455/75; 455/84; 455/323; 455/313; 375/298; 375/344
(58) Field of Classification Search ............. 455/75, 455/84, 323, 313; 375/298, 344
See application file for complete search history.

(56) References Cited

U.S. PATENT DOCUMENTS

| | | | |
|---|---|---|---|
| 3,538,450 A | 11/1970 | Andrea et al. | |
| 3,876,946 A * | 4/1975 | La Clair et al. | 702/77 |
| 4,031,330 A | 6/1977 | Van Leeywen et al. | |
| 4,525,865 A | 6/1985 | Mears | |
| 4,843,588 A | 6/1989 | Flynn | |
| 4,984,295 A | 1/1991 | Engstrom | |
| 4,988,957 A | 1/1991 | Thompson et al. | |
| 5,031,233 A | 7/1991 | Ragan | |
| 5,152,005 A | 9/1992 | Bickley | |
| 5,175,729 A | 12/1992 | Borras et al. | |

(Continued)

FOREIGN PATENT DOCUMENTS

EP 0664617 A 7/1995

(Continued)

OTHER PUBLICATIONS

M. Tiebout, et al.; LNA Design for a Fully Integrated CMOS Single Chip UMTS Transceiver; ESSCIRC 2002.
M. Torimau, et al.;Sharp Applies variable gate width to design a sub-nanosecond bulk CMOS gate array; British Library Mar. 1985.
S. Hung-Lung Tu; A Power-Adaptive CMOS Class E RF Tuned Power Amplifier for Wireless Communications; 0-7803-8182; IEEE Mar. 2003.

(Continued)

*Primary Examiner*—Yuwen Pan
(74) *Attorney, Agent, or Firm*—Lando & Anastasi, LLP

(57) ABSTRACT

A fully integrated, programmable mixed-signal radio transceiver comprising a radio frequency integrated circuit (RFIC) which is frequency and protocol agnostic with digital inputs and outputs, the radio transceiver being programmable and configurable for multiple radio frequency bands and standards and being capable of connecting to many networks and service providers. The RFIC includes a tunable resonant circuit that includes a transmission line having an inductance, a plurality of switchable capacitors configured to be switched into and out of the tunable resonant circuit in response to a first control signal, and at least one variable capacitor that can be varied in response to a second control signal, wherein a center resonant frequency of the resonant circuit is electronically tunable responsive to the first and second control signals that control a first capacitance value of the plurality of switchable capacitors and a second capacitance value of the at least one variable capacitor.

10 Claims, 30 Drawing Sheets

U.S. PATENT DOCUMENTS

| | | | |
|---|---|---|---|
| 5,187,450 A | 2/1993 | Wagner | |
| 5,291,516 A | 3/1994 | Dixon et al. | |
| 5,307,029 A | 4/1994 | Schenk | |
| 5,307,071 A | 4/1994 | Arnold et al. | |
| 5,378,334 A | 1/1995 | Dadoo et al. | |
| 5,461,344 A | 10/1995 | Andoh | |
| 5,528,222 A | 6/1996 | Moskowitz et al. | |
| 5,563,895 A | 10/1996 | Malkamaki et al. | |
| 5,574,405 A | 11/1996 | Razavi | |
| 5,655,003 A | 8/1997 | Erving et al. | |
| 5,712,628 A | 1/1998 | Phillips et al. | |
| 5,739,730 A | 4/1998 | Rotzoll | |
| 5,835,850 A | 11/1998 | Kumar | |
| 5,859,878 A | 1/1999 | Phillips et al. | |
| 5,867,535 A | 2/1999 | Phillips et al. | |
| 5,909,193 A | 6/1999 | Phillips et al. | |
| 5,953,640 A | 9/1999 | Meador et al. | |
| 5,969,929 A | 10/1999 | Kleveland et al. | |
| 5,973,575 A | 10/1999 | Kamogawa et al. | |
| 6,072,994 A | 6/2000 | Northrup | |
| 6,084,285 A | 7/2000 | Shahani et al. | |
| 6,091,765 A | 7/2000 | Harris | |
| 6,094,097 A | 7/2000 | Meng-Kun et al. | |
| 6,107,893 A | 8/2000 | Forbes | |
| 6,114,920 A | 9/2000 | Moon et al. | |
| 6,125,268 A | 9/2000 | Boesch et al. | |
| 6,147,567 A | 11/2000 | Welland et al. | |
| 6,157,206 A | 12/2000 | Taylor et al. | |
| 6,157,230 A | 12/2000 | O'Toole et al. | |
| 6,169,733 B1 | 1/2001 | Lee | |
| 6,181,734 B1 | 1/2001 | Palermo | |
| 6,185,418 B1 | 2/2001 | MacLellan et al. | |
| 6,198,332 B1 | 3/2001 | O'Toole et al. | |
| 6,201,454 B1 | 3/2001 | Kinayman et al. | |
| 6,205,133 B1 | 3/2001 | Bexten | |
| 6,211,747 B1 | 4/2001 | Trichet et al. | |
| 6,269,277 B1 | 7/2001 | Hershenson et al. | |
| 6,278,698 B1 | 8/2001 | O'Toole et al. | |
| 6,282,184 B1 | 8/2001 | Lehman et al. | |
| 6,285,865 B1 | 9/2001 | Vorenkamp et al. | |
| 6,335,952 B1 | 1/2002 | Lee et al. | |
| 6,343,207 B1 | 1/2002 | Hessel et al. | |
| 6,349,217 B1 | 2/2002 | Honcharenko et al. | |
| 6,353,640 B1 | 3/2002 | Hessel et al. | |
| 6,356,603 B1 | 3/2002 | Martin et al. | |
| 6,366,622 B1 | 4/2002 | Brown et al. | |
| 6,377,315 B1 | 4/2002 | Carr et al. | |
| 6,377,788 B1 | 4/2002 | Elder et al. | |
| 6,381,265 B1 | 4/2002 | Harris | |
| 6,388,597 B1 | 5/2002 | Maezawa et al. | |
| 6,389,078 B1 | 5/2002 | Harris | |
| 6,389,092 B1 | 5/2002 | Momtaz | |
| 6,404,293 B1 | 6/2002 | Darabi et al. | |
| 6,417,737 B1 | 7/2002 | Moloudi et al. | |
| 6,417,740 B1 | 7/2002 | Anh et al. | |
| 6,426,680 B1 | 7/2002 | Duncan et al. | |
| 6,462,594 B1 | 10/2002 | Robinson et al. | |
| 6,477,148 B1 | 11/2002 | Gardenfors et al. | |
| 6,483,355 B1 | 11/2002 | Lee et al. | |
| 6,483,391 B1 | 11/2002 | Magoon et al. | |
| 6,496,546 B1 | 12/2002 | Allpress et al. | |
| 6,498,819 B1 | 12/2002 | Martin | |
| 6,509,799 B1 | 1/2003 | Franca-Neto | |
| 6,510,185 B2 | 1/2003 | Lee et al. | |
| 6,510,313 B1 | 1/2003 | Rapeli | |
| 6,512,419 B1 | 1/2003 | Adams et al. | |
| 6,525,558 B2 | 2/2003 | Kim et al. | |
| 6,525,609 B1 | 2/2003 | Behzad | |
| 6,526,264 B2 | 2/2003 | Cognio | |
| 6,539,052 B1 | 3/2003 | Harris | |
| 6,545,516 B2 | 4/2003 | Ylamurto et al. | |
| 6,549,078 B1 | 4/2003 | Sridharan et al. | |
| 6,549,766 B2 | 4/2003 | Vorenkamp et al. | |
| 6,573,864 B2 | 6/2003 | Sanada et al. | |
| 6,580,328 B2 | 6/2003 | Tan et al. | |
| 6,583,679 B1 | 6/2003 | Cox et al. | |
| 6,584,146 B2 | 6/2003 | Bose et al. | |
| 6,591,091 B1 | 7/2003 | Vorenkamp et al. | |
| 6,608,527 B2 | 8/2003 | Moloudi et al. | |
| 6,621,365 B1 | 9/2003 | Hallivuori et al. | |
| 6,624,484 B2 | 9/2003 | Christensen et al. | |
| 6,624,668 B1 | 9/2003 | Robinson et al. | |
| 6,625,464 B1 | 9/2003 | Bandy et al. | |
| 6,631,261 B1 | 10/2003 | Farber | |
| 6,633,550 B1 | 10/2003 | Gardenfors et al. | |
| 6,636,747 B2 | 10/2003 | Harada et al. | |
| 6,650,653 B1 | 11/2003 | Horng et al. | |
| 6,653,904 B2 | 11/2003 | Franco-Neto | |
| 6,662,003 B2 | 12/2003 | Elder et al. | |
| 6,665,339 B1 | 12/2003 | Adams et al. | |
| 6,681,102 B1 | 1/2004 | Collier et al. | |
| 6,686,804 B1 | 2/2004 | Adams et al. | |
| 6,690,949 B1 | 2/2004 | Shamlov et al. | |
| 6,694,128 B1 | 2/2004 | Sorrells et al. | |
| 6,700,447 B1 | 3/2004 | Nilsson | |
| 6,704,549 B1 | 3/2004 | Sorrells et al. | |
| 6,710,424 B2 | 3/2004 | Schmidt | |
| 6,714,776 B1 | 3/2004 | Birleson | |
| 6,738,601 B1 | 5/2004 | Rofougaran et al. | |
| 6,741,639 B1 | 5/2004 | Yoshida et al. | |
| 6,747,524 B2 | 6/2004 | Takahashi et al. | |
| 6,747,531 B2 | 6/2004 | Vathulya | |
| 6,747,987 B1 | 6/2004 | Meador et al. | |
| 6,748,014 B1 | 6/2004 | Kuo et al. | |
| 6,748,204 B1 | 6/2004 | Razavi et al. | |
| 6,748,206 B1 | 6/2004 | Matsumoto | |
| 6,757,334 B1 | 6/2004 | Feher | |
| 6,759,904 B2 | 7/2004 | Behzad | |
| 6,765,540 B2 | 7/2004 | Toncich | |
| 6,774,685 B2 | 8/2004 | O'Toole et al. | |
| 6,774,736 B1 | 8/2004 | Kwek et al. | |
| 6,774,738 B2 | 8/2004 | Hammes et al. | |
| 6,778,023 B2 | 8/2004 | Chistensen | |
| 6,781,424 B2 | 8/2004 | Lee et al. | |
| 6,801,092 B1 | 10/2004 | Moloudi | |
| 6,801,097 B2 | 10/2004 | Wallace | |
| 6,801,777 B2 | 10/2004 | Rusch | |
| 6,804,309 B1 | 10/2004 | Morelos-Zaragoza | |
| 6,806,785 B2 | 10/2004 | Traub | |
| 6,819,197 B2 | 11/2004 | Maldonado | |
| 6,823,292 B2 | 11/2004 | Spencer | |
| 6,836,192 B1 | 12/2004 | Yang et al. | |
| 6,882,233 B2 | 4/2005 | Oh et al. | |
| 6,915,117 B2 | 7/2005 | Chominski et al. | |
| 6,960,962 B2 | 11/2005 | Peterzell et al. | |
| 7,020,444 B2 | 3/2006 | Shinbo et al. | |
| 7,031,668 B2 * | 4/2006 | Darabi et al. | 455/75 |
| 7,053,726 B2 | 5/2006 | Hino | |
| 7,103,337 B2 | 9/2006 | Uozumi et al. | |
| 7,148,759 B2 | 12/2006 | Marton | |
| 2001/0007151 A1 | 7/2001 | Vorenkamp et al. | |
| 2001/0008430 A1 | 7/2001 | Carr et al. | |
| 2001/0011013 A1 | 8/2001 | Vorenkamp et al. | |
| 2001/0038323 A1 | 11/2001 | Chistensen | |
| 2002/0063576 A1 | 5/2002 | Kim et al. | |
| 2002/0079972 A1 | 6/2002 | Su et al. | |
| 2002/0093385 A1 | 7/2002 | Nishiyama et al. | |
| 2002/0101907 A1 | 8/2002 | Dent et al. | |
| 2002/0111152 A1 | 8/2002 | Razavi et al. | |
| 2002/0135044 A1 | 9/2002 | Tille et al. | |
| 2002/0140869 A1 | 10/2002 | Carr et al. | |
| 2002/0141511 A1 | 10/2002 | Meyers et al. | |
| 2002/0151287 A1 | 10/2002 | Lindquist et al. | |
| 2002/0163396 A1 | 11/2002 | Lim et al. | |

| | | | |
|---|---|---|---|
| 2002/0163407 A1 | 11/2002 | Vathulya | |
| 2002/0187763 A1 | 12/2002 | Lim et al. | |
| 2002/0193084 A1 | 12/2002 | Lim et al. | |
| 2002/0193140 A1 | 12/2002 | Behrens et al. | |
| 2003/0003887 A1 | 1/2003 | Lim et al. | |
| 2003/0021367 A1 | 1/2003 | Smith | |
| 2003/0025563 A1 | 2/2003 | Christensen | |
| 2003/0025579 A1 | 2/2003 | Christensen | |
| 2003/0030495 A1 | 2/2003 | Franca-Neto | |
| 2003/0043950 A1 | 3/2003 | Hansen et al. | |
| 2003/0057429 A1 | 3/2003 | Schmidt | |
| 2003/0072320 A1 | 4/2003 | Seo et al. | |
| 2003/0099210 A1 | 5/2003 | O'Toole et al. | |
| 2003/0116810 A1 | 6/2003 | Kim | |
| 2003/0137358 A1 | 7/2003 | Lee et al. | |
| 2003/0162521 A1 | 8/2003 | Vorenkamp et al. | |
| 2003/0194978 A1 | 10/2003 | Vorenkamp et al. | |
| 2003/0227332 A1 | 12/2003 | Lee et al. | |
| 2004/0014428 A1 | 1/2004 | Franca-Neto | |
| 2004/0021181 A1 | 2/2004 | Christensen | |
| 2004/0042539 A1 | 3/2004 | Vishakhadatta et al. | |
| 2004/0051095 A1 | 3/2004 | Oosawa et al. | |
| 2004/0053595 A1 | 3/2004 | Shinbo et al. | |
| 2004/0092242 A1 | 5/2004 | Endo | |
| 2004/0155687 A1 | 8/2004 | Lee et al. | |
| 2004/0232999 A1 | 11/2004 | Kim | |
| 2005/0041755 A1 | 2/2005 | Hammes | |
| 2005/0070325 A1 | 3/2005 | Bellaouar et al. | |
| 2005/0088249 A1 | 4/2005 | Oehm et al. | |
| 2005/0190002 A1 | 9/2005 | Takinami et al. | |
| 2006/0030277 A1 | 2/2006 | Cyr et al. | |

FOREIGN PATENT DOCUMENTS

| | | |
|---|---|---|
| EP | 0762662 A2 | 3/1997 |
| EP | 0841754 A3 | 12/1998 |
| EP | 1071249 | 1/2001 |
| EP | 1091398 A1 | 4/2001 |
| EP | 1154569 A2 | 11/2001 |
| EP | 1251577 A2 | 10/2002 |
| EP | 1282227 A2 | 2/2003 |
| EP | 1032982 B1 | 4/2003 |
| EP | 1320189 A | 6/2003 |
| EP | 1331742 A2 | 7/2003 |
| EP | 1356651 | 10/2003 |
| EP | 1381163 A1 | 1/2004 |
| EP | 1391989 A1 | 2/2004 |
| EP | 1032981 B1 | 8/2004 |
| EP | 1460762 A | 9/2004 |
| GB | 2105453 A | 3/1983 |
| GB | 2361123 A | 10/2001 |
| JP | 06224738 A2 | 8/1994 |
| JP | 2000-223656 A2 | 8/2000 |
| WO | WO 90/14709 A1 | 11/1990 |
| WO | WO 94/21061 A1 | 9/1994 |
| WO | WO 95/29566 A1 | 11/1995 |
| WO | 9708839 A2 | 3/1997 |
| WO | 9708840 A2 | 3/1997 |
| WO | WO 98/37639 A1 | 8/1998 |
| WO | WO 98/47190 A1 | 10/1998 |
| WO | 9923762 A | 5/1999 |
| WO | WO 99/25075 A2 | 5/1999 |
| WO | WO 99/63656 A | 12/1999 |
| WO | WO 01/61856 A1 | 8/2001 |
| WO | WO 02/31988 A2 | 4/2002 |
| WO | WO 02/084782 A2 | 10/2002 |
| WO | WO 02/084783 A1 | 10/2002 |
| WO | WO 02/084788 A1 | 10/2002 |
| WO | WO 02/084868 A1 | 10/2002 |
| WO | WO 02/084869 A1 | 10/2002 |
| WO | WO 02/089311 A3 | 11/2002 |
| WO | 03061174 A2 | 7/2003 |
| WO | WO 03/060543 A3 | 7/2003 |
| WO | WO 03/061108 A | 7/2003 |
| WO | WO 03/073661 A2 | 9/2003 |
| WO | WO 03/079699 A1 | 9/2003 |
| WO | WO 2004/010576 A1 | 1/2004 |
| WO | WO 2004/062087 A1 | 7/2004 |
| WO | 2005078916 A | 8/2005 |

OTHER PUBLICATIONS

A. Thanachayanout, et al.; CMOS RF Amplifier with Tuneable Band-Selection and Image Rejection; 0-7803-7765; IEEE Jun. 3, 2003.

A. Thanachayanont, et al.; Inductorless RF Amplifier with Tuneable Band-Selection and Image Rejection; 0-7803-7761; IEEE Mar. 2003.

G.K. Dehng, et al.; A Single-Chip RF Transceiver for Quad-Band GSM/GPRS Applications; IEEE Radio Frequency Integrated Circuits Symposium Aug. 4, 2004.

Sben Mattison, Architecture and Technology for Multistandard Transceivers; 0-7803-8108; IEEE Aug. 1, 2001.

W. Michielson et al.;Analysis and Design of a Double Tuned Clapp Oscillator for Multi-Band Multi-Standard Radio; British Library, Mar. 3, 2003.

D. Pfaff, et al.; A 14mA 2GHz 0.25 μm CMOS Quadrature Demodulator Including a Low Phase Noise Local Oscillator; British Library publication.

E. G•TZ, ET al.; A Quad-Band Low Power Single Chip Direct Conversion CMOS Transceiver with ΣV- -Modulation Loop for GSM; British Library Publication Apr. 3, 2003.

F. Behbahani, et al.; A Broad-Band Tunable CMOS Channel-Select Filter for a Low-IF Wireless Receiver; 0018-9200/00; IEEE 2000.

J. Loraine; Counting The Cost of RF System-On-Chip; British Library publication.

T. Schwanenberger, et al.; A Multi Standard Single-Chip Transceiver Covering 5.15 to 5.85GHz; ISCC 200, Session 20 Sep. 3, 2003.

K. Vavelidis, et al.; A Single-Chip, 5.15GHz-5.35GHz, 2.4GHz-2.5GHz, 0.18 μm CMOS RF Transceiver for 802.11 a/b/g Wireless LAN; 0-7803-8108; IEEE Apr. 3, 2003.

M. Zargari, et al.; A Single-Chip Dual-Band Tri-Mode CMOS Transceiver for IEEE 802.11a/b/g WLAN; 0-7803-8267-6; IEEE 2004.

Ahola, R., et al., "A Single Chip CMOS Transceiver for 802.11 a/b/g WLANs," 2004 IEEE International Solid-State Circuits Conference, 0-7803-8267-6, p. 92-93, 515-516.

Aktas, A., et al., "A Single Chip Radio Transceiver for 802.11 a/b/g WLAN in 0.18μ CMOS," 2003 IEEE, 0-7803-8163-7, ICECS, p. 938-941.

Chang, Y., et al., "An Inductorless Active Notch Filter for RF Image Rejection," 1999 IEEE, 0-7803-5491, p. 166-169.

ISSCC 2004, Feb. 16, 2004, Salon 9, Digest of Technical Papers, p. 97, 515-517.

Soens, C., et al., "RF Performance Degradation Due to Coupling of Digital Switching Noise in Lightly Doped Substrates," 2003 IEEE, 0-7803-7778-8, SSMSD, p. 127-132.

Soyuer, M., et al., "SP 24.7: A 3V 4GHz nMOS Voltage-Controlled Oscillator with Integrated Resonator," 1996 IEEE International Sold-State Circuits Conference, 0-7803-3136-2, p. 394-395, 480.

Wu, C-Y and Zhou Z-Y, "The Ddesign of 2V 2.4GHz CMOS Low-Noise Low-Power Bandpass Amplifier with Parallel Spiral Inductors," 1999 IEEE, 0-7803-5683, p. 769-772.

PCT International Search Report from corresponding PCT Application PCT/US2005/004279, filed Feb. 10, 2005.

Ahmed, A. et al., "CMOS VCO-prescaler cell-based design for RF PLL frequency synthesizers," 2000 *IEEE Proceedings ISCAS*, Geneva, vol. 2, May 2000, pp. 737-740.

Hwang, M. et al., A fully-integrated low power direct conversion transmitter with fractional-N PLL using a fast AFC technique for CDMA applications, Radio Frequency integrated Circuits (RFIC) Symposium, 2005, *Digest of Papers 2005 IEEE* Jun. 12-14, 2005, pp. 679-682.

Vaucher, C.S. et al., "A family of low-power truly modular programmable dividers in standard 0.35-um CMOS Technology," *IEEE J. Solid-State Circuits*, vol. 35, pp. 1039-1045, Jul. 2000.

* cited by examiner

US 7,580,684 B2

PROGRAMMABLE RADIO TRANSCEIVER

CROSS-REFERENCE TO RELATED APPLICATIONS

This application claims priority under 35 U.S.C. § 119(e) to U.S. Provisional Application No. 60/543,418 filed Feb. 10, 2004, which is herein incorporated by reference in its entirety. This application also claims priority under 35 U.S.C. § 119(a) to Taiwanese Application entitled "Programmable Radio Transceiver" filed February 2005 which in turn claims priority to the above-identified U.S. Provisional Application No. 60/543,418.

FIELD OF INVENTION

The present invention is directed to a programmable radio transceiver including a resonant LC circuit, a wideband programmable local oscillator and a built-in control module.

DISCUSSION OF RELATED ART

Wireless communications continues to grow at unprecedented rates. Today, there are over 1 billion mobile wireless devices worldwide. There are multiple frequency bands and communications standards/protocols for cellular, wide area, local area networks, public safety and military communications throughout the world that make ubiquitous communications difficult at best.

The demand for individual devices to use combinations of these converged services is growing rapidly (TAM is expected to exceed $3B by 2006). Many semiconductor and equipment companies, recognizing this growing market need, have turned to exotic, expensive materials such as Silicon-Germanium (SiGe) or microelectromechanical systems (MEMS) to achieve better performance, multi-feature integrated circuits. Others have turned to high power-consuming techniques such as high frequency sampling to create solutions.

Presently, to build a subscriber device that can address more than two frequency bands and different protocols has been costly and physically large. Most device manufacturers have tried by putting two different chipsets down on a single medium. In particular, one current design includes, for example, the Nokia D211 WLAN & GPRS PCMCIA card. This card uses both a multi-chip chipset for the WLAN portion and a STMicroelectronics chipset for the GPRS functionality. This methodology is costly, large and in-flexible.

An obstacle in the design of high-density, wideband, tunable integrated circuits in the GHz range is the need to provide resonant circuits with low losses that can be tuned over a wide frequency range. The present state of the art relies on circuits including inductors made from the metal layers in the semiconductor fabrication of application specific integrated circuits (ASICs) and system-on-chip (SoC) devices that can be modified in such a way as to form flat geometries of rectangular or spiral type of structures that store magnetic energy. These devices are called spiral inductors. The amount of inductance of such a device is determined by the number of turns and their physical size with respect to the chip area. Unfortunately one drawback to these types of inductor implementations is the inability to scale with technology node size (which defines parameters such as device gate length). In fact, as the node size in analog CMOS (complementary metal oxide semiconductor) technology is migrating toward gate lengths of 130 nm and below, the physical dimensions of inductive elements remain essentially the same, thereby impeding the reduction in total chip area. Additional problems associated with spiral inductors include their tendency to create conductor losses (resulting in low quality factor tuning circuits), to induce radiation and to induce electromagnetic field diffusion (eddy current) effects in the substrate.

There have been attempts made to construct LC resonant circuits with bondwires, as discussed for example in U.S. Pat. No. 6,806,785 to Traub, issued Oct. 19, 2004. The '785 patent discloses the use of a bond wire to form an inductor that is part of a narrowband oscillator circuit, describing the oscillator circuit as including voltage-variable capacitances, bondwire inductors, and a de-attenuation amplifier.

A fundamental building block in many telecommunications transceiver circuits is a frequency synthesizer. The purpose of the frequency synthesizer is to produce the required harmonic signals for frequency up-conversion in the transmitter and frequency down-conversion in the receiver. Frequency synthesis allows the generation of adjustable frequencies in small, accurate steps (e.g., 200 kHz for GSM, 1.728 MHz for DECT (digital enhanced cordless telephone), and the like) that are subsequently used in a mixer to enable band and channel selection.

The present state-of-the-art in frequency synthesis relies on either integer-N or fractional-N architectures realized in a phase lock loop (PLL) circuit having a phase detector, a low-pass filter, and a programmable divider in the feedback loop. One example of a conventional frequency synthesis circuit including a PLL with a programmable division factor frequency divider, a phase comparator with filters, a reference frequency oscillator and a reference divider is described in German Patent DE10131091 to D. Gapski, issued Jul. 18, 2002. Another example of a frequency synthesizer including a multiband frequency generator coupled to a multiple VCO configuration oscillator is described in U.S. Pat. No. 6,785,525 to Ries, issued Aug. 31, 2004. An example of dual frequency synthesis for communication and signal strength monitoring is described in GB2254971 to W. Torbjorn, published Oct. 12, 1992. In addition, several examples of direct digital frequency synthesis are described in U.S. Patent Application 2004264547 to Hinrichs et al, published 2004-12-30, U.S. Patent Application 2004176045 to Frank, published 2004-Sep.-9, and European Patent EP0409127 to Watanabe Nozomu, published 1991-Jan.-23.

However, the prior art is unsuitable for deployment in a single multi-band, multi-standard transceiver where space, cost, and wideband frequency operation is at a premium, for reasons such as inflexible, narrow-band frequency tuning capability and high component count implementation.

SUMMARY OF INVENTION

In view of the disadvantages present in the prior art, it would therefore be desirable to design and implement an RFIC that does not include spiral inductors and has a local oscillator that is capable of wide-band tuning so as to service multiple frequency bands. In addition, it may be desirable to incorporate in the RFIC a built-in test and evaluation module that may provide in situ monitoring of parameters of the RFIC and is capable of dynamically adjusting parameters of the RFIC to comply with multiple telecommunication standards.

Aspects and embodiments of the present invention are directed to a programmable mixed-signal radio transceiver comprising a low cost radio frequency integrated circuit (RFIC), which is frequency and protocol agnostic. Embodiments of the RFIC provide a fully integrated radio transceiver with digital inputs and outputs that is programmable and configurable for multiple radio frequency bands and standards and that is capable of connecting to many networks, service providers or standards.

According to one embodiment, a tunable resonant circuit fabricated in a semiconductor integrated circuit comprises at least one transmission line having an inductance, a plurality of switchable capacitors configured to be switched into and out of the tunable resonant circuit in response to a first control signal, and at least one variable capacitor that can be varied in response to a second control signal, wherein a center resonant frequency of the resonant circuit is electronically tunable responsive to the first and second control signals that control a first capacitance value of the plurality of switchable capacitors and a second capacitance value of the at least one variable capacitor.

In one example, the transmission line comprises a bondwire that interconnects the integrated circuit and a lead frame. Alternatively, the transmission line may be a microstrip line or coplanar waveguide line. The plurality of fixed capacitors may be, for example, metal oxide semiconductor MOS capacitors or metal-insulator-metal (MIM) capacitors. In another example, the resonant circuit may further comprise a switch network coupled to the plurality of switchable capacitors, the switch network being operable, responsive to the first control signal, to switch in and out any of the switchable capacitors to tune the first capacitive value to provide a selected range of the resonance frequency. The variable capacitor may be, for example, a varactor diode and the second capacitance value may be controlled by adjusting a bias voltage of the varactor diode responsive to the second control signal. The resonant circuit may be coupled to, for example, a voltage controlled oscillator (VCO) to control a tuning range of the VCO. In another example, the resonant circuit may be coupled to low noise amplifier (LNA) circuit and a reactance of the resonant circuit may be tuned so as to cancel a reactance of the low noise amplifier and match an input impedance of the low noise amplifier to a particular load impedance.

According to another embodiment, a method of tuning a resonant circuit over a plurality of frequency bands and within one frequency band of the plurality of frequency bands, the method comprises providing an inductance, providing a first capacitance value in parallel with the inductance from a plurality of switchable capacitors in response to a first control signal to tune the resonant circuit the one frequency band, and providing a second capacitance value in parallel with the inductance in response to a second control signal to tune the resonant circuit within the one frequency band.

In one example, providing the first capacitance value may includes switching in and out of the resonant circuit any of the switchable capacitors so as to obtain the first capacitance value. In another example, the second capacitance value may be provided by a varactor diode and providing the second capacitance may include varying a bias voltage of the varactor diode responsive to the second control signal. In another example, the method may include a step of controlling a tuning range of a voltage controlled oscillator by coupling the resonant circuit to the voltage controlled oscillator. In another example, the method may include a step of matching an input impedance of a low noise amplifier to a load by coupling the resonant circuit to the low noise amplifier, and tuning a reactance of the resonant circuit so as to balance a reactance of the low noise amplifier and match an input impedance of the low noise amplifier to the load.

According to another embodiment, a frequency synthesizer implemented as a phase locked loop comprises a voltage controlled oscillator that produces a VCO frequency signal, a resonant circuit coupled to the voltage controlled oscillator and adapted to adjust a tuning range of the voltage controlled oscillator, and a divider circuit coupled to the voltage controlled oscillator and positioned in a forward loop path of the phase locked loop, the divider circuit being adapted to produce a frequency that is a divided version of the VCO frequency signal.

In one example, the phase locked loop may comprise a second divider circuit positioned in a feedback path of the phase locked loop and adapted to provide a divided output signal, a phase detector coupled to the second divider circuit and adapted to receive the divided output signal and produce a loop tuning signal, and a reference frequency source coupled to the phase detector and adapted to produce a reference frequency signal. The phase detector may be adapted to produce the tuning signal based on a comparison of the divided output signal and the reference frequency signal. In another example, the phase locked loop further comprises a mixer positioned in the forward loop path and adapted to receive the first frequency signal and the VCO frequency signal and to produce an output signal, wherein the divided output signal is a divided version of the output signal. In one example, the reference frequency source may comprise a direct digital synthesizer including a reference crystal oscillator, and a reference center frequency of the reference frequency signal may be determined by a control signal received by the direct synthesizer from a microcontroller that is integrated in a semiconductor chip with the frequency synthesizer. In addition, the a VCO center frequency of the VCO frequency signal may be tuned based on a combination of the loop tuning signal and the resonant tuning signal.

According to another example, the resonant circuit coupled to the frequency synthesizer may be an LC resonant circuit comprising at least one transmission line having an inductance, a plurality of switchable capacitors configured to be switched into and out of the tunable resonant circuit in response to a first control signal, and at least one variable capacitor that can be varied in response to a second control signal, wherein a center resonant frequency of the resonant circuit is electronically tunable responsive to the first and second control signals that control a first capacitance value of the plurality of switchable capacitors and a second capacitance value of the at least one variable capacitor. Furthermore, a resonant center frequency of the resonant tuning signal may be selected by controlling the first capacitance value such that a resonance of the resonant circuit falls within a selected frequency band, and by controlling the variable capacitor to tune the resonant center frequency within the selected frequency band. The VCO center frequency may be within the selected frequency band.

According to another embodiment, a method of generating a local oscillator frequency signal using a phase-locked loop comprises providing a control signal to a voltage controlled oscillator (VCO) to cause the voltage controlled oscillator to produce a VCO frequency signal, controlling a resonant circuit that is coupled to the voltage controlled oscillator to produce a resonant tuning signal, controlling a tuning range of the voltage controlled oscillator with the resonant tuning signal, dividing the VCO frequency signal with a first divider circuit positioned in a forward loop path of the phase-locked loop to produce a first frequency signal, and mixing the first frequency signal with the VCO frequency signal to generate the local oscillator frequency signal.

In one example, the method may further comprise dividing the local oscillator frequency signal with a second divider circuit positioned in a feedback path of the phase-locked loop to produce a divided local oscillator frequency signal, generating a reference frequency signal, and comparing the divided local oscillator frequency signal with the reference frequency signal to produce a loop tuning signal. In another example, the method may further comprise tuning a center frequency of the VCO frequency signal based on a combination of the loop tuning signal and the resonant tuning signal. In a further example, the resonant circuit may comprise a parallel connected combination of an inductor, a plurality of switchable capacitors and at least one variable capacitor, and controlling the resonant circuit to produce the resonant tuning signal may comprise switching into the resonant circuit selected ones of the plurality of switchable capacitors so as to select a frequency band for the resonant tuning signal, and tuning the at least one variable capacitor so as to select for the resonant frequency signal a center frequency within the frequency band. In one example, the at least one variable capacitor may be a varactor diode and tuning the at least one variable capacitor may include controlling a bias voltage of the at least one varactor diode. In addition, generating the reference frequency signal may comprise controlling a direct digital synthesizer to produce the reference frequency signal having a reference center frequency determined in response to a reference control signal.

According to another embodiment, a method of tuning a wideband local oscillator may include providing an inductance, a first capacitance value and a second capacitance value, all connected in parallel, to provide a resonant circuit, selecting the first capacitance value from a plurality of switchable capacitors in response to a first control signal to tune a resonant frequency signal of the resonant circuit to a selected frequency band, selecting the second capacitance value in response to a second control signal to tune the resonant frequency within the one frequency band, and coupling the resonant frequency signal to a voltage controlled oscillator to tune the local oscillator.

According to another embodiment, a wideband local oscillator may comprise a voltage controlled oscillator adapted to receive a resonant tuning signal and to generate a local oscillator signal, the local oscillator signal having a center frequency determined at least in part by the resonant tuning signal, a resonant circuit including an inductor, a first capacitance and a second capacitance all connected in parallel, the resonant circuit being coupled to the voltage controlled oscillator and being adapted to generate the resonant tuning signal, the first capacitance comprising a plurality of switchable capacitors coupled to switches that allow selected ones of the plurality of switchable capacitors to be connected in the resonant circuit, responsive to a capacitor control signal, thereby determining a value of the first capacitance, the second capacitance comprising at least one varactor diode adapted to be tuned in response to a diode control signal to determine a value of the second capacitance, and wherein a frequency the resonant tuning signal is determined based on the first capacitance value and the second capacitance value in combination with the inductance.

In one example of the wideband local oscillator, the plurality of switchable capacitors are configured such that by switching into the resonant circuit the selected ones of the plurality of switchable capacitors, and the first capacitance value is controlled so as to tune the frequency of the resonant tuning signal to one selected frequency band of a plurality of frequency bands. In another example, the at least one varactor diode may be configured such that tuning of a center frequency of the resonant frequency signal within the one selected frequency band is accomplished by adjusting the second capacitance value. In another example, controlling which selected ones of the plurality of switchable capacitors are connected into the resonant circuit may allow selecting of different frequency bands of the plurality of frequency bands, so as to allow tuning of the resonant tuning signal over the plurality of frequency bands and within one frequency band of the plurality of frequency bands.

According to another embodiment, there is provided an integrated evaluation and test module for a radio transceiver implemented on a semiconductor substrate, the radio transceiver comprising a receiver chain that generates a radio frequency signal, the integrated evaluation and test module being integrated on the semiconductor substrate with the radio transceiver. The evaluation and test module may include a control input adapted to receive a digital control signal, a signal input adapted to receive a digitized version of the radio frequency signal from the receiver chain of the radio transceiver, a processing module coupled to the signal input and adapted to receive and process the digitized version of the radio frequency signal from the receiver chain of the radio transceiver, and to provide a digital output signal, and a reference generator adapted to generate a digital reference signal based on information contained in the digital control signal. The evaluation and test module may further include a comparator coupled to the reference generator and to the processing module and adapted to receive the digital output signal and the digital reference signal, the comparator being configured to compare the digital output signal with the digital reference signal and to generate an error signal that identifies discrepancies between the digital output signal and the digital reference signal, and an adjustment module coupled to the comparator and adapted to receive the error signal from the comparator and to generate digital adjustment data, the adjustment module being further adapted to provide the digital adjustment data to at least one component of the receiver chain of the radio transceiver to adjust at least one parameter of the at least one component so as to modify the radio frequency signal to reduce the error signal.

In one example, of the integrated evaluation and test module, the processing module may comprise a processor configured to perform a Fourier transform on the digitized version of the radio frequency signal from the receiver chain of the radio transceiver to provide the digital output signal comprising frequency domain information about the radio frequency signal. In another example, the digital reference signal may contain frequency domain information corresponding to desired characteristics of the radio frequency signal. In another example, the comparator may be configured to compare the frequency domain information from the digital output signal with the frequency domain information contained in the digital reference signal and to generate the error signal which contains information about frequency domain variations between the digital output signal and the digital reference signal. In one example, the adjustment module includes a finite state machine.

According to another embodiment, a method of testing performance of at least one component of a receiver chain for compliance with a selected communication standard comprises receiving a digital control signal, receiving a digitized version of a radio frequency signal from the receiver chain, processing the digitized version of the radio frequency signal from the receiver chain to provide a digital output signal, and generating a digital reference signal based on information contained in the digital control signal. The method further comprises comparing the digital output signal with the digital reference signal, generating an error signal based on the comparison that identifies discrepancies between the digital output signal and the digital reference signal, generating digital adjustment data based on the error signal, and providing digital adjustment data to the at least one component of the receiver chain to adjust at least one parameter of the at least one component so as to modify the radio frequency signal to reduce the error signal.

In one example, processing the digitized version of the radio frequency signal includes performing a Fourier transform on the digitized version of the radio frequency signal to provide the digital output signal comprising frequency domain information about the radio frequency signal. In another example, generating the digital reference signal includes generating a digital reference signal containing frequency domain information corresponding to desired characteristics of the radio frequency signal. In a further example, comparing the digital output signal with the digital reference signal includes comparing the frequency domain information from the digital output signal with the frequency domain information contained in the digital reference signal, and generating the error signal includes generating an error signal that contains information about frequency domain variations between the digital output signal and the digital reference signal.

BRIEF DESCRIPTION OF DRAWINGS

In the drawings, which are not intended to be drawn to scale, each identical or nearly identical component that is illustrated in various figures is represented by a like numeral. For purposes of clarity, not every component may be labeled in every drawing. The drawings are provided for the purposes of illustration and explanation and are not intended as a definition of the limits of the invention. In the drawings.

DETAILED DESCRIPTION

Figure 1:
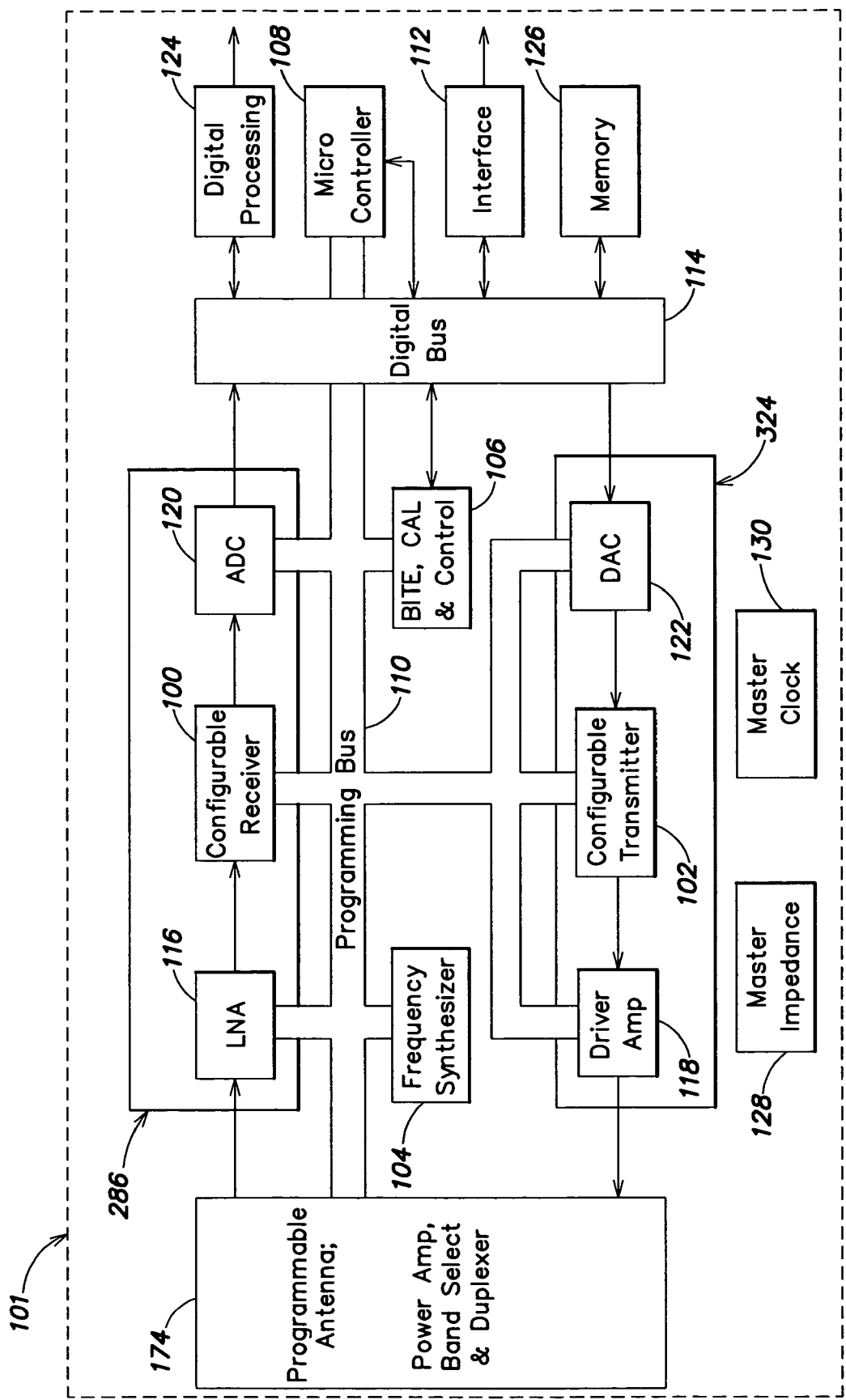
FIG. 1 is a block diagram of one embodiment of an RFIC according to aspects of the invention.

Various illustrative embodiments and aspects thereof will now be described in detail with reference to the accompanying figures. It is to be appreciated that this invention is not limited in its application to the details of construction and the arrangement of components set forth in the following description or illustrated in the drawings. The invention is capable of other embodiments and of being practiced or of being carried out in various implementations. Also, the phraseology and terminology used herein is for the purpose of description and should not be regarded as limiting. The use of "including," "comprising," "having," "containing," "involving," and variations thereof, herein is meant to encompass the items listed thereafter and equivalents thereof as well as additional items.

Aspects and embodiments of the present invention are directed to a programmable mixed-signal radio transceiver comprising a low cost radio frequency integrated circuit (RFIC), which is frequency and protocol agnostic. Embodiments of the RFIC provide a fully integrated radio transceiver with digital inputs and outputs that is programmable and configurable for multiple radio frequency bands and standards and that is capable of connecting to many networks, service providers or standards. The RFIC may be used by device manufacturers to build multi-mode or single mode devices that are low cost and small in size. The RFIC can be used, for example, in laptops, smartphones, personal digital assistant devices (PDAs), multi-media devices, public-safety radios, machine-to-machine communications devices, etc. This device can be used by, for example, IC solution providers or device designers and will allow manufacturers to use a single low cost CMOS re-configurable RFIC to increase features while lowering the cost and complexity of their designs. For example, the RFIC may replace several chips from various vendors, thereby reducing the size and cost of a radio transceiver device.

The reconfigurable architecture of the RFIC, according to embodiments of the invention, is unique in its approach to solving the problem of providing multi-standard compatibility, frequency flexibility, and customization with a single-chip IC. For example, one approach can leverage the high performance and low cost of standard 130 nm bulk CMOS technology and various aspects of the invention to allow for extremely high levels of integration and small die size. The RFIC may integrate a full transceiver that operates from, for example, about 400 MHz to 6 GHz and can include, for example, frequency generation and synthesis components, analog-to-digital converters, digital-to-analog converters and digital filtering, as discussed in more detail below.

Referring to FIG. 1, there is illustrated a block diagram of one embodiment of an RFIC according to aspects of the invention. As shown in FIG. 1, the RFIC 101 architecture comprises a configurable receiver 100, a configurable transmitter 102, a frequency synthesizer 104, a built-in test and evaluation (BITE) module 106 and an integrated microcontroller 108 coupled together via a programming bus 110. In one embodiment, the frequency synthesizer employs a wide band local oscillator architecture that comprises a narrow-band VCO combined with a programmable divider to generate local oscillator signals for the radio transceiver, as discussed in detail below. Through the use of a process running on the microcontroller 108, the programmable receiver 100 and programmable transmitter 102 can be configured for center operating frequency and dynamic range, and a number of parameters can be programmed. For example, the programmable receiver 100 may be configured for selectivity and sensitivity and various receiver parameters such as input center frequency, power gain, noise figure, bandwidth, sampling rate, effective number of bits (ENOB) and power consumption. Similarly, parameters of the programmable transmitter, such as input and output center frequencies, spurious output levels, noise, and dynamic range, may be configured by the microcontroller, as discussed in detail below. The microcontroller provides centralized control for the RFIC and may supply control signals to control multiple system parameters, as discussed below. Operation of the desired configuration of the programmable receiver and the programmable transmitter can be facilitated by the BITE module 106 implementing a closed-loop built in test and calibration. In one embodiment, the BITE module 106 enables accurate switching of the RF analog chain to different telecommunication standards as well as the monitoring and adjusting the circuit performance parameters, as discussed below.

The RFIC architecture can further comprise a programmable digital interface 112 coupled to the microcontroller 108 (and other components) via a digital bus 114. The programmable digital interface may be controlled by the microcontroller and programmed for parameters such as number of I/Os, common mode level, signal level, clocking speed, polarity, signal content, etc. The RFIC can also include any or all of a tunable low noise amplifier 116 and driver amplifier 118, an analog-to-digital converter (ADC) 120 and digital-to-analog converter (DAC) 122, a digital baseband processor module 124, a memory device 126, a master impedance module 128 and a master clock 130.

According to one embodiment, the RFIC may further comprise a programmable antenna assembly 174 that is coupled to the programming bus 110, the LNA 116 and the driver amplifier 118. The programmable antenna assembly may be adapted to receive RF signals (e.g., radio broadcasts, wireless phone or data signals, etc.) and to transmit RF signals. The programmable antenna assembly 174 may include components such as a duplexer to allow simultaneous transmission and reception of RF signals, amplifiers, and band selection circuitry to allow the antenna assembly to transmit and receive signals in an appropriate frequency band. These components may be controlled by signals from the microcontroller via the programming bus.

The RFIC according to embodiments of the invention is a mixed signal device, that is, a device that inputs, outputs and processes both RF signals and digital signals. To minimize noise generated by the microcontroller, ADC, DAC, BITE module and other digital components, tri-state outputs may be used. Tri-state outputs are floating, high ohmic impedance values in digital circuitry that essentially decouple the output of a digital circuit from the input of the next stage. The tri-state outputs present a high impedance to analog circuits such as the RF portions of the RFIC. As a result, any digital signals (i.e., state transitions from logic low to logic high or vice versa) are prevented from coupling to the analog circuits and causing noise in the analog circuitry.

According to one embodiment, a radio transceiver device using the RFIC of FIG. 1 may be provided having an architecture that eliminates or reduces the use of spiral inductors, thereby making the radio transceiver more scalable with improving semiconductor technologies. Specifically, at least one embodiment includes a methodology and device for implementing a tunable resonant circuit over a wide bandwidth (for example, 800 MHz to 2.5 GHz) using transmission lines, such as, for example, bondwires, microstrip lines, or co-planar waveguides, in a microelectronic integrated circuit such as complementary metal oxide semiconductor (CMOS) technology. According to one embodiment, a programmable resonant LC circuit may be created using fixed inductors formed by transmission lines in conjunction with fixed and tunable capacitive elements. This architecture enables the efficient implementation of wideband tuning circuits for analog circuits in the gigahertz range while eliminating the current state-of-the-art spiral inductors in resonance or tank circuits. The tunable resonant circuit can be used, for example, to form part of voltage controlled oscillators and analog amplifier blocks in the programmable radio transceiver device.

Figure 8:
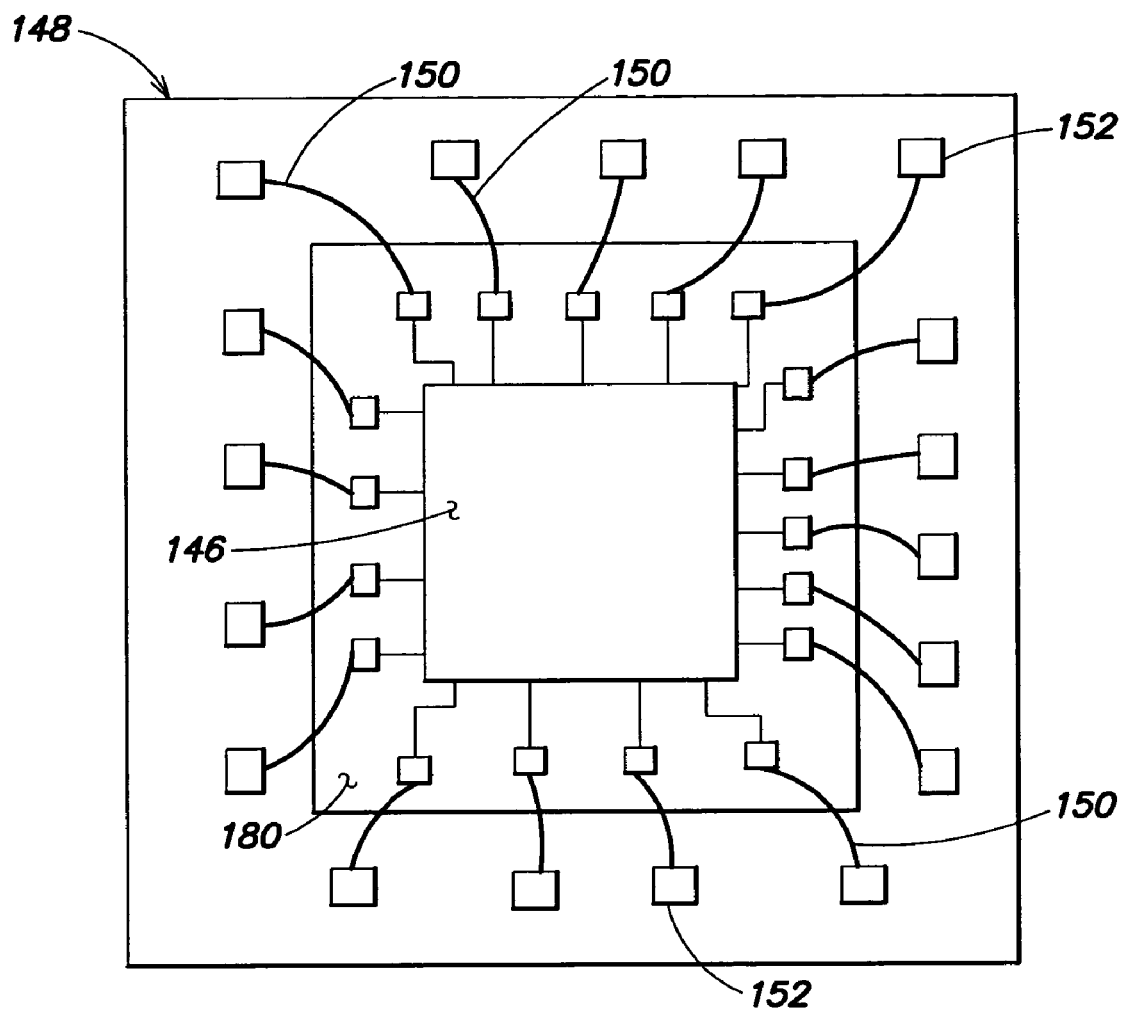
FIG. 8 is a block diagram illustrating coupling of an LC tank circuit to a semiconductor lead frame, according to aspects of the invention.

Referring to FIG. 8, there is illustrated a block diagram of one embodiment of bondwires 150 used to couple a circuit to a semiconductor base, such as a lead frame 148. The bondwires 150 are connected (e.g., soldered) to bonding pads 152 that are printed or etched on the semiconductor substrate that supports the circuit 180 and on the lead frame 148. According to one embodiment, the circuit 180 may comprise a reactive (LC) tank circuit that may be tuned for resonant frequency and input impedance, as discussed further below.

Figure 2:
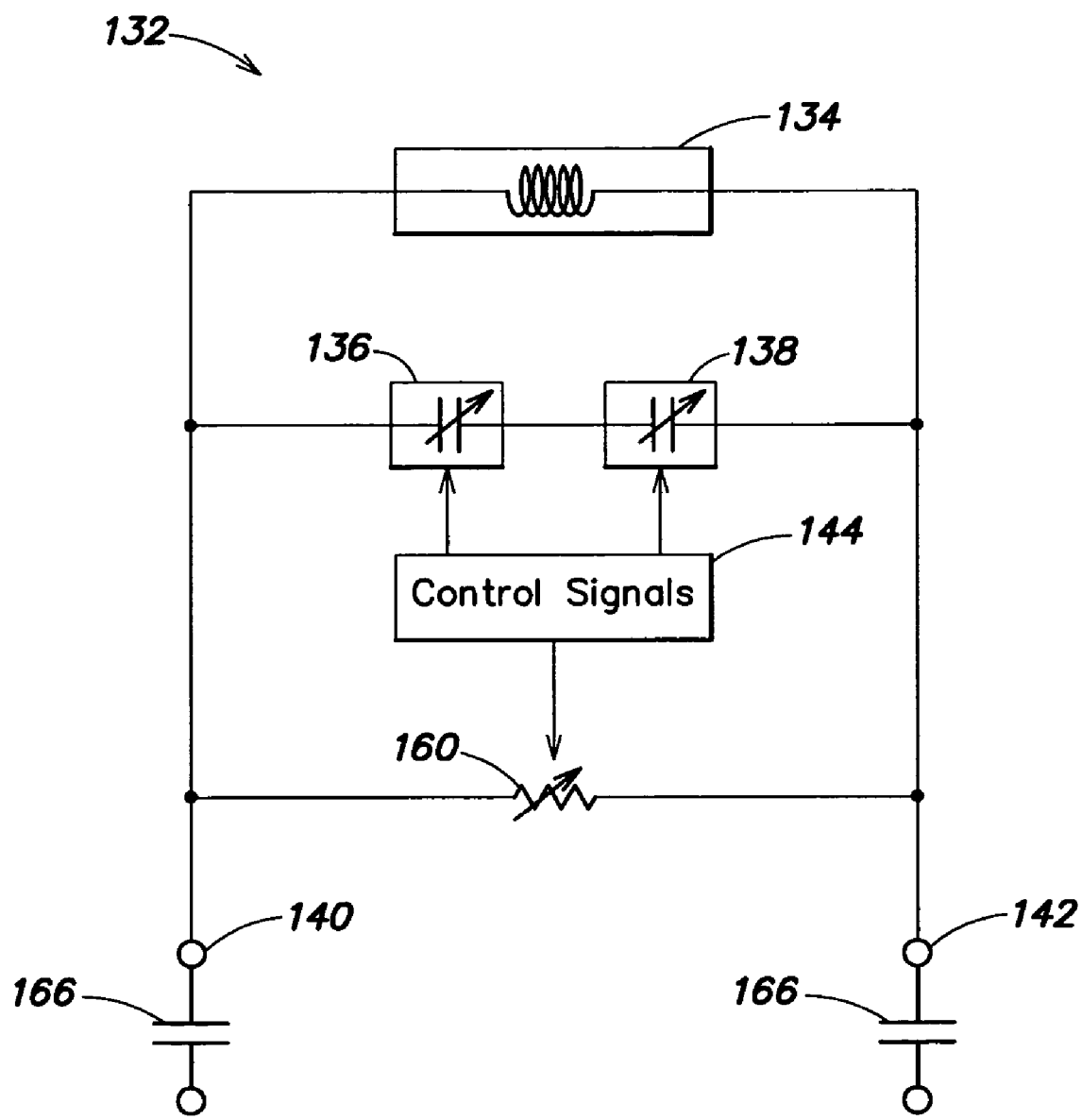
FIG. 2 is a block diagram of one embodiment of an LC resonant circuit according to aspects of the invention.

Referring to FIG. 2, there is illustrated a block diagram of one embodiment of a programmable resonant circuit 132 employing an inductor and a variable capacitance. The resonant circuit 132 includes an inductor 134 that may be formed by a transmission line structure, such as a bondwire, microstrip lines or coplanar waveguide lines. The inductor 134 is connected in parallel with tunable capacitive elements 136 and 138 between a first node 140 and a second node 142 that are used to couple the resonant circuit to other components and/or circuits. In one embodiment, the capacitance of the variable capacitive elements 136 and 138 may be controlled by control signals 144 from, for example, the microcontroller and/or BITE module, as discussed in more detail below.

According to one embodiment, the inductor 134 may be provided by the parasitic inductance associated with semiconductor packaging. More specifically, referring to FIG. 3, a semiconductor integrated circuit 146, such as the RFIC of the present invention, is typically coupled to a lead frame 148 using a plurality of bondwires 150. Each of these bondwires 150 has associated with it a certain inductance that is dependent on the length of the bondwire, the cross-sectional area of the bondwire and the spacing between adjacent bondwires. The bondwire 150 has a fixed self-inductance that may be approximately determined from the length and cross-section of the bondwire. In addition, mutual inductive coupling between closely spaced bondwires affects the inductance of each bondwire. A particular inductance can therefore be implemented by suitably adjusting length, cross section, and spacing of the bondwires.

Figure 3:
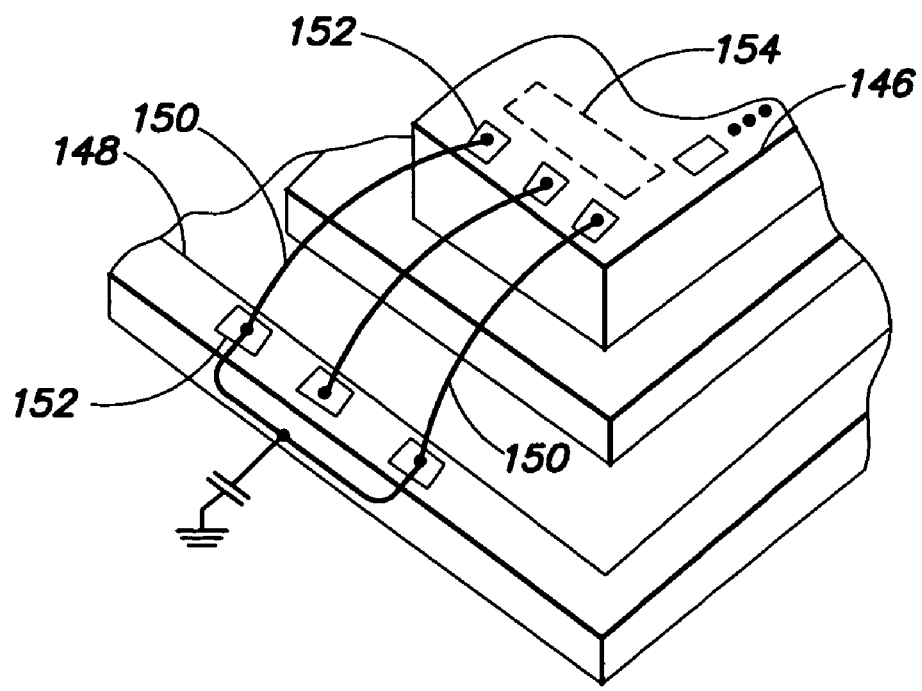
FIG. 3 is a diagram illustrating a perspective view of one embodiment of a bondwire inductor according to aspects of the invention.
Figure 4:
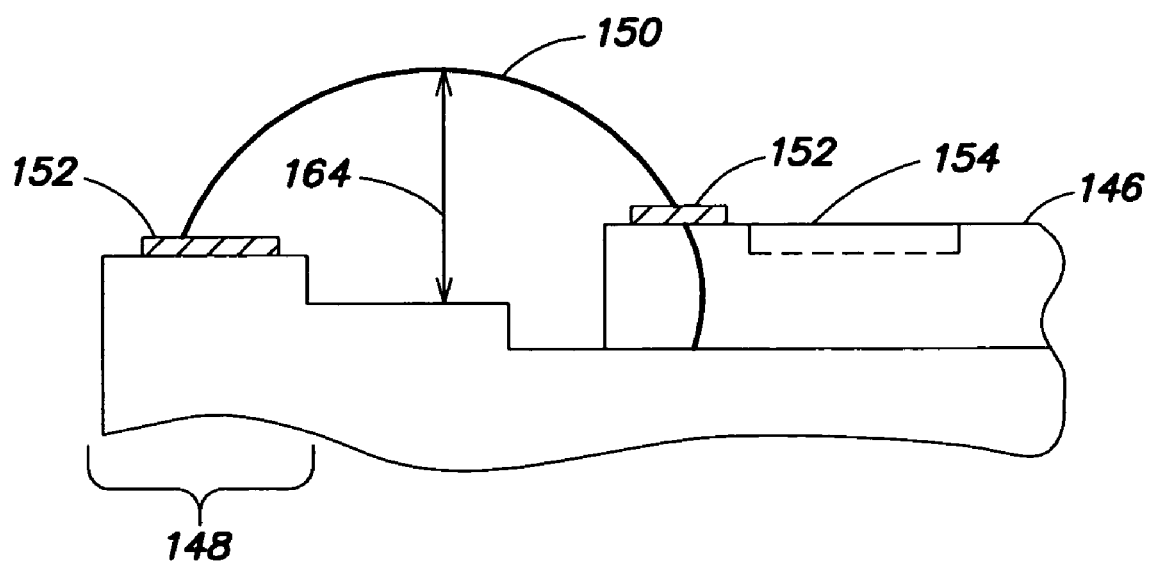
FIG. 4 is a cross-sectional diagram of FIG. 3.
Figure 11:
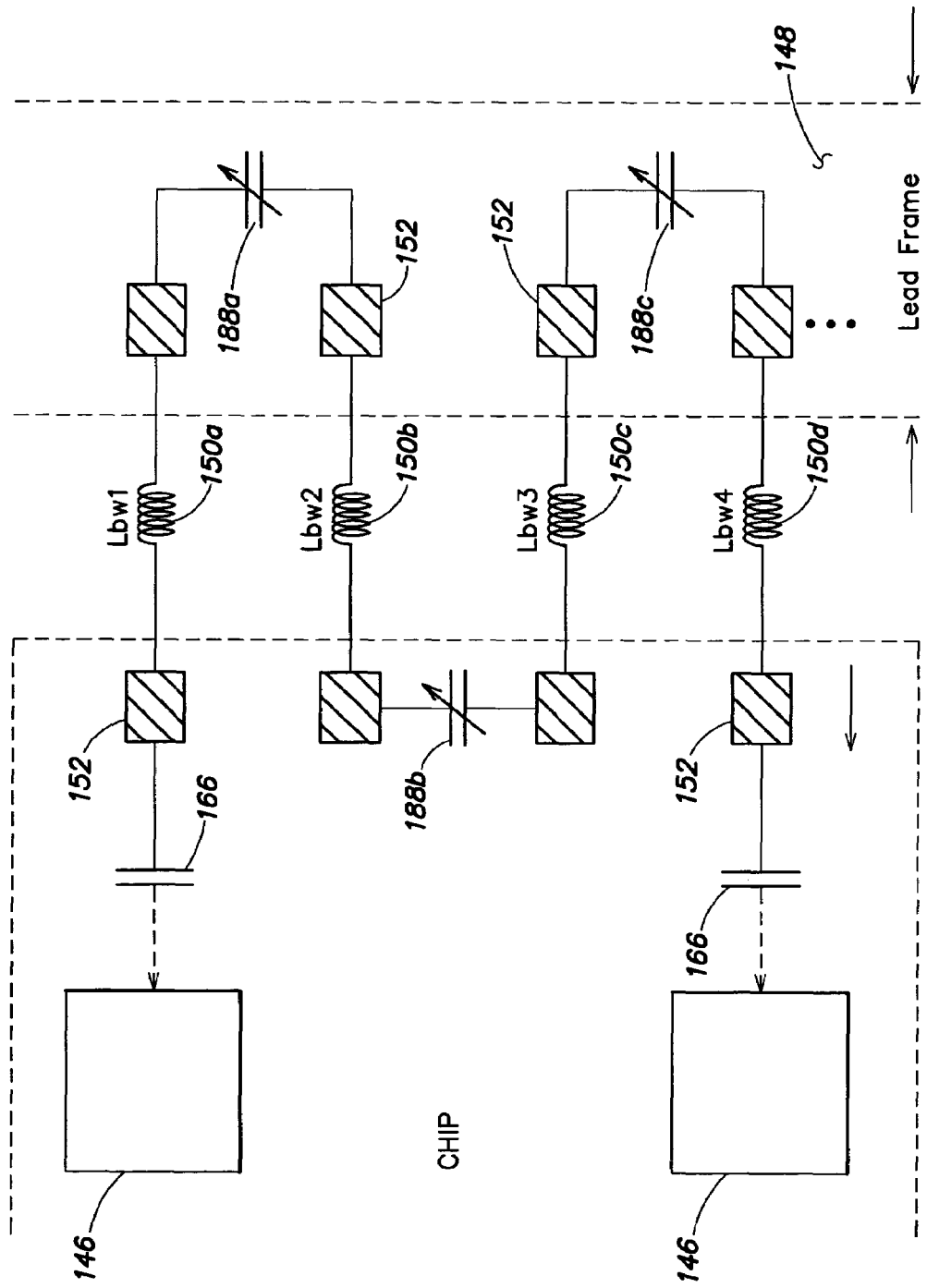
FIG. 11 is a circuit diagram model of one embodiment of an inductor formed of one or more bondwires, according to aspects of the invention.

Referring to FIGS. 3 and 4, the resonant LC circuit of FIG. 2 may be implemented using one or more such bondwires 150 of fixed inductance that interconnect bonding pads 152 on the RFIC 146 and the lead frame 148. In one example, the resonance circuit 132 may comprise at least two mutually coupled bondwire conductors 150. However it is to be appreciated that the invention is not limited to the use of two bondwires and one or more wires may be used in various applications. For example, referring to FIG. 11, there is illustrated a representative circuit diagram of another embodiment of a bondwire inductor configuration according to aspects of the invention. Three or more bondwires 150 may be connected, end-to-end in a meandering manner as shown in FIG. 11. For example, a first bondwire 150a may be coupled to a circuit (e.g., circuit 146) on a semiconductor chip via a coupling capacitor—and a bonding pad 152. The first bondwire inductor 150a may be coupled to a second bondwire inductor 150b via bonding pads 152 and a first capacitance 188a. The second bondwire inductance may in turn be coupled to a third bondwire inductor 150c via bonding pads 152 and a second capacitance 188b, which may also in turn be coupled to a fourth bondwire inductor 150d via bonding pads and a third capacitance 188c, as shown in FIG. 11. The pattern my be continued indefinitely to couple as many bondwire inductors together as may be desired for any given application. The fourth bondwire inductor may then be coupled to the semiconductor circuit 146 via a bonding pad 152 and another coupling capacitor 166. The meander-like configuration illustrated in FIG. 11 may be used to increase the inductance provided the bondwires. The capacitances 188a-c may be variable and may be used to control the overall reactance provided by the series of bondwire inductors. The ability to control the reactance may be desirable for a number of reasons, including added flexibility in controlling the input impedance of, for example, a resonant circuit to which the bondwire inductor belongs, and in impedance matching to other circuit components to which the bondwire inductors may be connected.

In addition, it is to be appreciated that the bondwires 150 act as transmission lines to transport energy between the chip bonding pads 152 and the lead frame. Therefore, the invention is not limited to the use of bondwires and other types of transmission lines, such as microstrip lines and coplanar waveguide lines may be used instead of or in addition to bondwires. Accordingly, although for clarity the following discussion will refer primarily to bondwires, it is to be understood that the principles discussed apply equally to other types of transmission lines.

Figure 5:
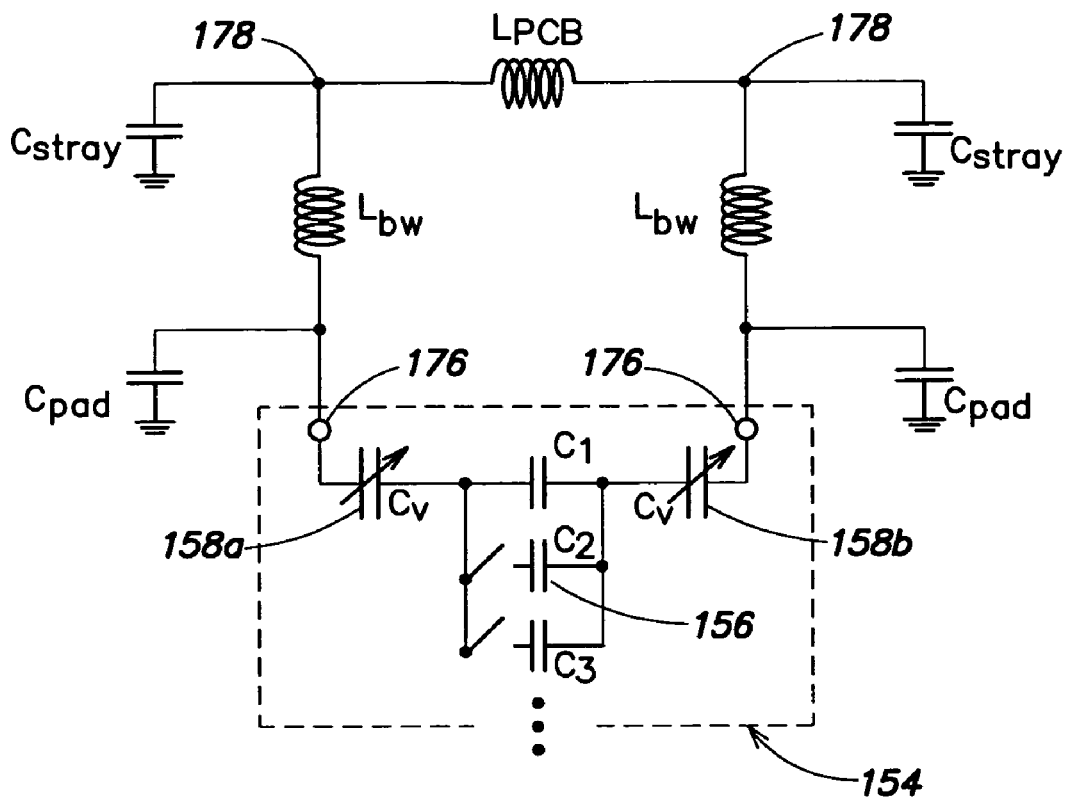
FIG. 5 is a circuit diagram illustrating one embodiment of a lumped element model of the distributed nature of the LC tank circuit depicted in the combination of FIGS. 2, 3 and 4.

The bondwire(s) 150 may be coupled with a tuning circuit that may include the fixed and variable capacitances that form part of the resonant circuit of FIG. 2. Referring to FIG. 5, there is illustrated a circuit diagram representing a lumped element model of the distributed nature of the LC tank circuit depicted in FIG. 2 and in FIGS. 3 and 4. Essentially, the bondwires 150 act like transmission lines that are terminated at a source-side 176 by capacitors of the tuning circuit 154, and at a load-side 178 are coupled either to one another or to ground via a small inductance $L_{pcb}$ that arises from the semiconductor substrate material. At a particular frequency, the transmission lines which represent the bondwires 150, can be approximated as a reactance with a fixed inductance $L_{bw}$. This is the inductance used to implement the fixed inductor 134 in the resonant circuit 132 of FIG. 2. Furthermore, the bonding pads 152 are plates with respect to the ground plane and thus act as parasitic capacitors Cstray and Cpad. It is to be appreciated that when selecting the fixed capacitors C1, C2, C3 and variable capacitors $C_v$ in the tuning circuit 154 to achieve a desired resonance, these parasitic capacitors Cstray and Cpad should be accounted for.

As illustrated in FIG. 2, according to one embodiment, the tuning circuit 154 includes two tunable capacitive elements 136, 138. In one embodiment, as illustrated in FIG. 5, the first tunable capacitive element 136 may comprise a switchable bank of fixed capacitors 156 (C1, C2, C3) and the second capacitive element 138 may comprise one or more variable capacitors 158a, 158b. The fixed and variable capacitors serve a dual purpose, namely selection of a particular resonance center frequency (for example, for the band selection of a multi-protocol cellular telephone standard), and compensation for fabrication process variations. Although the use of either fixed or variable capacitors is possible, both are provided in at least one embodiment of the invention to maximize flexibility and allow for both course and fine tuning over wide frequency ranges.

According to one embodiment, the switchable bank of fixed capacitors 156 may comprise a plurality of MOS (metal oxide semiconductor) or MIM (metal-insulator-metal) capacitor banks that may be electronically switched by the control signals 144 (see FIG. 2). It is to be appreciated that any type of fixed capacitor may be used, however, MOS or MIM capacitors are common to CMOS and other semiconductor integrated circuits and may therefore be used in one preferred embodiment. The resonant frequency of the resonant circuit 132 may be adjusted or tuned over a wide range by switching in and/or out one or more of the MOS capacitor banks. These fixed capacitors may have relatively large capacitances, for example, on the order of tens of Pico farads and may therefore be used to provide course tuning, for example, to select the frequency band of operation (e.g., 800 MHz, 1900 MHz, 2400 MHz, etc.). Fine tuning of the resonance circuit may be accomplished by controlling the capacitance of the variable capacitor(s) 158. In one embodiment, the variable capacitor(s) 158 may be implemented using one or more varactor diodes whose capacitance can be adjusted through a variable control voltage. Specifically, for a varactor diode, the junction capacitance is dependent on the reverse bias voltage $V_R$ according to the formula:

$$C(V_R) = \frac{C_{jo}}{(1 - V_R/\psi_0)^n}$$

where $C(V_R)$ is the junction capacitance, $C_{jo}$ is the junction capacitance under a zero volt bias voltage, $\psi_0$ is the so-called "built-in potential", which may be approximately 0.5V, and n is a technology parameter (dependent on the semiconductor fabrication technology) that may be approximately equal to 0.5. Generally, the bias voltage $V_R$ may be tunable from approximately 0-1.5V, depending on semiconductor fabrication technology. Therefore, the capacitance values of the varactor diodes may be normally below about 1 pF, and the varactors are thus suitable for fine tuning the overall capacitance of the resonant circuit 132. In one example, one or more banks of varactor diodes may be used to fine tune the resonant frequency of the resonance circuit over a range of several megahertz in a band more coarsely selected by switching in and out of the fixed capacitor bank(s). In addition, different varactor diodes may possess different zero bias junction capacitance values and thus further flexibility in tuning may be accomplished by creating one or more banks of varactor diodes with different zero bias junction capacitances.

Figure 6:
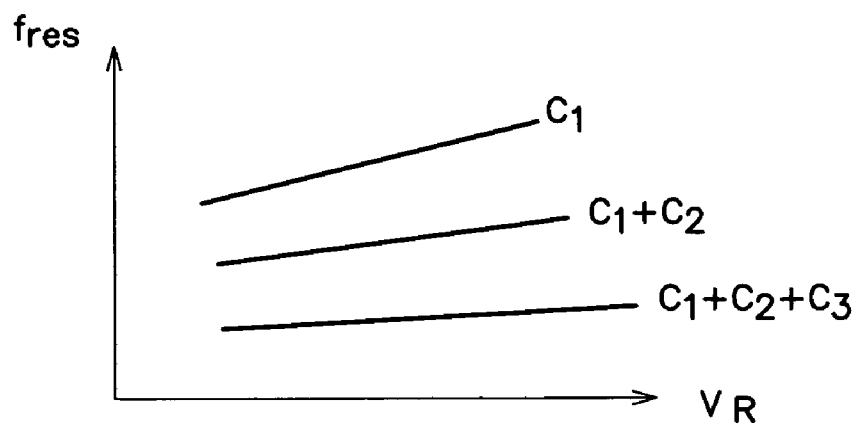
FIG. 6 is a graph illustrating the general relationship of resonant frequency as a function of bias voltage for the LC tank circuit of FIG. 5, according to aspects of the invention.

Referring to FIG. 6, there is illustrated an exemplary graph of resonance frequency as a function of applied bias voltage $V_R$ for a simulation of the resonance circuit of FIG. 5. As additional fixed capacitors are switched in to the circuit of FIG. 5, FIG. 6 illustrates that the resonance frequency decreases for the same bias voltage on the varactor diodes. Thus, as illustrated in FIG. 6, course tuning (e.g., frequency band selection) may be accomplished by switching in/out one or more fixed capacitors. For a given selection of fixed capacitors (e.g., slope C1), FIG. 6 illustrates that varying the bias voltage $V_R$ changes the resonant frequency by a small amount, and can therefore be used for fine tuning within a selected frequency band.

Figure 31:
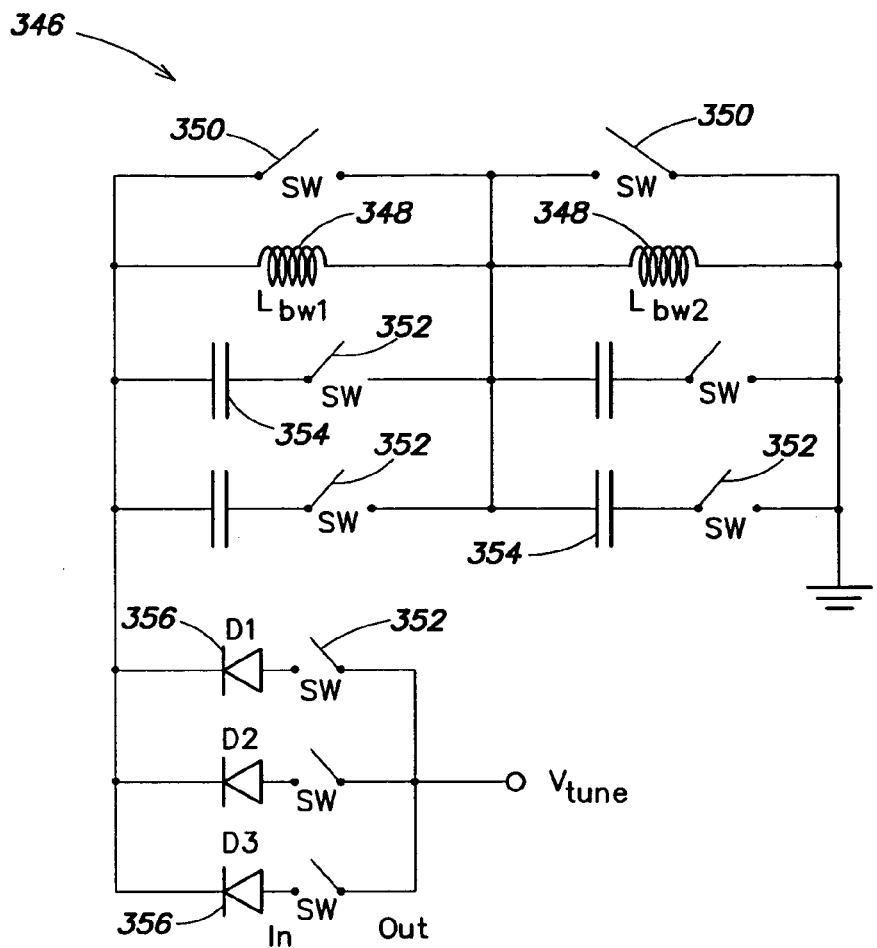
FIG. 31 is one example of a circuit diagram of a resonant circuit according to aspects of the invention.
Figure 32:
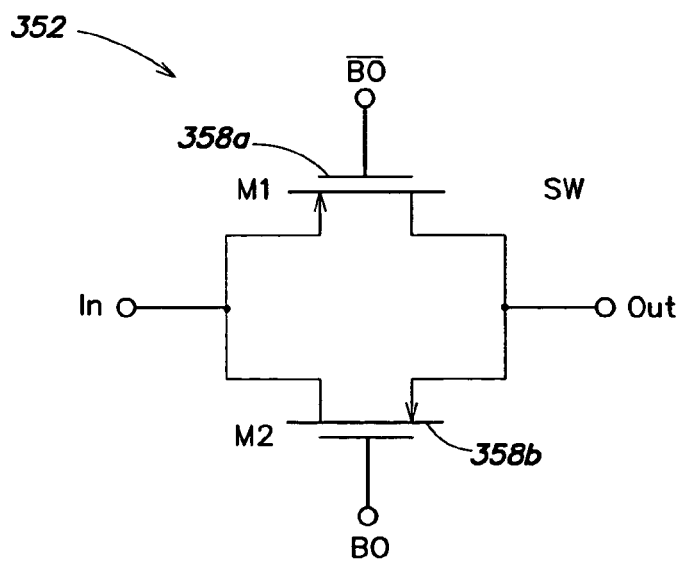
FIG. 32 is a circuit diagram of one embodiment of a switch that may be used with the circuit of FIG. 31 according to aspects of the invention.

Referring to FIG. 31, there is illustrated another embodiment of a resonant circuit 346 incorporating two bondwire inductors 348. Switches 350 may allow the bondwire inductors 348 to be coupled to additional bondwires, thereby adjusting the total inductance in the resonant circuit 346. Further switches 352 may allow the addition of capacitors 354 and varactor diodes 356 into the resonant circuit for the purpose of augmenting the inductive reactances of the bondwires 348 with capacitive reactances. In one embodiment, the switches 350 and/or 352 may be implemented using two MOS transistors 358a, 358b, as shown in FIG. 32. A digital signal B0 and its logical inverse $\overline{B0}$ may allow for current flow or no current flow respectively by controlling the voltage provided by the digital signal B0 to exceed the threshold voltage of the MOS transistors. The value of the digital voltage signal B0 may be supplied, for example, by the microcontroller 108 over the programming bus 110. As discussed further below, a voltage signal may be supplied from, for example, the BITE module 106 (see FIG. 1), to tune the reactance of the varactor diode(s). It is to be appreciated that the resonant circuit illustrated in FIG. 31 may be coupled in either series or parallel to, for example, the resonant circuit of FIG. 5. In addition, the additional capacitors and varactor diodes could be configured with one another in shunt or in series.

Thus, tuning of the resonant frequency of the resonant circuit 132 may be accomplished by switching in and/or out one or more individual or banks of fixed-value capacitors (e.g., MOS or MIM capacitors) for course tuning (e.g., band selection) and changing the bias voltage of the one or more varactor diode(s) for fine tuning. Fine tuning may be used not only to select a particular desired center frequency within a band, but also to compensate for temperature variation, manufacturing differences in the inductor values, frequency drift (e.g., with temperature), etc.

Figure 9:
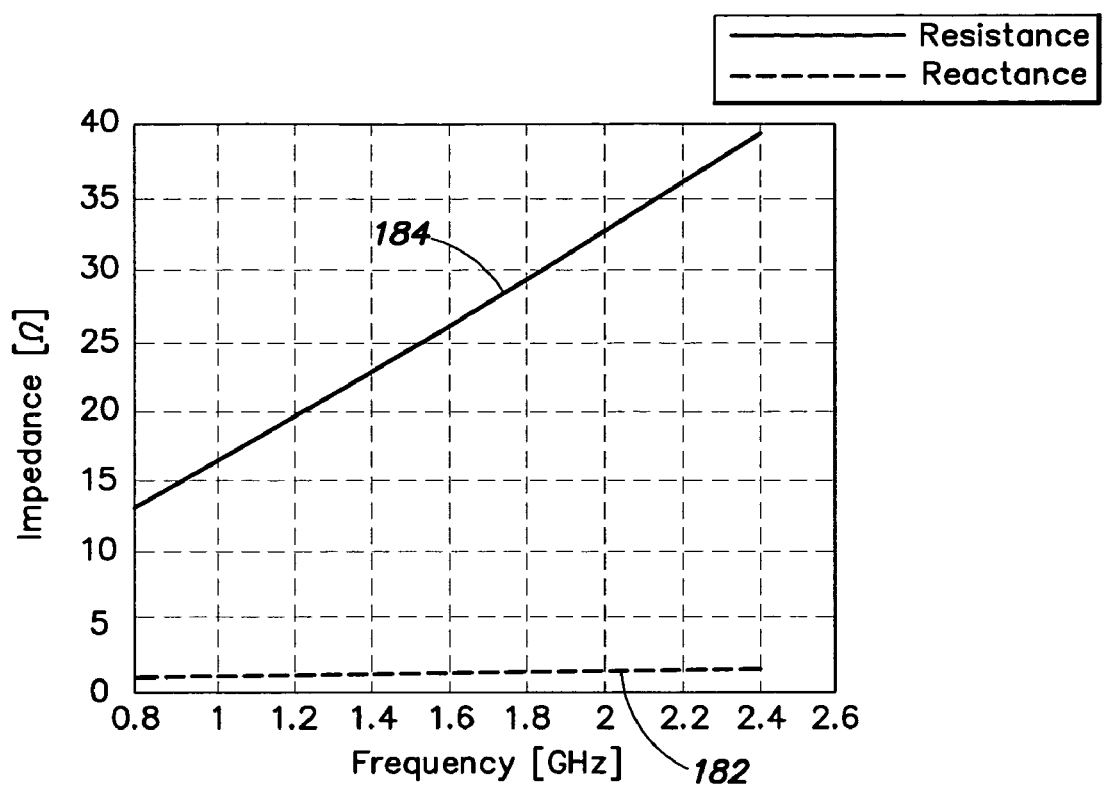
FIG. 9 is a graph illustrating input impedance as a function of frequency for one embodiment of a bondwire inductor, according to aspects of the invention.

According to some embodiments of the invention, the parasitic inductance inherent to a low-cost, high-volume, high pin count semiconductor assembly is utilized to replace conventional spiral inductors in resonant circuits on an RFIC. In particular, such embodiments of the invention exploit the bondwires between the lead frame and the bond pads of the microelectronic circuit and provide, in conjunction with fixed and variable capacitors, a high quality factor (O) resonance circuit without the use of spiral inductors. The Q of a circuit, defined as the ratio of stored energy in the resonance circuit to the dissipated energy from the resonance circuit, is enhanced when the parasitic resistance in an inductor-capacitor (LC) loop circuit is reduced. Typically, Q values above 20, under loaded circuit conditions, are considered high. The Q of an element may be affected by the element's resistance because higher resistance may tend to result in more dissipated energy. Like conventional single or dual layer integrated spiral inductors, bondwires exhibit low resistance, generally less than 25 mΩ per mm. As discussed above, bondwires 150 also have a reactance (inductance) that is dependent on various parameters, such as length, cross-section and mutual coupling with adjacent wires, and is also variable with frequency. Referring to FIG. 9, there is illustrated a graph of simulated input impedance of a bondwire as a function of frequency over a range of 0.8 GHz to 2.4 GHz. As shown in FIG. 9, the resistance (indicated by line 182) is small and fairly constant with frequency. The reactance (indicated by line 184) increases with increasing frequency.

Figure 10:
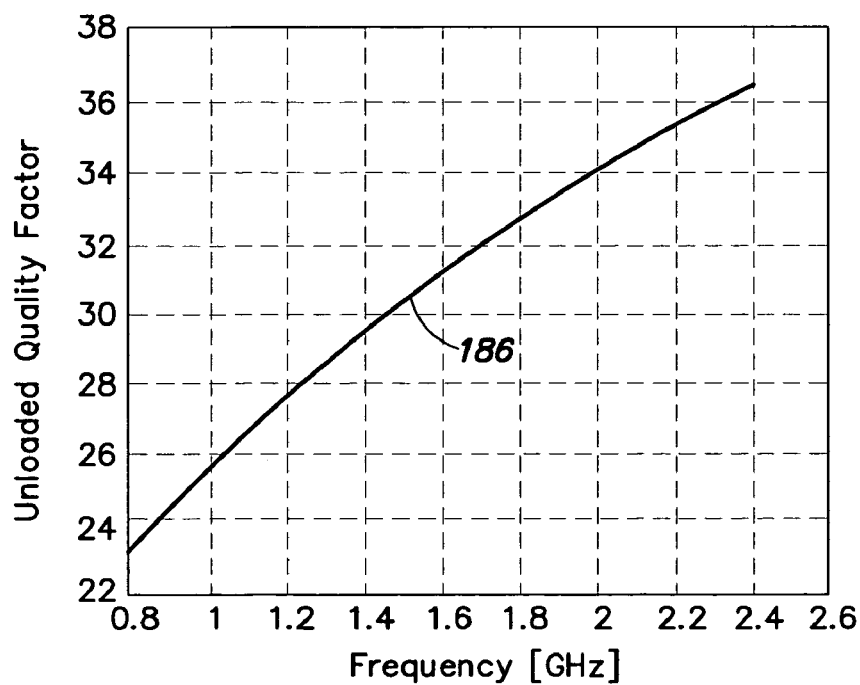
FIG. 10 is a graph illustrating unloaded quality factor as a function of frequency for one embodiment of a bondwire inductor, according to aspects of the invention.

Bondwires generally display an unloaded Q of about 30-60. Referring to FIG. 10, there is illustrated a graph of simulated unloaded Q 186 as a function of frequency over a range of 0.8 GHz to 2.4 GHz, for one embodiment of a bondwire 150. The unloaded Q is calculated as the ratio of the imaginary part of the input impedance of the bondwire (i.e., the reactance 184) to the real part of the input impedance of the bondwire (i.e., resistance 182), as shown in the formula below:

$$Q_{unloaded} = \frac{\text{Im}(Z_{in})}{\text{Re}(Z_{in})}$$

As shown in FIG. 10, the unloaded Q 186 for the bondwire increases with frequency and may easily exceed 40 at 3.5 GHz (based on extrapolation). Varactor diodes generally have an unloaded Q of less than 200, however, the Q can be improved by parallel connecting several varactor diodes. The overall loaded Q of the resonance circuit may be controlled by including a resistor 160 in parallel with the inductor and capacitors, as illustrated in FIG. 2. The Q may be tuned over a wide range by making this parallel resistor programmable. For example, the resistor 160 may be programmable via the control signals 144 (see FIG. 2 ).

One advantage of bondwire inductors over conventional spiral inductors is that bondwire inductors do not take up large chip areas. Also, because the bondwires are external to the integrated circuit chip 146, little electromagnetic field interference or coupling into the chip area is induced. However, a disadvantage is that the self-inductance of the bondwires may vary largely, for example, up to about 30% between different fabrications, due to process variations such as wire length 162, wire height 164 (see FIG. 4), soldering condition variations, etc. However, this disadvantage may be mitigated in the resonance circuit of the invention because inductance variations can be compensated for by a change in either or both of the fixed capacitances (e.g., the MOS capacitors and/or MIM capacitors) and the variable capacitance (e.g., the varactor diodes).

As discussed above, there have been attempts to develop narrow-band tuning circuits that incorporate bondwire inductors. However, in contrast to the prior art, the unique resonant circuit according to various embodiments of the present invention both includes a bondwire (or other transmission line) inductor to replace conventional spiral inductors and makes use of a plurality of fixed capacitors and variable capacitors controlled by control signals to achieve wideband tuning. Control signals are used to set a resonant frequency of the resonant circuit by controlling banks of switchable capacitors and by selecting the number of varactor diodes used in the resonant. In addition, further control signals are used to set the bias voltage applied to the varactor diodes to achieve fine tuning and to account for variance in the bondwire inductance due to manufacturing variability. In addition, closed-loop feedback control may be used to dynamically compensate for changing operating conditions and to enable automatic programmability of the resonant frequency range of the resonance circuit, as discussed in detail below.

In many applications, the tunable resonance circuit 132 (see FIG. 2) is coupled to other circuits, such as, for example, a voltage controlled oscillator (VCO), a low noise amplifier, a baseband amplifier, and others. Such coupling may be facilitated via tunable coupling capacitors in order to establish appropriate matching conditions. Referring to FIG. 2, the first node 140 and the second node 142 of the LC tank circuit 132 can be coupled to an external circuit, for example, a VCO, via coupling capacitors 166. These coupling capacitors separate the RF path from the DC bias for the varactor diodes and the VCO. According to one embodiment, the coupling capacitors 166 may be variable (i.e. having a tunable capacitance value) so as to vary the input impedance of the LC circuit at a given frequency, thereby improving matching of the LC circuit to the external circuit (e.g., the VCO). Good matching may be advantageous because it facilitates efficient power transfer from one circuit to another and improves the overall power efficiency of the RFIC. As an example, an advantage of one embodiment of the invention is that by coupling the LC tank circuit to, for example, a VCO, the tuning range and frequency band of the VCO can be controlled by controlling the resonance of the LC tank circuit.

Figure 7:
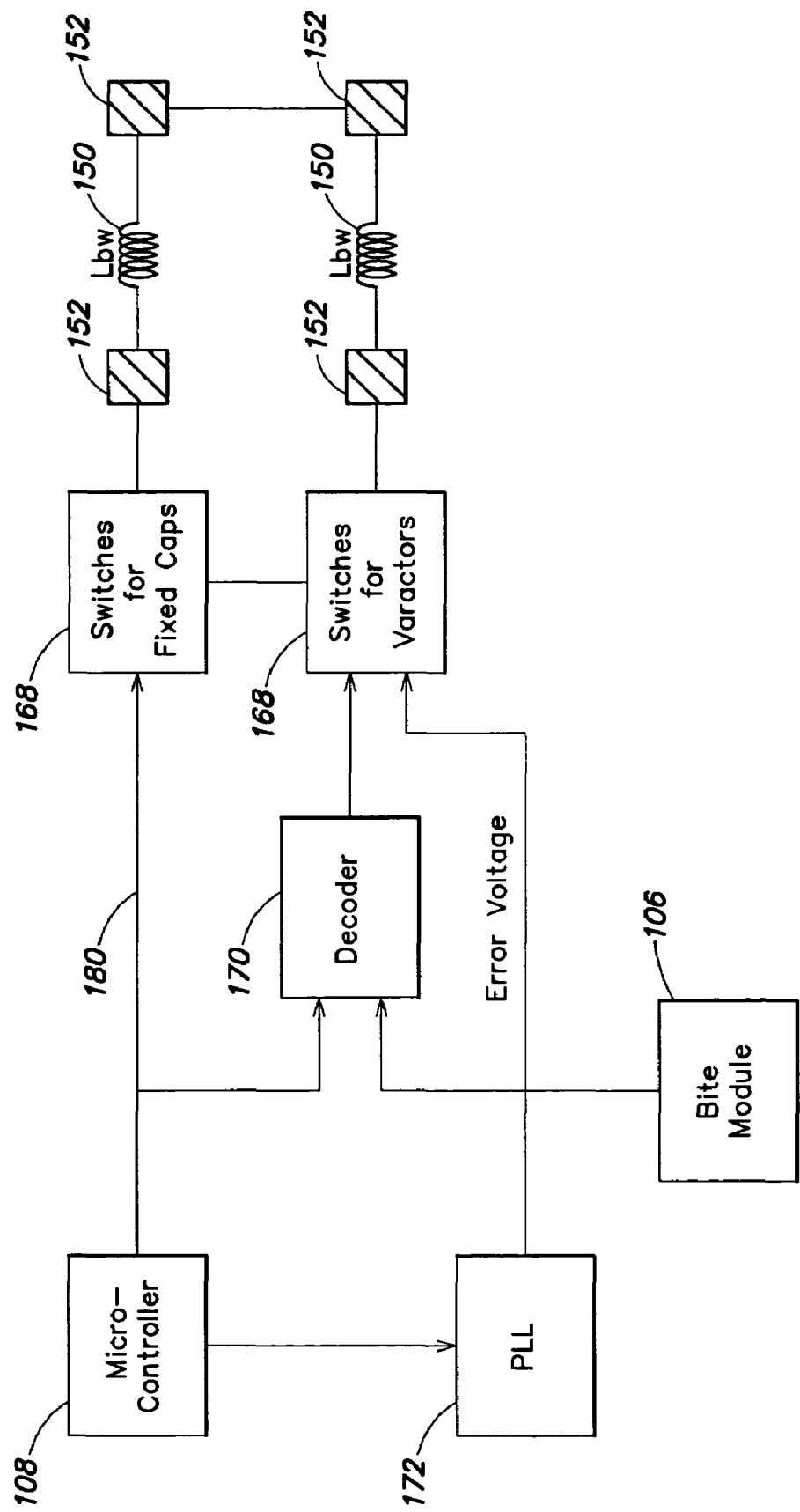
FIG. 7 is a block diagram of one embodiment of a control circuit for a resonance circuits, according to aspects of the invention.

To further facilitate integration of the tunable resonance circuit 132 with other analog functional circuits, such as a VCO, a control unit can be employed that enables automatic resonance frequency selection and fine tuning with a circuit comprising a microcontroller and a phase lock loop (PLL) circuit. A block diagram of one example of such a control circuit is illustrated in FIG. 7. As discussed above, a particular frequency band of operation may be selected by switching in and/or out a particular number of fixed-value capacitors. According to one embodiment, band selection may be controlled by a control signal on line 180 from the microcontroller 108. The microcontroller may receive an input (e.g., via the interface 112—see FIG. 1) that identifies a desired operating frequency band. Based on the selected frequency band of operation, the microcontroller 108 may determine the number of fixed and variable capacitors and send control signals to the switches 168 to switch in appropriate ones or banks of fixed-value capacitors and variable capacitors (e.g., varactor diodes). The microcontroller may further control a bias voltage of the varactor diode(s) to narrow, or more accurately define, the operating frequency range, as discussed above. The decoder 170 in FIG. 7 converts the digital signals from the microcontroller to analog control signals to operate the switches 168 and adjust the bias voltages of the varactor diodes. Thus, the microcontroller enables programmable frequency selection by controlling the capacitance that is coupled in parallel with the fixed bondwire inductance to select a desired resonant frequency.

According to one embodiment, compensation for operating fluctuations (e.g., temperature drift) may be implemented using feedback control with the built-in test and evaluation (BITE) module 106, as discussed in detail below. In particular, the BITE module 106 may monitor and correct for frequency deviations and operational drifts based on an in-situ calibration scheme. In one example, dynamic adjustment of the bias voltage for the varactors to stabilize the chosen frequency against environmental fluctuations (temperature, humidity, etc.) as well as operational fluctuations (power fluctuations) is implemented by a standard phase-lock-loop (PLL) circuit 172 that generates the correction voltage based on an error signal from the microcontroller 108. The closed-loop feedback control methods implemented by the BITE module 106 for calibration and dynamic compensation for variable operating conditions is discussed in further detail below.

As discussed above, according to one embodiment, the LC tank circuit of the invention may be coupled to a low noise amplifier (LNA). Low noise amplifiers are commonly used in radio transceivers to amplify a received RF signal so as to improve the signal to noise ratio of the received signal to facilitate processing of the signal. To facilitate signal transfer through the LNA, it is important to provide impedance matching to the components to which the LNA is connected. Impedance matching, typically to a source impedance of 50 Ohms, may be particularly important for integrated high performance multi-band LNAs and may be needed over a wide frequency band.

Figure 12:
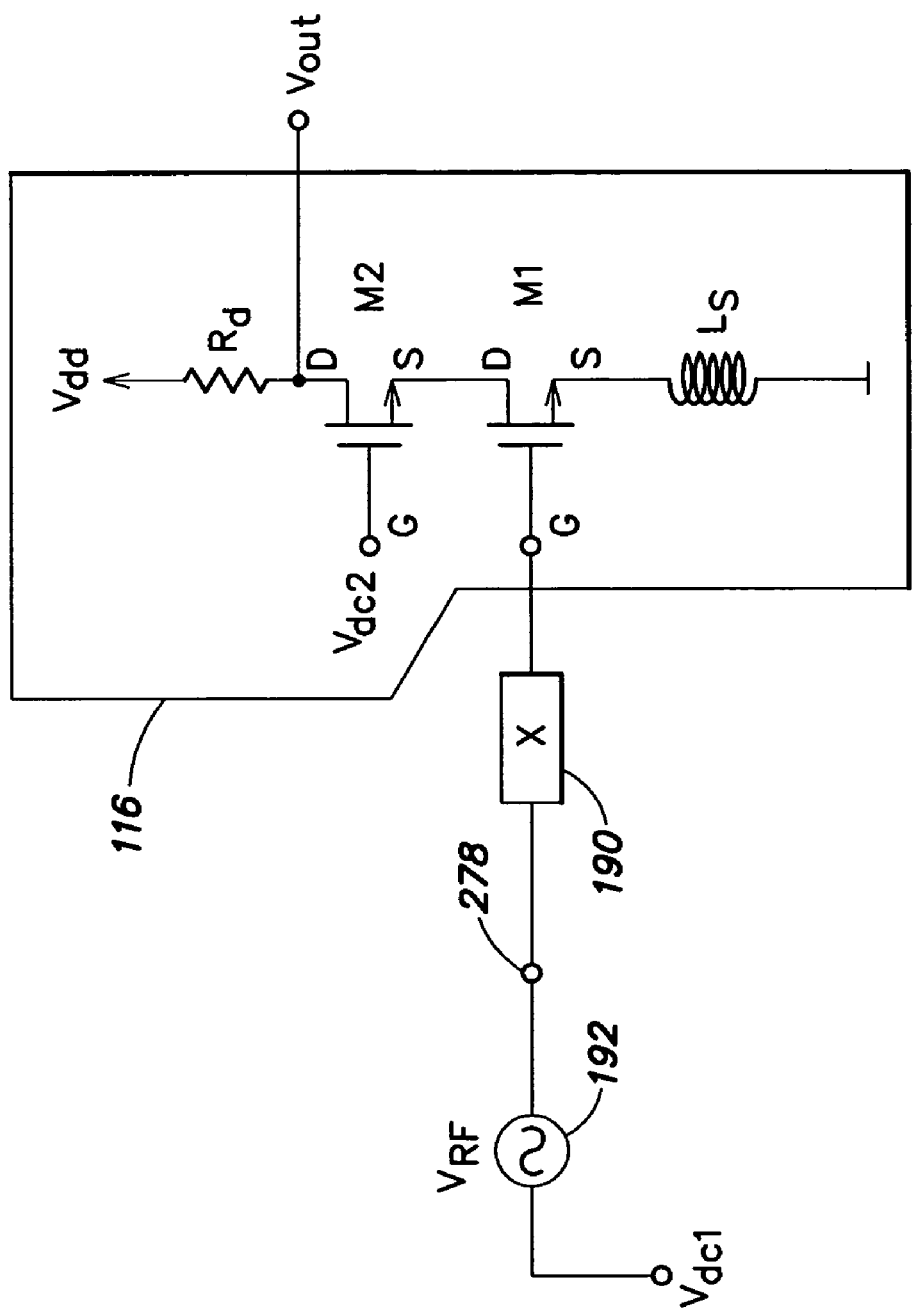
FIG. 12 is a circuit diagram illustrating one example of impedance matching an LC tank circuit to a low noise amplifier, according to aspects of the invention.

Referring to FIG. 12, there is illustrated a circuit diagram of one embodiment of matching an RF source 192 to the input of a transistor-based circuit using an LC tank circuit 190. The MOS transistors M1 and M2 may form part of an LNA 116 to which the RF source 192 is being matched using the LC tank circuit 190. FIG. 12 illustrates an inductively degenerated common source cascade CMOS configuration where the LC tank circuit 190 is part of the input to the gate of the MOS transistor M1. It should be appreciated that other LNA configurations may be used and the principles of the invention are not limited to the example shown in FIG. 12. It is to be appreciates that the LC tank circuit 190 may comprise one or more bondwire inductors and any of the elements discussed above in reference to FIGS. 2-5. Ports $V_{dc1}$ and $V_{dc2}$ provide a DC bias voltage for the transistors M1 and M2, respectively. The resistance $R_d$ may be a current-limiting resistance that is coupled between the transistors and a drain voltage supply, $V_{dd}$.

For the configuration illustrated in FIG. 12, the input impedance seen by the RF source (i.e., at node 278) can be expressed as $$Z_{in} = j\omega L_S + \frac{1}{j\omega C_{gs1}} + \frac{g_{m1}}{C_{gs1}}L_S + jX$$

where $Z_{in}$ is the input impedance, $L_S$ is the source degenerated inductance, $g_{m1}$ is the transconductance of transistor M1, $C_{gs1}$ is the total gate-source capacitance of M1, $\omega$ is the angular frequency, and X is the reactance provided by the LC tank circuit 190. In one example, for a 180 nm node size CMOS process, the source degenerated inductance may be approximately 0.5 nH to 1 nH, the transconductance may be in a range from about 30 mS to 100 mS, and the gate-source capacitance may be in a range from about 0.7 pF to 1.5 pF. It is to be appreciated that although these values may be typical for a 180 nm node size CMOS process, similar values can be found for other technology node sizes. In addition, the RF source 192 may typically have a 50 Ohm impedance and thus it may be desirable to match the input impedance $Z_{in}$ may approximate 50 Ohms.

In one example, matching to a 50 Ohm source impedance may be achieved if the following conditions are met:

$$\frac{g_{m1}}{C_{gs1}}L_s = 50\Omega \text{ and}$$

$$j\omega L_S + \frac{1}{j\omega C_{gs1}} = jX$$

In other words, the reactance of the LC tank circuit, including a bondwire inductor configuration, may be controlled to approximately cancel out the reactance of the transistor circuit (the series combination of the source degenerated inductance and the total gate-source capacitance) at the target frequency.

Some examples of common target frequencies for an integrated RFIC comprising elements of the invention may include 1.9 GHz for Digital Enhanced Cordless Telephone (DECT) and 2.4 GHz for Bluetooth applications. Considering one DECT example, a 50 Ohm input impedance match may be provided for a 1.9 GHz DECT application where $L_s$=0.57 nH and $C_{gs1}$=1.332 pF, by controlling the reactance to be X=112.68 Ohms. In another example, a 50 Ohm input impedance match may be provided for a 2.4 GHz Bluetooth standard having $L_s$=1.2 nH and $C_{gs1}$=0.703 pF by controlling the reactance of the LC tank circuit to be X=208.3 Ohms. In a similar way, matching for other standards, like GSM and CDMA, can also be implemented.

As discussed above with reference to FIGS. 5 and 11, target reactance values for the LC tank circuit may be implemented by cascading bondwires 150 and by varying capacitances 156, 158 and 188. In addition, as discussed above with reference to FIG. 9, the reactance may vary with frequency, as shown by curve 184 and may be augmented by fixed and variable capacitance such that the target reactance of X is reached.

Figure 13:
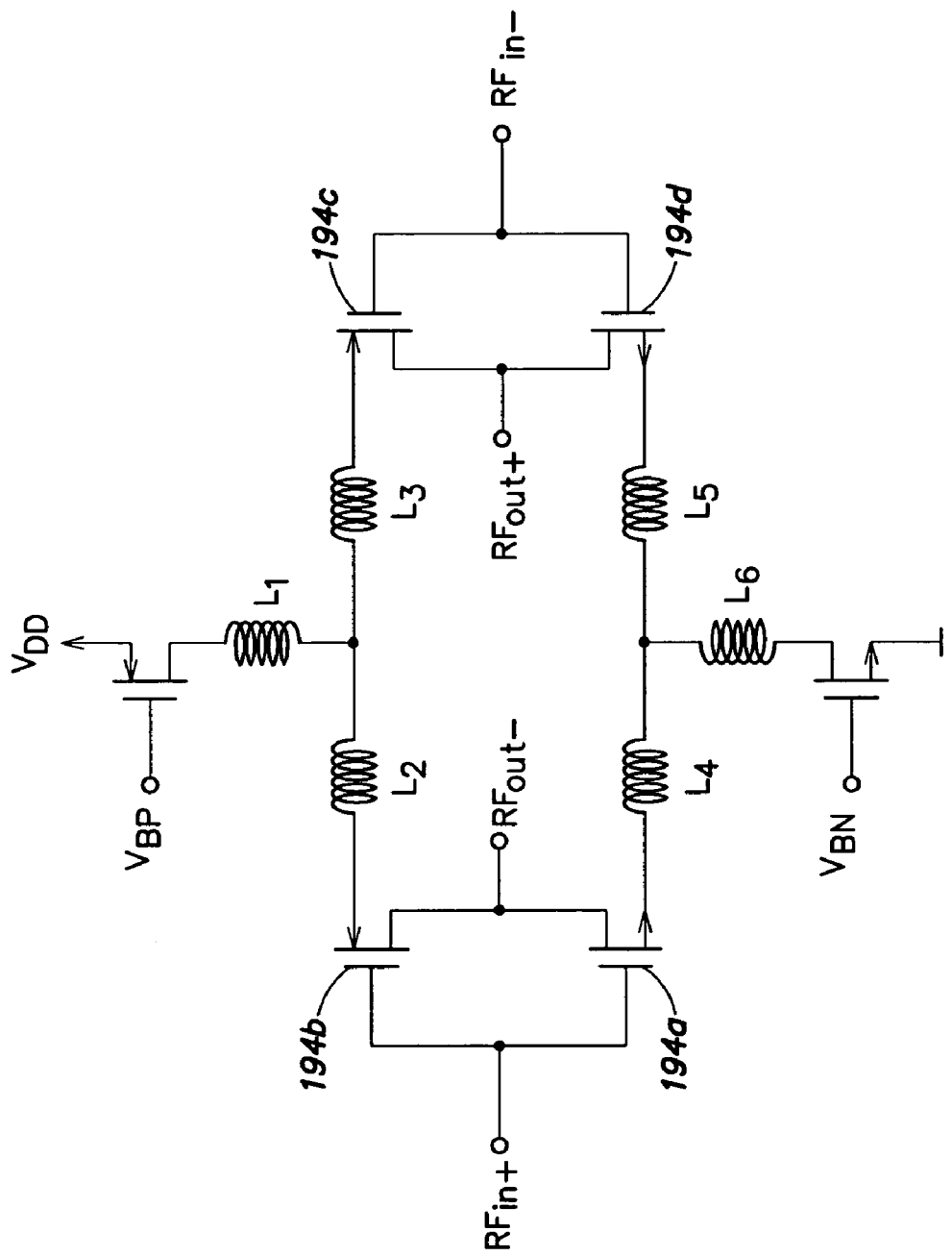
FIG. 13 is a circuit diagram illustrating one embodiment of a differential low noise amplifier employing bondwire inductors according to aspects of the invention.

According to another embodiment, the LC tank circuit including a bondwire inductor configuration may be coupled to a differential stage low noise amplifier and may be used to match the input impedance of a differential LNA to, for example, a 50 Ohm or 100 Ohm RF source ($RF_{in+}$ and $RF_{in-}$ in FIG. 13). Referring to FIG. 13, there is illustrated one example of a balanced LNA including inductive series feedback (provided by L2, L3, L4 and L5) and using p-type and n-type MOS transistors 194a, 194b, 194c and 194d. As shown in FIG. 13, a differential balanced input stage with current sources controlled by voltages $V_{BP}$ and $V_{BN}$ may be used. Such a circuit may be implemented, for example, in a 0.35 nm CMOS process. It is to be appreciated that the principles of the invention are not limited to the exemplary LNA configuration illustrated in FIG. 13 and other types of transistors and configurations may be used. In addition, other node size CMOS processes may be also used.

Figure 14:
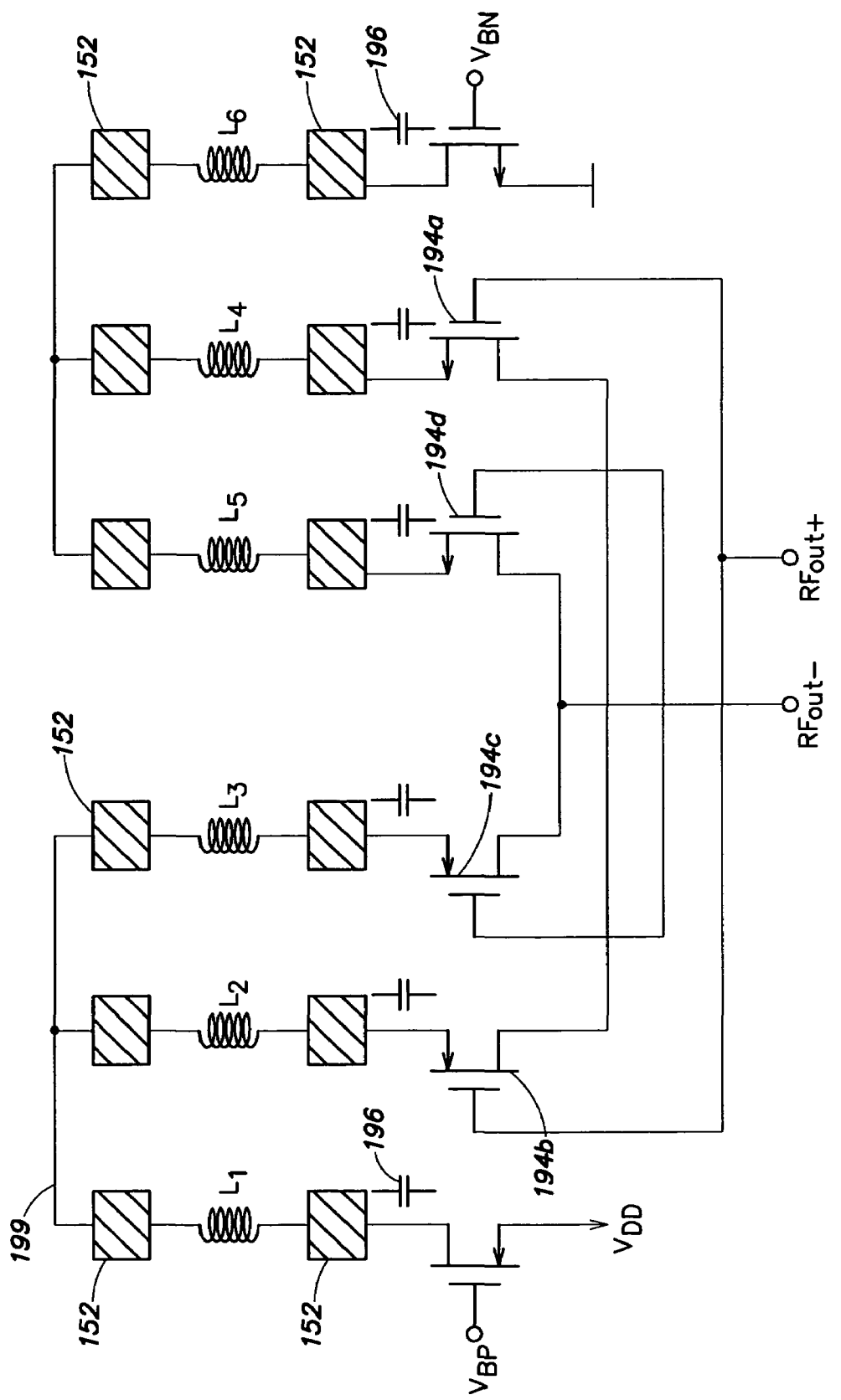
FIG. 14 is a circuit diagram illustrating one embodiment of a differential low noise amplifier employing bondwire inductors according to aspects of the invention.

In conventional integrated differential LNAs, the inductors L1-L6 may be implemented as spiral inductors which may have several associated disadvantages, as discussed above. According to one embodiment of the invention, any or all of the inductors L1-L6 may be implemented using bondwires, or other types of transmission lines, as discussed above. Referring to FIG. 14, there is illustrated one example of a bondwire inductor configuration for the circuit of FIG. 13. Each of the inductors L1-L6 may comprise one or bondwires connected at each end to a bonding pad 152, as discussed above. The capacitors 196 represent the capacitance presented by the bonding pads. In one example, the shorts 199 connecting the bonding pads 152 on the lead frame together may be replaced by fixed or variable capacitors. In addition, on the chip side, the connections to the bond wires could also include either fixed or variable (or both) capacitors. These capacitors may be used to achieve particular reactance values so as to optimize the overall circuit performance at a specific operating frequency or band of operating frequencies, and/or to provide input impedance matching between the differential amplifier and the RF input port, as discussed above.

It is to be appreciated that the various embodiments of the programmable LC tank circuit as described herein can be coupled to various RF components of the configurable RFIC of FIG. 1 to achieve programmable tuning of these components, and so as to tune the overall RFIC to a desired operating frequency band.

Referring again to FIG. 1, according to at least one embodiment, an integrated radio transceiver chip may include a frequency synthesizer 104 that is adapted to generate one or more reference frequencies for use by various components in the RFIC. More specifically, according to one embodiment, there may be provided a programmable frequency synthesizer that may generate a wide range of stable frequencies so as to enable operation of a multi-band, multi-standard radio transceiver. In one embodiment, the frequency synthesizer employs a wide band local oscillator architecture that comprises a narrowband VCO combined with a programmable divider to generate local oscillator signals for the radio transceiver, as discussed in detail below. A wide range of stable local oscillator frequencies are desirable for a multi-band, multi-standard radio transceiver. However, having a large number of VCOs and/or reference signal sources (e.g., reference crystals) may require a large chip surface area and increase the cost of the radio transceiver due to larger size and increased component count. Therefore, it may be desirable to minimize the number of VCOs and reference sources in order to obtain a high degree of integration and high performance for an RFIC.

Figure 15:
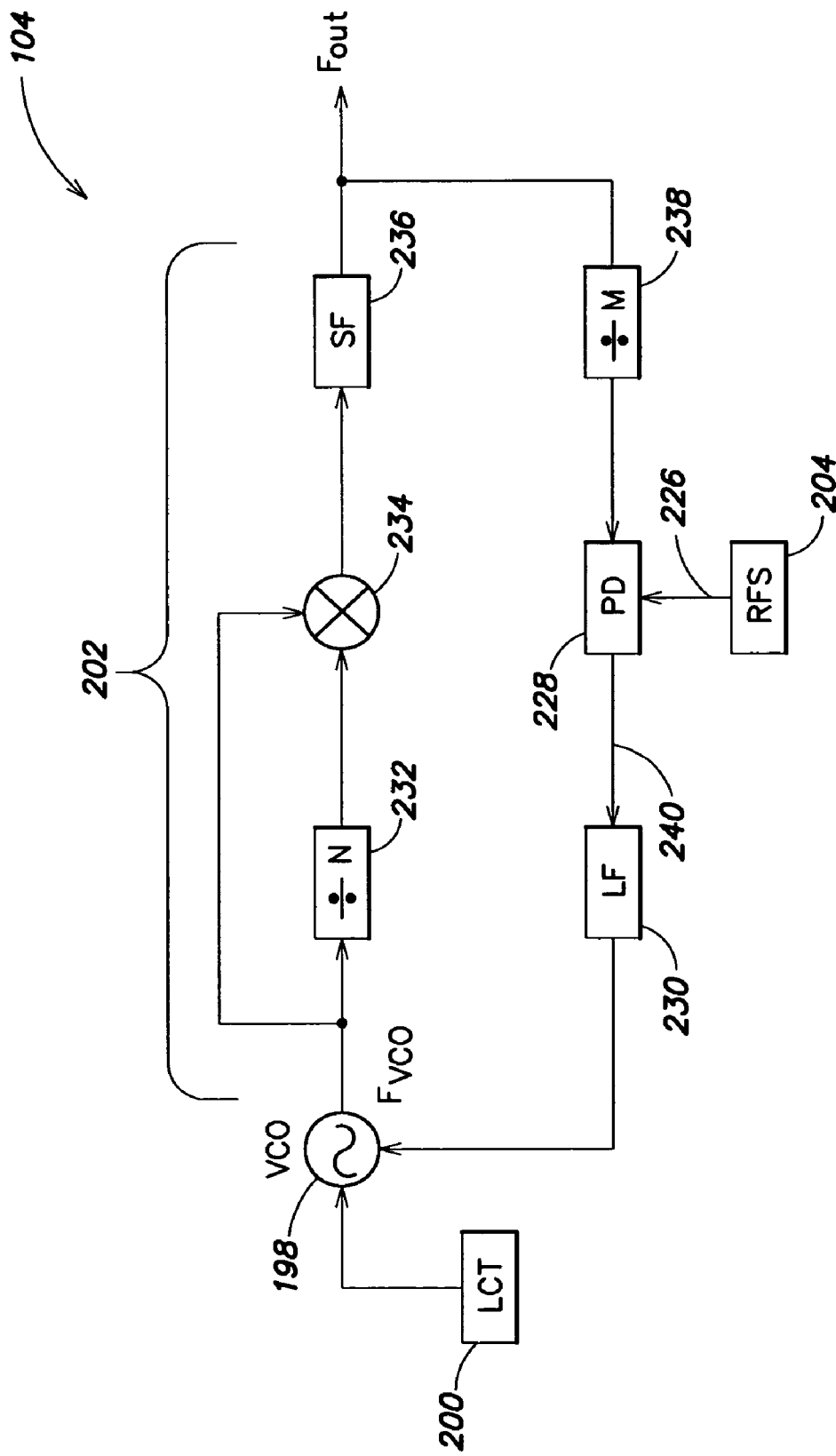
FIG. 15 is a block diagram of another embodiment of a frequency synthesizer according to aspects of the invention.

Referring to FIG. 15, there is illustrated a block diagram of one embodiment of a frequency synthesizer 104 according to aspects of the invention. The frequency synthesizer 104 implements a wide band programmable local oscillator (LO) architecture and is based on a modified direct digital synthesis phase lock loop (PLL) that incorporates single or multiple digital band switching dividers inside a forward loop path 202 so as to provide flexibility in generating a large number of stable reference frequencies. As shown in FIG. 15, the frequency synthesizer 104 may include a voltage controlled oscillator (VCO) 198 coupled to a programmable LC tank circuit 200 such as described above. The programmable LC tank circuit 200 allows resonant frequency band selection of the LC tank circuit, as discussed above, and can be used to control a tuning range of the VCO 198. In one example, the VCO may have a tuning range of up to ±20% about a center frequency that can be set, for example, in a range between about 1 GHz and 3 GHz. A reference frequency source 204 provides a reference frequency $f_{ref}$ to the synthesizer loop via a phase detector 228 and a loop filter 230. The programmable frequency synthesizer may further comprise a programmable divide-by-N circuit 232 and a mixer 234 in the forward loop 202, an upper or lower sideband selection filter 236, and a divide-by-M circuit 238 in the feedback loop, each of which are discussed in more detail below. In one embodiment, a narrowband signal $f_{vco}$ (provided by the VCO in combination with the LC tank circuit) may be mixed with an N divided version of itself in either a single-sideband or double-sideband modulator 234. The result of the mixing yields an upper sideband and a lower sideband which may provide a local oscillator signal on both sides of the VCO frequency, $f_{vco}$. Each of these sidebands may have the same percentage bandwidth as the VCO signal, thus providing a wide range of frequency coverage that is a function of both the VCO bandwidth and the division ratio.

Figure 16:
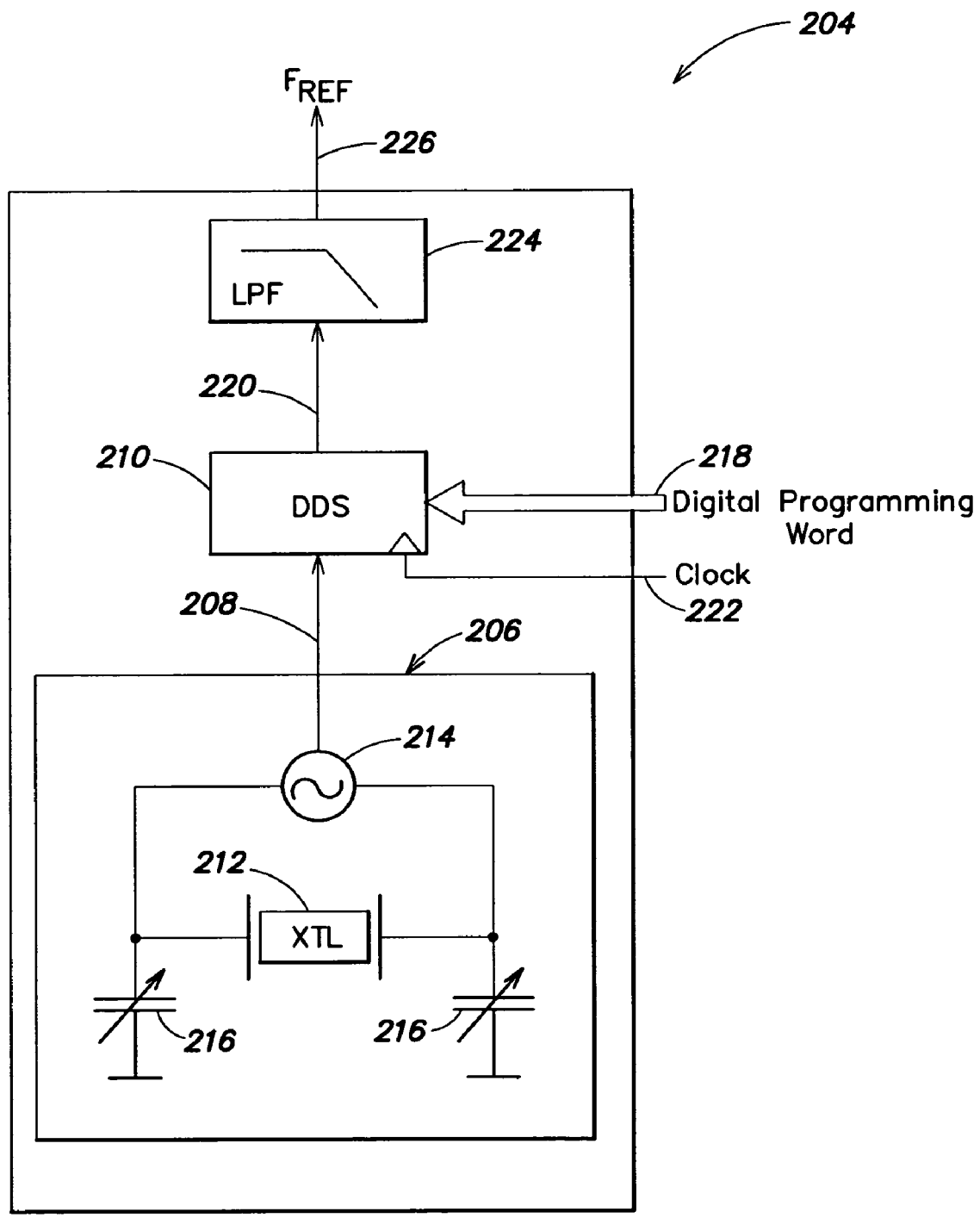
FIG. 16 is a block diagram of one embodiment of a direct digital synthesizer according to aspects of the invention.

According to one embodiment, the reference frequency signal source 204 may include a direct digital synthesizer (DDS) that derives its reference frequency from a crystal source and generates the reference frequencies. For example, for a multiple standard radio transceiver, some desirable reference frequencies may include 13 MHz, 26 MHz, 19.2 MHz, 19.6 MHz, 20 MHz, 22 MHz, 40 MHz, and 44 MHz. Of course, it is to be appreciated that many other reference frequency values may also be generated and the invention is not limited to the examples given above. One embodiment of a reference frequency source 204 according to aspects of the invention is illustrated (in block diagram form) in FIG. 16. A numerically controlled crystal oscillator 206 generates an output signal on line 208 that is fed to a direct digital synthesis (DDS) circuit 210. The crystal oscillator 206 may include a crystal 212 attached to an oscillator 214 and controlled via one or more variable capacitors 216. The DDS circuit 210 receives the signal from the crystal oscillator 206 on line 208. The DDS circuit 210 also receives a digital programming signal from, for example, the RFIC microcontroller (see FIG. 1). The programming signal may indicate to the DDS circuit the desired frequency value of the reference frequency to be generated. Based on the programming signal 218, the DDS circuit produces (from the signal on line 208) a digital reference frequency signal. The DDS also includes a digital-to-analog converter (DAC, not shown) that produces a sampled analog carrier on line 220. In one example, the DAC is sampled at a reference clock frequency determined from a clock signal 222. Therefore, a low pass filter (LPF) 224 may be used to eliminate aliasing if necessary. The generated reference frequency $f_{ref}$ is produced on line 226. In one example, the DDS circuit can be implemented in a field programmable gate array (FPGA).

According to one embodiment, multiple reference frequencies, which may in turn be used to create multiple local oscillator signals, may be generated using a single crystal 212 that has a fixed output frequency value and thus has good stability performance. The frequency synthesizer architecture of the invention uses the reference frequency source described above to produce multiple reference frequencies. Each reference signal may retain the stability of the original crystal signal, which may be very desirable for radio transceiver applications.

Referring again to FIG. 15, the VCO 198, as tuned by the LC tank circuit 200, produces a signal having a frequency $f_{vco}$, as shown. The frequency $f_{vco}$ is modified by the divide-by-N circuit 232 and mixer 234 such that a spectrum of $f_{vco}+f_{vco}/N$ (the upper side band) and $f_{vco}-f_{vco}/N$ (the lower side band) is generated. A subsequent sideband selection filter 236 may select one of the bands which becomes $f_{out}$. The sideband selection filter may significantly extend the frequency coverage of the local oscillator provided by the frequency synthesizer because the sideband selection filter allows the local oscillator to have a frequency range that is substantially distant from the original VCO frequency. Stability of the generated frequencies may be maintained by feeding back the output signal $f_{out}$ through the divide-by-M circuit 238 into the phase detector 228. The phase detector may compare the selected sideband signal $((f_{vco} \pm f_{vco}/N)/M)$ with the reference frequency signal generated by the reference frequency source 204 to generate a loop signal on line 240 that may be conditioned through a low pass filter 230 before being applied to the VCO 198. In this manner, the VCO may be adjusted to accurately maintain a desired signal frequency. In one example, the phase detector 228 may be implemented as a standard charge pump circuit.

According to one embodiment, the programmable divide-by-N circuit (where N is a programmable high speed feed-forward divider ratio) may be implemented as a single divider or as a combination of dividers. Furthermore, the programmable divide-by-N circuit 232 may be implemented in conjunction with a single output VCO or a quadrature output VCO (QVCO).

Figure 17:
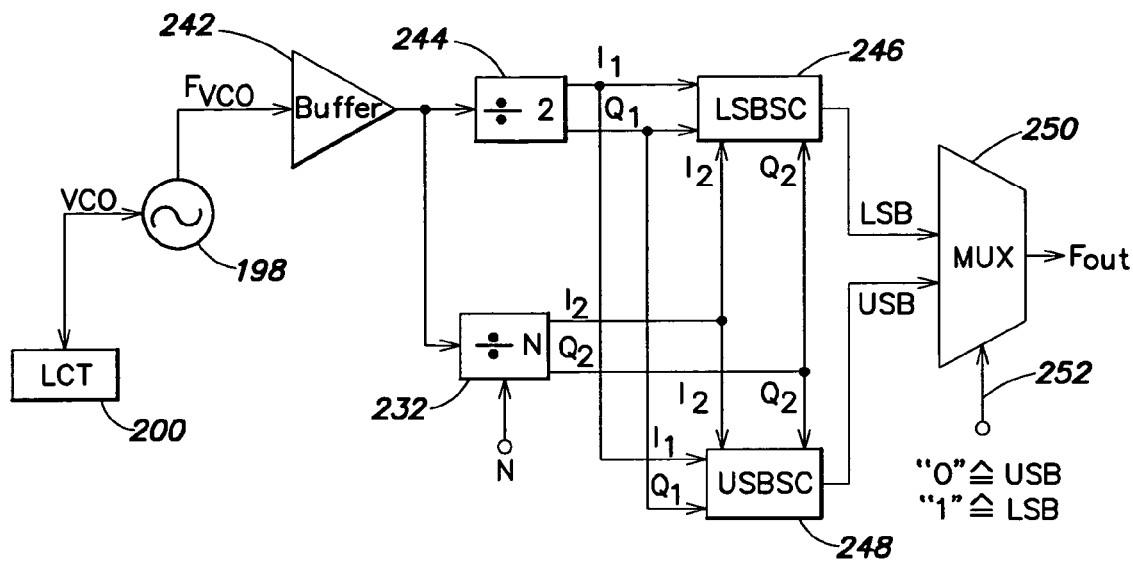
FIG. 17 is a block diagram of one embodiment of a frequency synthesizer including a divide-by-N circuit according to aspects of the invention.

Referring to FIG. 17, there is illustrated one embodiment of a portion of the forward loop 202 including the divide-by-N circuit. In the illustrated example, the generated frequency $f_{vco}$ is fed into a standard buffer 242 followed by a shunt configuration of a fixed divide-by-2 circuit 244 and the programmable divide-by-N circuit 232. The value of N may be an integer or a non-integer and may be determined by a control signal from, for example, the RFIC microcontroller (see FIG. 1). The output signals of the fixed divide-by-2 circuit 244 are the frequency components $I_1$ which is the "in-phase" signal and $Q_1$ which is the quadrature signal and which is 90 degrees out of phase with $I_1$. The output of the programmable divide-by-N circuit 232 similarly includes an in-phase frequency component signal $I_2$ and a quadrature component signal $Q_2$. These four signals may be provided to a lower sideband selection circuit and to an upper sideband selection circuit 248 which may form part of the sideband selection filter 236 (see FIG. 15). The output of the lower sideband selection circuit includes the lower side band (LSB)

frequencies, and the output of the upper sideband selection circuit 248 includes the upper side band (USB) frequencies. As shown in FIG. 17, the USB and LSB frequencies may be fed to a multiplexer 250 that may be adapted to allow the selection of either the USB or the LSB frequency signals, depending on the setting of a digital control signal on line 252. For example, setting the digital control signal to a "0" may select the LSB signal whereas setting the digital control signal to a "1" may select the USB signal, or vice versa. The multiplexer may also form part of the sideband selection filter 236.

Figure 18:
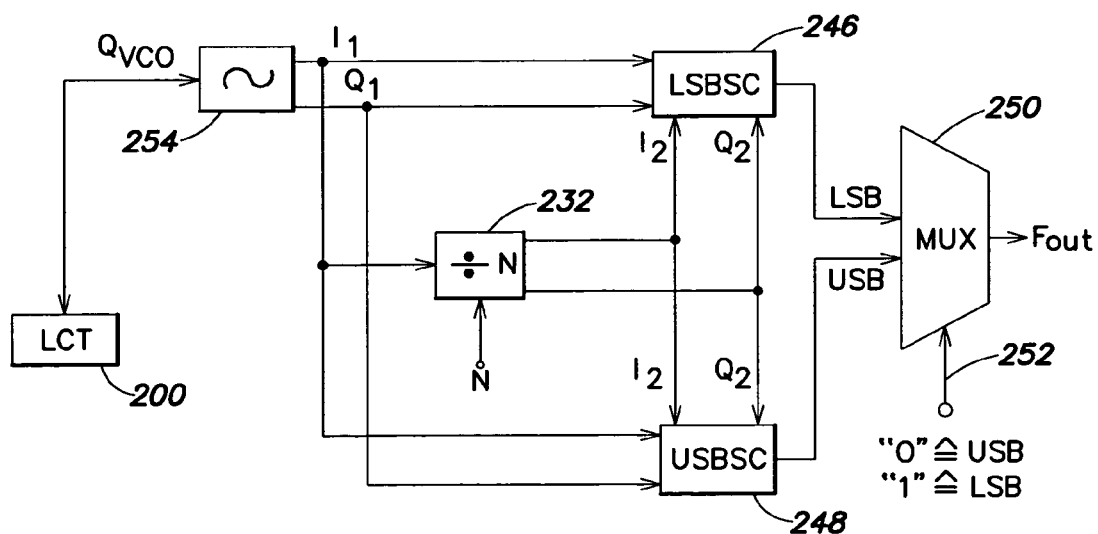
FIG. 18 is a block diagram of another embodiment of a frequency synthesizer including a quadrature VCO and a divide-by-N circuit, according to aspects of the invention.
Figure 19A:
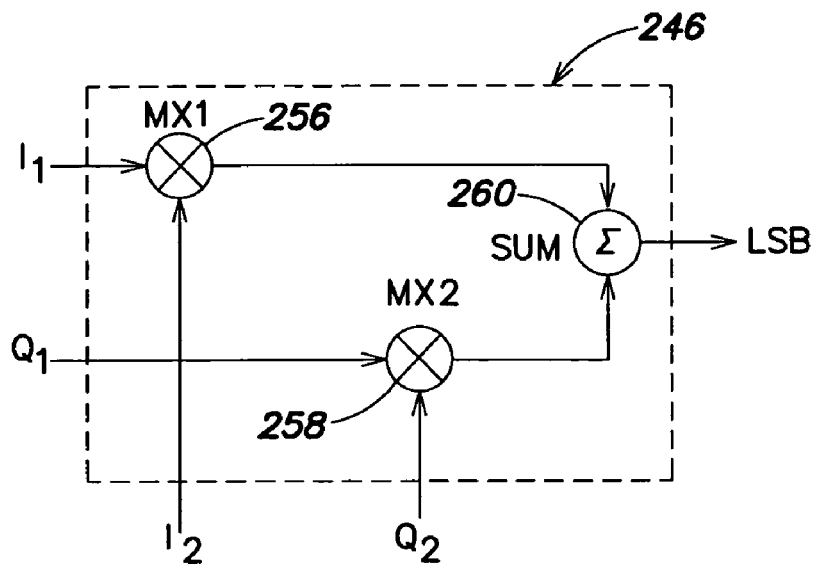
FIG. 19a is a block diagram of one embodiment of a lower sideband selection circuit according to aspects of the invention.
Figure 19B:
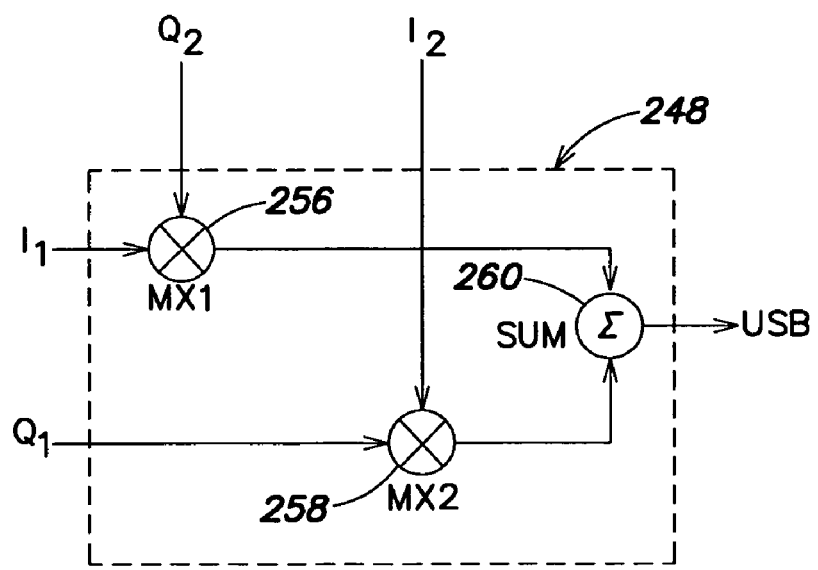
FIG. 19b is a block diagram of one embodiment of an upper sideband selection circuit according to aspects of the invention.

According to another embodiment, the VCO may be a quadrature VCO 254, as illustrated in FIG. 18. The quadrature VCO 254 may generate an in-phase signal $I_1$ (for example, a cosine signal $\cos(\omega_1 t)$ where $\omega_1$ is the angular frequency of input frequency $f_{vco}$) and a quadrature signal $Q_1$ (for example, a sine signal, $\sin(\omega_1 t)$). One example of circuit implementations for the lower sideband selection circuit and upper sideband selection circuit are illustrated in FIGS. 19a and 19b, respectively. Both circuits comprise the same functional blocks, namely a first mixer 256, a second mixer 258 and a summer 260. For the lower sideband selection circuit, signals I1 and I2 are applied to the first mixer 256 and signals Q1 and Q2 are applied to the second mixer 258, whereas for upper sideband selection circuit signals I1 and Q2 are applied to the first mixer and signals Q1 and I2 are supplied to the second mixer.

For an exemplary explanation of the operation of the sideband selection circuits, the signals can be assumed to be: $I_1=\cos(\omega_1 t)$, $I_2=\cos(\omega_2 t)$, $Q1=\sin(\omega_1 t)$, $Q_2=\sin(\omega_2 t)$. Then, from the circuit configuration in FIG. 19a, the lower sideband output is:

$$LSB = I_1 * I_2 + Q_1 * Q_2 = \cos[(\omega_1 - \omega_2)t]$$

Similarly, from the circuit configuration of FIG. 19b, the upper sideband output is:

$$USB = I_1 * Q_2 + Q_1 * I_2 = \cos[(\omega_1 + \omega_2)t]$$

Thus, by selecting one of the USB and LSB, a local oscillator signal is provided that may be either close in frequency or substantially distant in frequency from the original VCO frequency, depending on the values of $\omega_1$ and $\omega_2$. The sideband selection filter may thus offer great flexibility in the local oscillator frequency range, providing a wideband local oscillator. The frequency synthesizer according to aspects of the invention thus allows the generation of an extremely wideband local oscillator signal from a relatively narrowband crystal reference frequency. Many radio transceiver applications require a low intermediate frequency (low-IF) or direct conversion to baseband (zero-IF) architecture to minimize noise and losses and enhance performance. For these types of applications it may be desirable to have a local oscillator output frequency that is far from and unrelated to (i.e., not a direct multiple of) the fundamental VCO frequency. This architecture is readily implemented using the frequency synthesizer of the invention by programming the division ratio and sideband selection filter to create a local oscillator signal that is distant in frequency from the VCO signal and is not an integer multiple of the VCO center frequency.

Figure 20:
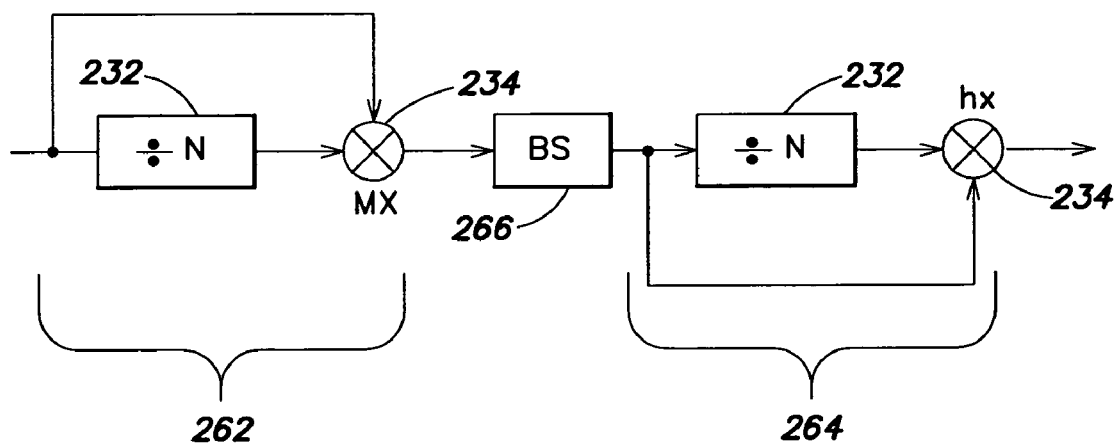
FIG. 20 is a block diagram of one embodiment of a cascade of multiple divide-by-N circuits according to aspects of the invention.

According to one embodiment, the divide-by-N circuit 232 and mixer 234 in the forward loop 202 may be cascaded to comprise two or more divider and mixer configurations as shown in FIG. 20. A first stage 262 (comprising a divide-by-N circuit 232 and a mixer 234) may be cascaded with a second stage 264 (also comprising a divide-by-N circuit 232 and a mixer 234), separated by a band switch 266. Similarly, further stages may be cascaded so as to achieve any desired division ratio. The second and subsequent stages may have either the same divider ratio or different divide ratios. The band switch 266 may be used to select one or more frequencies to be applied to the subsequent stage(s).

Referring again to FIG. 15, the feedback loop of the phase-locked loop may comprise a divide-by-M circuit 238, as known in the art. M may be a fixed or programmable divide ratio. If programmable, the value of M may be set by a control signal from, for example, the RFIC microcontroller 108 (see FIG. 1). The divide-by-M circuit 238 may be implemented based on a number of standard divider circuits, including a digitally programmable multistage noise shaping (MASH) Delta-Sigma modulator, as known in the art. A factor that may be considered in selecting the type of divider may be the settling time of the divider. For example, for a GSM-900 standard where the frequency range extends from 880 MHz to 915 MHz and is based on 200 kHz channel spacing, the settling time may be around 10 μs.

Some exemplary tuning ranges that may be achieved with various embodiments of the wide band programmable LO architecture will now be discussed to provide illustration and examples. However, it is to be appreciated that the inventive principle are not limited to the specific examples discussed herein and apply broadly to a programmable LO that may be tuned over a desired frequency range. Table 1 below shows examples of the center frequency ($f_{center}$), lower bound frequency ($f_{low}$) and upper bound frequency ($f_{high}$) possible with a VCO having a center frequency of 2 GHz and a tuning range of ±15%. It is to be appreciated that the center frequency is arbitrary and simply serves to illustrate the tuning ratio ($f_{high}/f_{low}$) of the wideband programmable LO architecture of the invention. Any center frequency may be selected and may be chosen, for example, based on the application for which the LO is to be used. Different frequency ranges can easily be achieved by scaling the VCO center frequency. The tuning ratio remains the same for different center frequencies. N is the division value of the divide-by-N circuit (see FIG. 15). By changing the value of N, the VCO center frequency may be scaled as shown.

TABLE 1

Available frequency bands with VCO tuning range of +/−15%.

| Sideband | N | Log$_2$(N) | f$_{center}$ | f$_{low}$ | f$_{high}$ |
|---|---|---|---|---|---|
| Upper | 1 | 0 | 2000 | 1700 | 2300 |
| Upper | 2 | 1 | 1500 | 1275 | 1725 |
| Upper | 4 | 2 | 1250 | 1062.5 | 1437.5 |
| Upper | 8 | 3 | 1125 | 956.25 | 1293.75 |
| Lower | 8 | 3 | 875 | 743.75 | 1006.25 |
| Lower | 4 | 2 | 750 | 637.5 | 862.5 |
| Lower | 2 | 1 | 500 | 425 | 575 |
| Lower | 1 | 0 | 0 | 0 | 0 |

Figure 21:
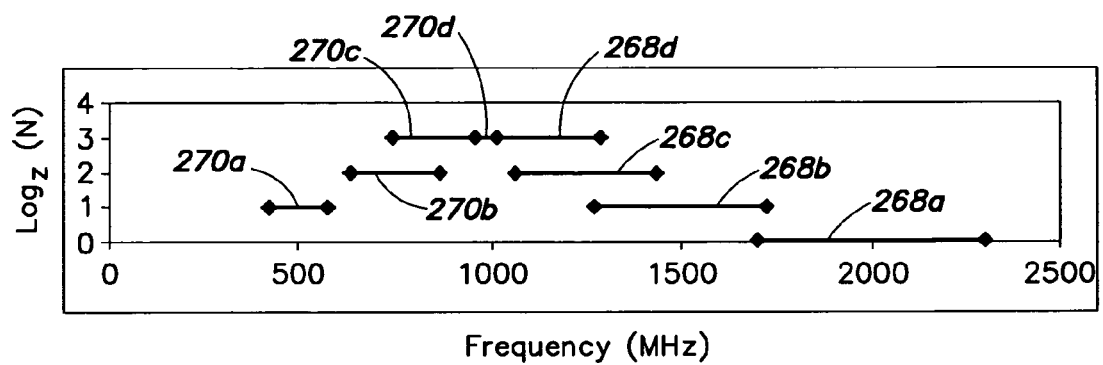
FIG. 21 is a graph illustrating local oscillator frequency tuning bands for different division ratios of one exemplary VCO, according to aspects of the invention.

Referring to FIG. 21, there is illustrated a graph of the frequency tuning ranges as a function of the value of N as taken from Table 1. Lines 268a, 268b, 268c and 268d represent the upper sideband frequency ranges for each value of N from one to eight, respectively, and lines 270a, 270b, 270c, 260d represent the lower sideband frequency ranges for each value of N from one to eight, respectively. As can be seen from Table 1 and FIG. 21, all but the lowest two frequency ranges (represented by lines 270a and 270b) overlap and thus a continuous frequency range from about 637.5 MHz to about 2.3 GHz is available, and other discrete frequency ranges can be provided. FIG. 21 illustrates that the wide band programmable LO architecture of the invention provides an equivalent to an oscillator with a center frequency of 1468.75 MHz, and a tuning range of ±57%. In other words, the frequency synthesizer of the invention provides a substantially increased frequency tuning band compared to that of the original VCO (57% overall versus 15% for the VCO). The frequency synthesizer of the invention may provide a wide-band programmable LO that may cover almost two octaves in frequency while maintaining the same tuning sensitivity (because tuning in fact occurs within each narrow band that are cascaded to provide a synthetic wide band, as shown in FIG. 21), thereby maintaining good phase noise.

Table 2 below gives example center frequencies, lower bound frequencies and upper bound frequencies possible with a VCO having a center frequency of 2 GHz and a tuning range of +/−20%. The tuning range of the VCO may be adjusted (e.g., changed from 15% to 20%) using the resonant LC tank circuit, as discussed above. Again, N is the divider value for the divide-by-N circuit of FIG. 15.

TABLE 2

Available frequency bands with VCO tuning range of +/−20%.

| Sideband | N | $f_{center}$ | $f_{low}$ | $f_{high}$ |
|---|---|---|---|---|
| Upper | 1 | 2000 | 1600 | 2400 |
| Upper | 2 | 1500 | 1200 | 1800 |
| Upper | 4 | 1250 | 1000 | 1500 |
| Upper | 8 | 1125 | 900 | 1350 |
| Lower | 1 | 875 | 700 | 1050 |
| Lower | 2 | 750 | 600 | 900 |
| Lower | 4 | 500 | 400 | 600 |
| Lower | 8 | 0 | 0 | 0 |

Figure 22:
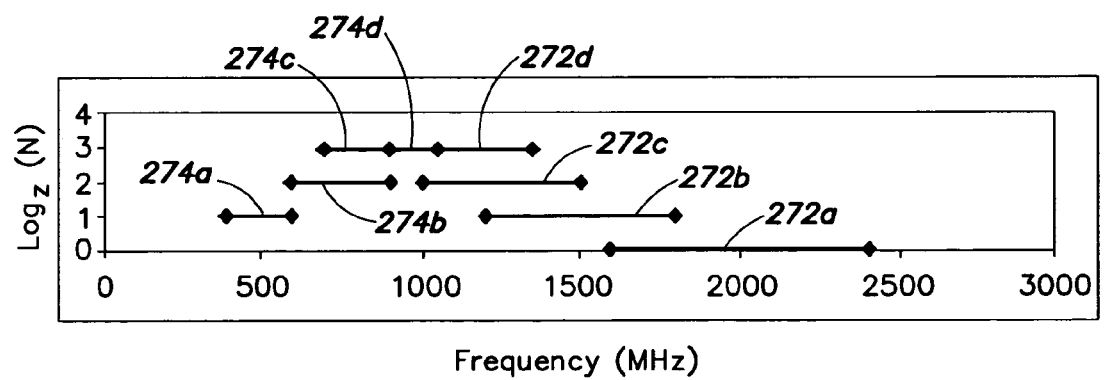
FIG. 22 is a graph illustrating local oscillator frequency tuning bands for different division ratios of another exemplary VCO, according to aspects of the invention.

FIG. 22 illustrates the frequency bands of Table 2 as a function of N, similar to FIG. 21. Lines 272a, 272b, 272c and 272d represent the upper sideband frequency ranges corresponding to each values of N from one to eight, respectively, and lines 274a 274b, 274c and 274d represent the lower sideband frequency ranges for each value of N from one to eight, respectively. As shown, by increasing the VCO tuning range to 20% with the LC tank circuit, continuity of LO frequencies is available from 400 MHz to 2.4 GHz.

These examples illustrate that the frequency synthesizer architecture described herein is capable of producing a wideband programmable local oscillator that is tunable over a very wide frequency range. This allows the use of a single LO for a multiple band, multiple standard radio transceiver because the tuning range of the LO is wide enough to cover several frequency bands. Tuning sensitivity and phase noise performance are maintained at levels comparable to narrow band local oscillators because the continuous wide frequency range is provided by a cascade of several programmable narrow ranges. Tuning within any one of the narrow bands may be selected by setting the value of N. In addition, the VCO center frequency and tuning may be adjusted using the LC tank circuit, as discussed above. This provides additional flexibility in available local oscillator frequencies.

Figure 30:
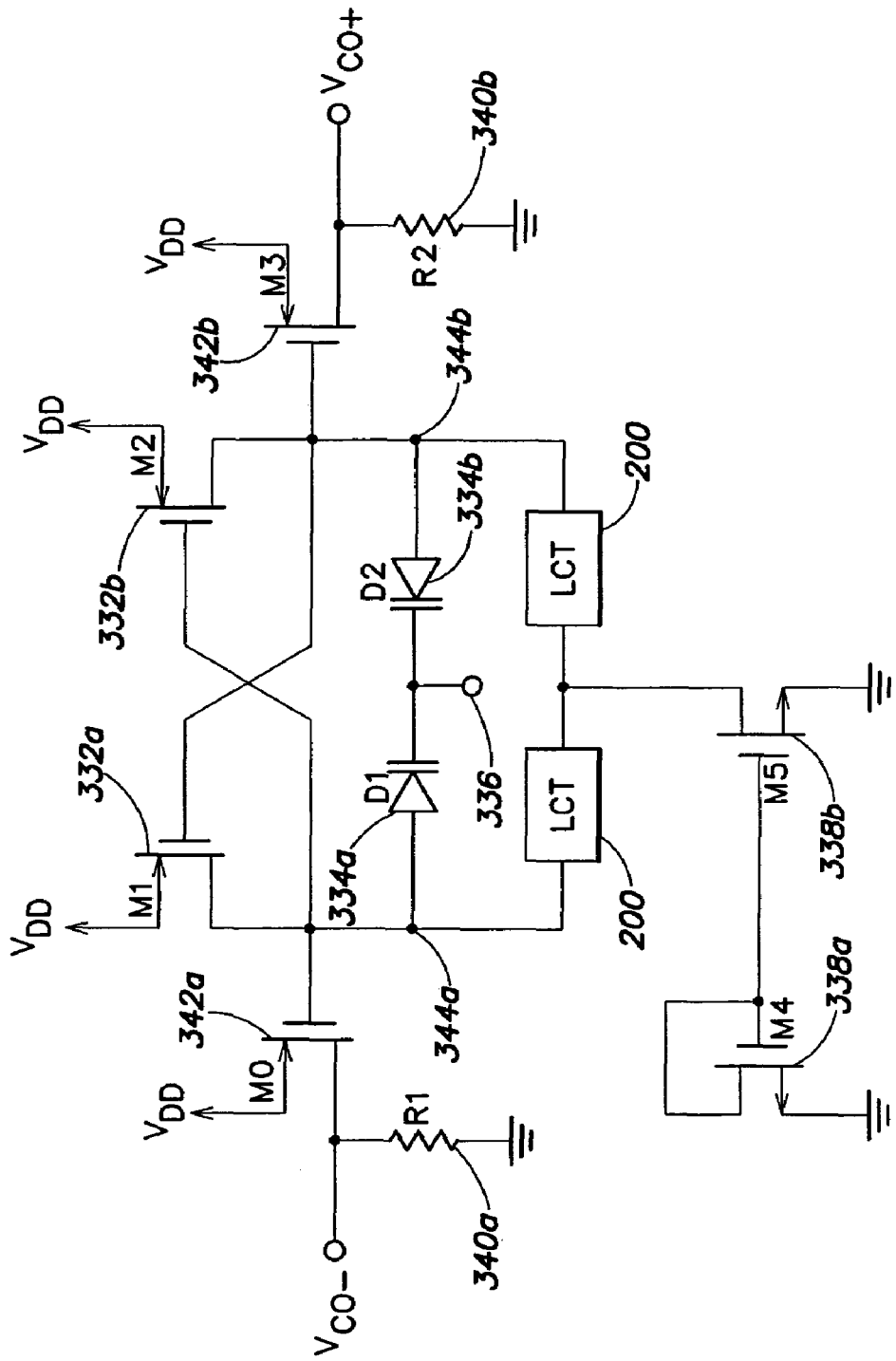
FIG. 30 is a circuit diagram of one embodiment of a differential voltage controlled oscillator incorporating an LC tank circuit according to aspects of the invention.

Referring to FIG. 30, there is illustrated a circuit diagram of one embodiment of an LC tank circuit 200 deployed in a differential VCO circuit. In the illustrated example, the differential VCO comprises a cross-coupled MOS transistor pair 332a, 332b, connected to two varactor diodes 334a, 334b and two LC resonant circuits 200. The signal from the loop filter 230 (see FIG. 15) is received at input port 336 between the two varactor diodes 334a, 334b. Transistors 338a and 338b are configured as a current mirror that sets the bias current for the VCO. The output signal $f_{vco}$ (see FIG. 15) is obtained at the differential outputs VCO+ and VCO− as voltage drops over resistors 340a and 340b, and transistors 342a and 342b act as buffers on the outputs as shown in FIG. 15, the differential voltage signal, at frequency $f_{vco}$, is the input into the divide-by-N circuit 232.

According to one embodiment, tuning of the VCO circuit 198 is achieved using the varactor diodes 334a, 334b via a control voltage supplied from the loop filter at input port 336. In one example, for Vdd=1.8 volts (V), the varactor diodes 334a, 334b will start to be forward-biased when the tuning voltage reaches approximately 0.5 V. However, assuming that the overdrive voltage for the MOS transistors 332a, 332b is approximately 0.5 V, there is a voltage drop of at least 0.5 V between Vdd and the anodes (344a, 344b) of the varactors diodes. Thus, the DC voltage at the anodes is approximately 1.3 V (assuming Vdd=1.8 V). As a result, the tuning voltage provided by loop filter 230 at input port 336 may range from 0 V to Vdd (e.g., 1.8V) without forward biasing the varactor diodes 332a, 332b (because the anode voltage is 1.3V and the diode threshold is 0.5 V). Consequently, varying the tuning voltage does not increase the VCO gain, and because the varactor diodes are never forward biased, the VCO does not suffer from phase noise performance degradation.

In one embodiment, the VCO tuning range is controlled by a combination of the varying the capacitance of the varactor diodes 332a, 332b with the signal from the loop filter 230, and varying the capacitance of the LC tank circuit. As discussed above, tuning the capacitance of the varactor diodes 332a, 332b provides fine frequency tuning within a band. Courser tuning is achieved by switching in and out banks of capacitors in the LC resonance circuits 200, as discussed above. Therefore, with the appropriate setting of the LC tank circuits 200, the VCO can have a very wide tuning range of up to about 20%.

As discussed above, the RFIC of FIG. 1 may include a built-in test and evaluation (BITE) digital analysis and calibration module 106 that enables the setting, monitoring, and correction of performance parameters such as gain, dynamic range, and selectivity in an analog receiver chain. According to one embodiment, the BITE module may be an integrated system component that can be embedded with the radio transceiver chip for monitoring and calibration of the receiver and/or transmitter chains. As shown in FIG. 1, the analog front end of an RF transceiver may comprise a number of precisely tuned and optimized functional blocks including, for example, a low noise amplifier 116, a mixer 280, a bandpass filter 282, a baseband amplifier 284, and an analog-to-digital converter 120. These or similar analog building blocks may typically be found in most receiver architectures, including heterodyne, low-IF and zero-IF receivers. When switching from one operating configuration to another to allow the analog receiver chain to operate in a different setting (for example, a different cellular phone standard) that requires a different band of operating frequencies, channel spacing, sensitivity, dynamic range, etc., it can be important to monitor whether or not the performance characteristics of the receiver and/or transmitter chain comply with the new telecommunication standard. If deviations are detected, it is also important to adjust parameters of the receiver chain to bring the system into compliance with the desired performance requirements. Furthermore, once a particular setting (for example, a GSM cell phone standard) is selected by the user, it may be desirable to monitor the parameters of the receiver chain, for example, at certain time intervals, to detect any deviations from desired performance, and if such deviations are detected, to correct them. It may be particularly, advantageous to be able to monitor performance parameters and make adjustments during operation of the radio transceiver, i.e., via an integrated (built-in) monitoring and calibration system.

Figure 23:
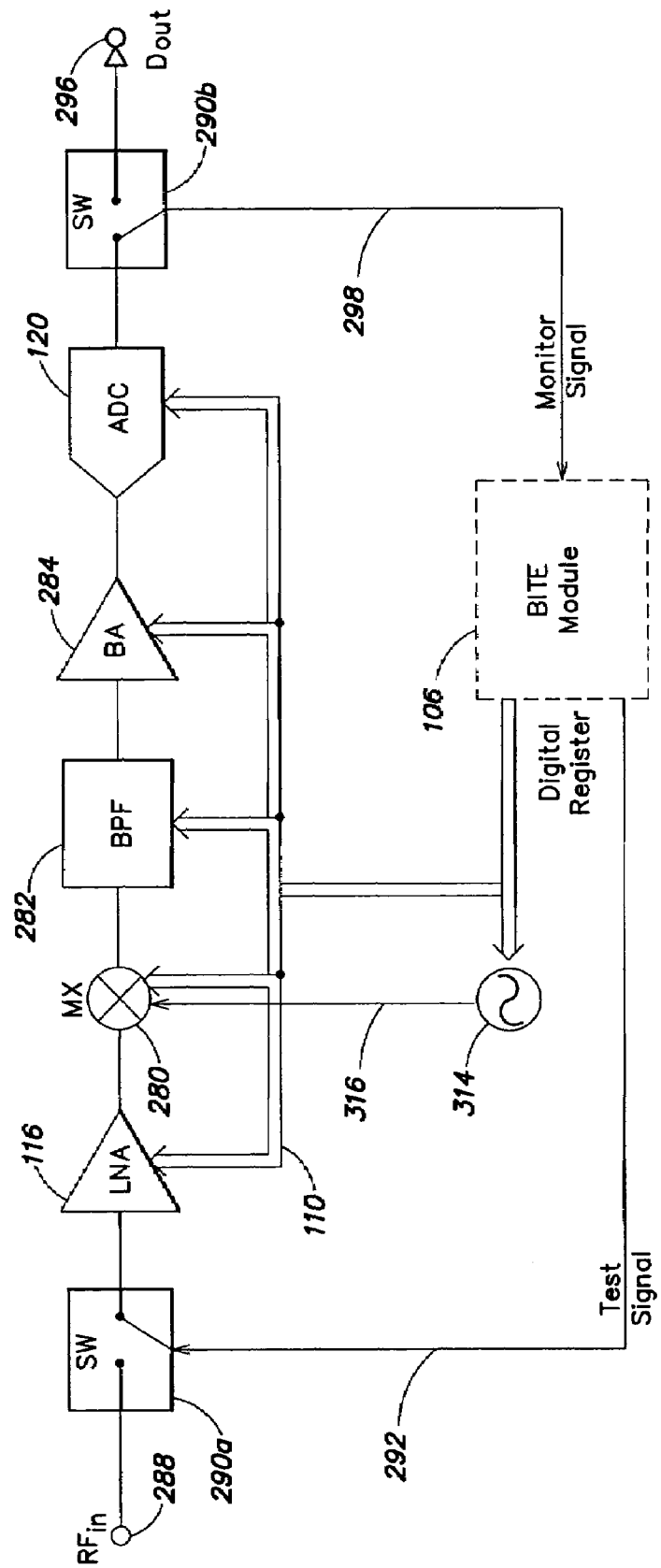
FIG. 23 is a block diagram of one embodiment a receiver chain including a built-in test and evaluation module according to aspects of the invention.

Referring to FIG. 23, there is illustrated a block diagram of one embodiment of a receiver chain of a radio transceiver, including a built-in test and evaluation (BITE) module 106 to monitor and adjust the functionality of a receiver chain, according to aspects of the invention. The BITE module may monitor and adjust parameters such as gain, dynamic range, and selectivity in the receiver chain, a discussed below. In the illustrated example, the receiver chain comprises an RF input 288, a low noise amplifier 116, a mixer 280, a bandpass filter 282, a baseband amplifier 284 and an analog-to-digital converter (ADC) 120. Each of these components may be programmable via digital commands that may be received via the programming bus 110. These digital commands may specify operating parameters of the components, such as, for example, center frequency and filter order of the programmable bandpass filter 282, effective number of bits of the ADC 120, and other parameters as discussed further below. Each component may include a digital register into which the digital commands may be loaded to set the operating parameters. The BITE module 106 can be switched into and out of the receiver chain by a pair of complementary, low-insertion loss switches 290a and 290b. During normal operation of the receiver chain, an RF signal is received at the RF input 288 and is processed through the receiver chain to provide a digital output on line 296. When the BITE module is operational, the switches 290a, 290b disconnect the receiver chain from the RF input 288 and digital output node 296 and instead couple the receiver chain to the BITE module 106.

According to one embodiment, for testing, monitoring or calibration of the receiver chain, a trigger signal may be sent to the BITE module 106 over the digital programming bus 110 from, for example, the microcontroller 108 (see FIG. 1) to activate the BITE module. For example, the BITE module chain may begin operation when the microcontroller issues a command to monitor the analog receiver chain. Alternatively, the microcontroller may send a command to the system to switch over to a different standard, for example from GSM to CDMA. In this case, the microcontroller may issue a command to tune the receiver for a particular center frequency, gain setting, bandwidth, and linearity, compliant with a selected telecommunication standard. As a result, the BITE module may be activated to check performance of one or more of the components of either or both of the receiver chain and the transmitter chain of the radio transceiver to ensure that the transceiver is operating in accordance with the new standard performance requirements. In both the above examples, the BITE module receives, from the microcontroller, a specific data word whose content contains the information to set a particular standard such as GSM, EDGE-GSM, CDMA, etc., as discussed further below. In addition to activating the BITE module, the microcontroller may send a signal to the switch 290a to temporarily disconnect the RF input 288 from the receiver chain and instead allow a test input signal on line 292 to be input to the receiver chain. Simultaneously (or nearly so), the microcontroller may send a signal to the switch 290b to temporarily disconnect the digital output node 296 from a subsequent digital baseband processor interface (e.g., digital baseband processor 124 and digital interface 112—see FIG. 1) and instead connect the digital output to the BITE module 106 via line 298.

Figure 24:
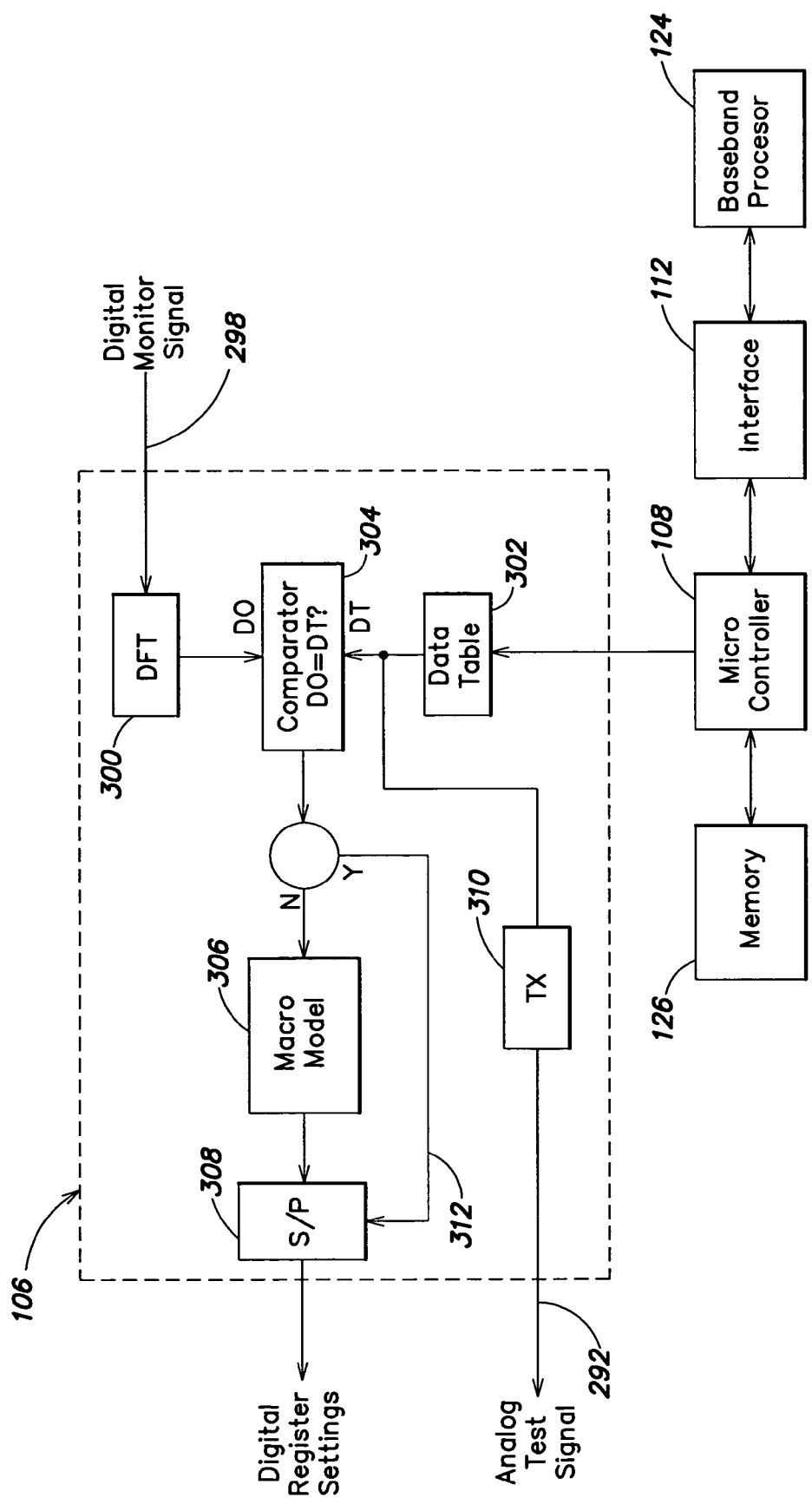
FIG. 24 is a block diagram of one embodiment of a BITE module according to aspects of the invention.

Referring to FIG. 24, there is illustrated one embodiment of a built-in test and evaluation (BITE) module according to aspects of the invention. The BITE module 106 may comprise a Discrete Fourier Transform (DFT) module 300, a data table look-up module 302, a comparator 304, a macro model 306, a serial to parallel conversion module 308, and optionally a transmitter chain 310 that generates the test input signal to be applied on line 292. It is to be appreciated that the test signal may either be generated by a separate transmitter 310 or may be obtained from the transmitter portion of the radio transceiver architecture (see FIG. 1). The BITE module 106 may be coupled to the microcontroller 108 via the digital bus 114 (see FIG. 1). In one embodiment, the BITE module 106 may be implemented with hardwired, embedded logic as available in field programmable gate array (FPGA) logic, or as part of a cell-based application specific integrated circuit (ASIC) microelectronic design.

According to one embodiment, a purpose of the BITE module 106 is to generate suitable test signals that can be used to test the analog receiver chain. These test signals are dependent on a particular setting, for example, a cell phone standard such as GSM, EDGE-GSM, CDMA, and the like, and are based on the particular parameter settings of the individual functional blocks in the receiver chain (e.g., the LNA, bandpass filter, etc.) that are needed to achieve performance compliance for the selected setting. Some examples of parameters within the receiver chain blocks that may be tested include: bias voltage or current to set desired power levels and gains, impedance of input and output matching networks to maintain proper input/output impedance matching between components for particular operational frequency bands, device sizes of the active devices to change the operating frequency, and third order input intercept points (IIP3s) to specify the linearity.

Figure 28:
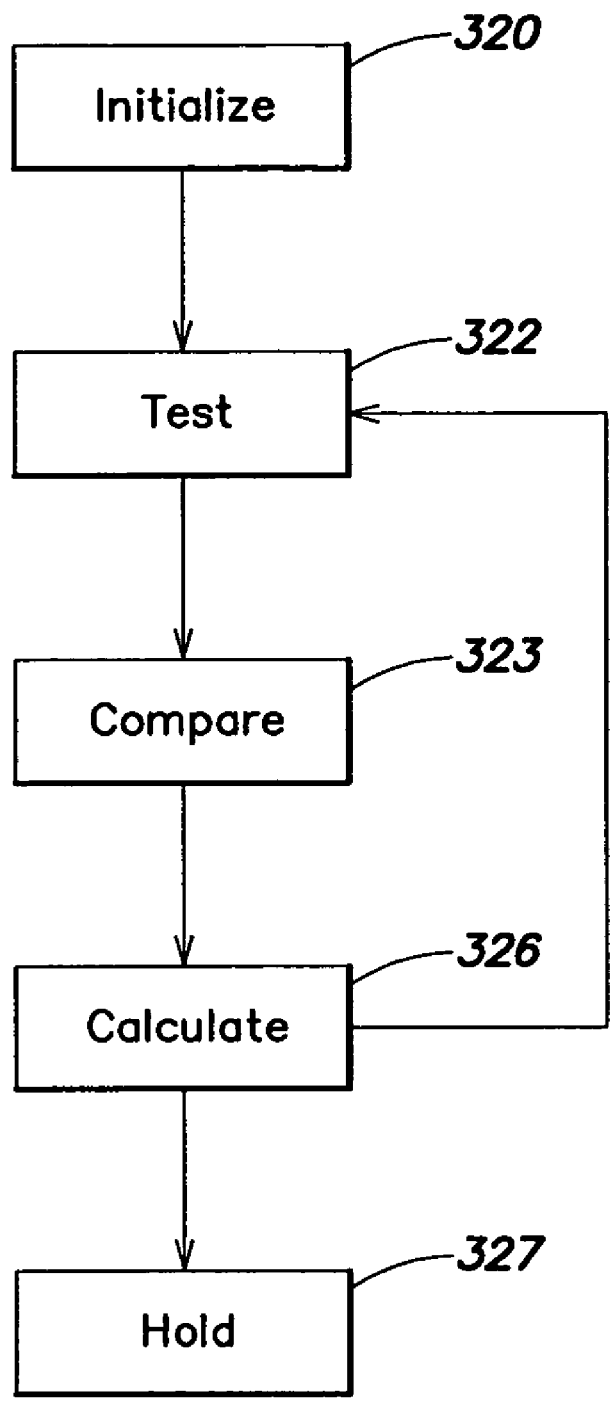
FIG. 28 is a flow diagram illustrating one example of a process for testing a transceiver according to aspects of the invention.

FIG. 28 is a flow diagram illustrating one example of the process steps that the radio transceiver may go through, including steps the BITE module may implement to test receiver components, e.g., the LNA 116, when switched to a selected operating standard. It is to be appreciated that the BITE module may be used to test and/or monitor any programmable component of the receiver chain and/or transmitter chain of the radio transceiver. For conciseness, the following discussion will refer primarily to testing of a component of the receiver chain. However it is to be appreciated that the principles of the invention and the process steps described apply also to components of the transmitter chain.

In a first step 320, the radio transceiver may enter an initialization mode. The purpose of the initialization mode is to configure or program the receiver chain into a state that represents a best initial "guess" (e.g., based on factory calibration data) as to the state of the receiver chain desired for operation in the selected receiver setting (e.g., CDMA mode, GSM mode, etc.). For example, referring to FIG. 1, the programmable radio transceiver 101 may receive a command from an external host controller (not shown) through the interface 112 to configure or re-configure the analog receiver chain into a selected mode of operation. In response, the integrated microcontroller may load (e.g., from memory 126) digital register values associated with the selected mode and clock them onto the programming bus 110 to be transmitted to the components of the radio transceiver. In one embodiment, the microcontroller may load a digital word specifying the register values directly to the components of the receiver chain. In another embodiment, once the BITE module 106 is connected into the analog chain, the BITE module loads the digital registers, the content of which is communicated via the digital programming bus 110 to each of the analog blocks, for example, the low noise amplifier 116, the mixer 280, the bandpass filter 282, the baseband amplifier 284, and the ADC 120. The digital word acts as a control signal that may specify operating characteristics of each analog block in the receiver chain to which it is applied. For example, the digital word may specify a center frequency of the bandpass filter, a gain of the amplifier, etc. The digital word allows the individual blocks within the receiver chain to set so as to implement a particular function of the telecommunication standard. In one example, the contents of the digital word may be specified by the microcontroller 108 or baseband processor 124. In one embodiment, the memory 126 may store one or more digital words that specify operating parameters for one or more telecommunication standards. The microcontroller may access the memory to retrieve an appropriate digital word and provide it to the BITE module.

As shown in FIG. 23, the BITE module 106 may also be coupled to a digitally programmable oscillator 314 forming part of the frequency synthesizer 104 (see FIG. 1) which provides a harmonic output signal having a frequency $f_{out}$, as shown, for example, in FIGS. 15-18. According to one embodiment, from initial set of register values specified by the digital word, the frequency synthesizer 104 may be programmed to a desired frequency band and may generate a reference frequency signal $f_{ref}$, as discussed above. The receiver VCO 198 (see FIG. 15) may then be phase locked to the reference frequency signal $f_{ref}$ (on line 226, see FIG. 15) through the use of negative feedback associated with the phase locked loop operation described in reference to FIGS. 15 and 16. The result of this process is the generation of a precise and desired local oscillator frequency $f_{out}$, which may be supplied to the mixer 280 on line 316, as shown in FIG. 23.

In addition to setting the local oscillator frequency for the selected operating setting, certain parameters of other components of the transceiver may be programmed as well. For example, digital register values may be communicated (via the programming bus) to control parameters of the programmable bandpass filter 282 (see FIG. 23), such as filter order, filter type (e.g., high pass, low pass, or bandpass), filter shape (e.g., Butterworth, Chebyshev, etc.) and center frequency. During initialization, digital registers of the programmable bandpass filter 282 are loaded with the values associated with the desired mode of operation. From these initial settings, the center frequency and filter order values may be adjusted in closed negative feedback loops. For example, the center frequency may be slaved to the precision master clock 130 (see FIG. 1) and the filter order value may be slaved to the master impedance 128. The result of this process is the precise centering of the filter frequency and precise control of the filter order. Furthermore, the analog to digital converter 120 may also be programmable, and register values may be set to control the sampling rate (Fs) and the effective number of bits (ENOB) to reflect the values required for the desired mode of operation. It is to be appreciated that any programming registers in the receiver which are not adjusted by local negative feedback loops, such as, for example, bias current, input matching circuitry and load impedances can be set to the initial values stored in memory for the desired mode of operation.

Referring again to FIG. 28, in a second step 322, the radio transceiver may enter a test mode in which the BITE module 106 may be activated. The purpose of the test mode is to synthesize test signals to facilitate testing of, for example, the receiver chain to determine its actual level of performance. In one embodiment, the BITE module 106 initiates testing of the receiver chain by applying the test input signal to the input of the analog receiver chain on line 292. The mixer 280 mixes the signal on line 316 with the test input signal to translate the frequency content of test signal into a base band frequency with upper and lower side bands. The bandpass filter 282 may then select a particular range of frequencies and transfer characteristics such as, for example, ripple and/or skew, based on the content of the digital word that was supplied to the bandpass filter by the BITE module 106. The corresponding output of the analog receiver chain, which is digitized by the ADC 120, is applied to the BITE module on line 298 for processing. The test input signal may be generated with particular characteristics (e.g., frequency, amplitude etc.) such that various performance features of the analog chain (like gain, frequency, linearity) may be tested. In one embodiment, a digital filter (not shown) may be placed in line 298 that filters the digital output signal and generates a monitor signal, for example, at regular or synchronous intervals that are determined by a clock frequency from the master clock 130 (see FIG. 1).

According to one embodiment, the test signal on line 292 may be generated on the semiconductor chip by the transmitter 280. Generally, for testing components of the receiver chain to determine whether their performance complies with a selected communication standard, the test signal may be generated at the radio frequency of interest and may be modulated or un-modulated, or may be a continuous wave (CW) signal. For example, to test for RF center frequency compliance and gain, a CW signal at and around the desired center frequency may be used.

Figure 33:
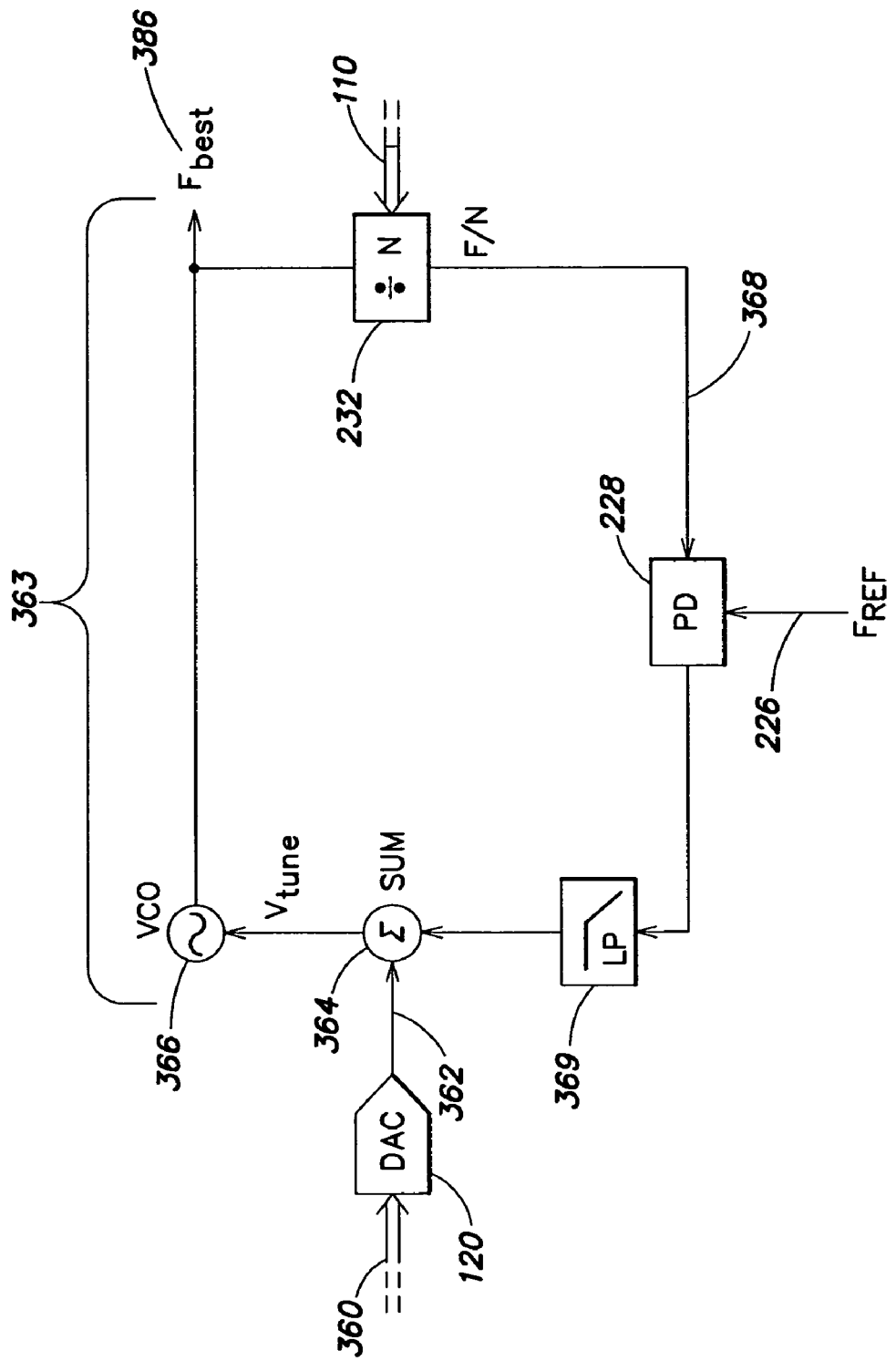
FIG. 33 is a block diagram of one embodiment of a circuit that may be used to generate a test signal, according to aspects of the invention.

Referring to FIG. 33, there is illustrated an example of a phase-locked VCO 366 in combination with a precision reference signal source that may be used to generate a test signal having a precise RF output frequency. In one example, an input ramp signal may be generated digitally, for example, by the microcontroller 108 (see FIG. 1), and applied on line 360 to a digital-to-analog converter (DAC) 120 to be converted to an analog signal. This analog signal on line 362 may be introduced to the feedback loop 363 via a summer 364. A divide-by-N counter may be programmed, via a signal on the programming bus 110, to set appropriate values of N to divide the signal from the VCO 366 to generate the desired output frequencies on line 368. A phase detector 228 may compare the divided output frequency $f_{test}$ /N with a reference frequency $f_{ref}$ on line 226 and generate a difference frequency signal that is filtered by low-pass filter 230 and applied to the summer 364, as shown in FIG. 33. Generation of the reference frequency $f_{ref}$ was discussed above in reference to FIGS. 15 and 16. The summer 364 combines the filtered signal from the phase detector 228 and the signal from the DAC 120 to generate a tuning voltage $V_{tune}$ that sets the VCO output frequency. In this manner, a precise test signal $f_{test}$ may be generated because the center frequency of the signal $f_{test}$ may be precisely controlled by the reference frequency source 204 (see FIG. 15) and the feedback loop 363.

Figure 34:
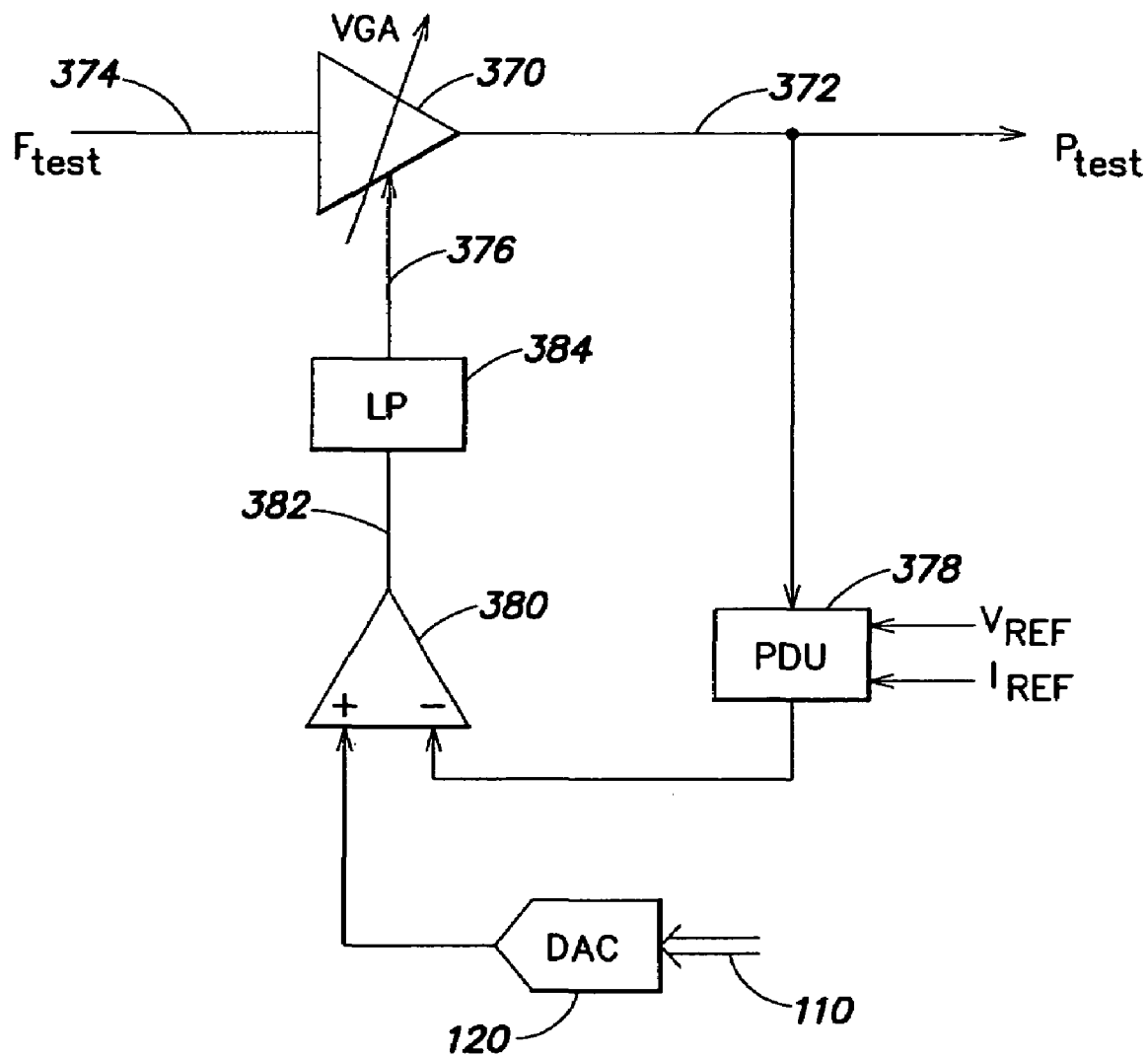
FIG. 34 is a block diagram of one example of a power control loop according to aspects of the invention.

According to one embodiment, the test signal power level, which may be used for gain calibration of various transceiver components, may be controlled using a power control loop as shown in FIG. 34. The signal $f_{test}$ on line 374 may be fed to a variable gain amplifier 370 which may amplify or attenuate the signal so as to provide a test signal on line 372 having a particular power level $P_{test}$. The gain applied to the signal on line 374 by the variable gain amplifier 370 may be controlled by a loop signal that is fed to the variable gain amplifier on line 376. In the power control loop, the output signal power level $P_{test}$ may be slaved to a precisely known reference current $I_{REF}$ and reference voltage $V_{REF}$ via a power detector unit (PDU) 378. The output of the PDU 378 may be fed to one port of a signal comparator 380, as shown. The signal comparator may also receive a control signal at its other port from the system microcontroller 108 (not shown). For example, the microcontroller may send a control signal (which may specify a desired power level for the signal on line 372), via the programming bus 110, to a digital-to-analog converter (DAC) 120 which, in turn, applies the control signal to the signal comparator 380. The signal comparator may compare the power level specified by the control signal and the power level of the signal from the PDU 378 and generate a difference signal on line 382. This difference signal may be filtered by a low-pass filter 384 and applied to the variable gain amplifier 370 to adjust the gain of the variable gain amplifier. The resultant test signal 386 (see FIG. 33) may have a precisely controlled center frequency (from the loop 363) and power level $P_{test}$ that are known to within a specified and acceptable tolerance for the overall transceiver system.

Referring again to FIG. 24, as the BITE module applies a particular test signal to the input of the analog receiver chain, it monitors simultaneously the output via sampling of a digital monitoring signal supplied to the BITE module on line 298. When the synchronously or asynchronously sampled digital data enters the BITE module 106, it is transformed into the frequency domain via the DFT module 300. This transformation allows the BITE module to analyze frequency components of the received signal and compare them to an ideal response signal, as discussed further below. In one embodiment, the DFT 300 may be implemented, for example, as a 64, 128, 256 or 512 point transform which allows the computation of complex constellation diagrams that describe, for a particular telecommunication standard, the in-phase (I) and quadrature (Q) components of a received digital signal, as discussed further below.

Once the DFT module 300 has generated the digital output signal DO, it is applied to the comparator 304. The comparator 304 also receives a digital signal DT from the data table 302. The digital signal DT represents the ideal response of the receiver chain to the particular test input signal. In one example, the reference signal DT may be loaded from the attached memory 126 of the microcontroller 108. The microcontroller, in turn, may initiate the transfer of the reference signal DT to the BITE module in response to a command issued from the baseband processor 124 which may specify, for example, the telecommunication standard for which the receiver chain is being tested. Deviations from the ideal performance may result in the generation of correction response that is loaded into a digital register (not illustrated) and communicated to the various analog blocks via a digital bus, as discussed further below.

Figure 25:
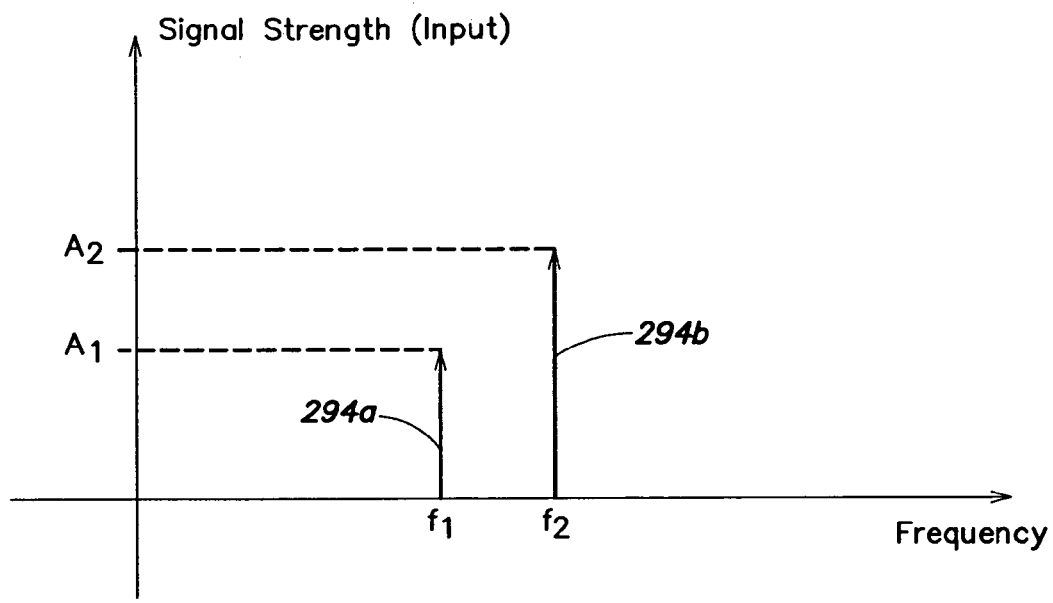
FIG. 25 is an illustration of one example of a test input signal comprising two tones, according to aspects of the invention.

As discussed above, a test signal having precisely controlled parameters, such as center frequency and power levels, can be generated by the transmitter. When this signal is transformed to the frequency domain, it may have a precisely known frequency characteristic that may be used to evaluate components of the transceiver. Referring to FIG. 25, there is illustrated one example of a dual tone analog test signal (illustrated in the frequency domain) that may be generated by the transmitter 310 and supplied to the analog receiver chain on line 292. The test input signal may comprise two closely spaced harmonic signals (represented by lines 294a, 294b) that may have the same amplitude A1, or different amplitudes A1 and A2, and are located at frequencies f1 and f2. In one example, the tones 294a, 294b may have a random phase relationship and may be separated by approximately one channel width for the selected standard of interest. It is to be appreciated that the test input signal is not limited to the example given in FIG. 25 and may have a different structure. For example, A2 may be smaller rather than larger than A1. In one example, the test input signal may be generated by transmitter 310 in response to a digital input supplied by the data table 302, which in turn may receive a control input from stored data in memory 126 via microcontroller 108 (see FIG. 24). For example, the test signal may be generated by an in-phase and quadrature single sideband modulator in the transmitter 310 and may be up-converted to a lower end of the frequency band to be tested by a phase locked local oscillator that is locked to a particular frequency referred to herein as $f_{low}$. The resultant test input signal on line 292 may have two main frequency components, namely $f_1$ and $f_2$, and may be applied via the switch 290a (see FIG. 23) to the input of the programmable receiver chain.

Figure 26:
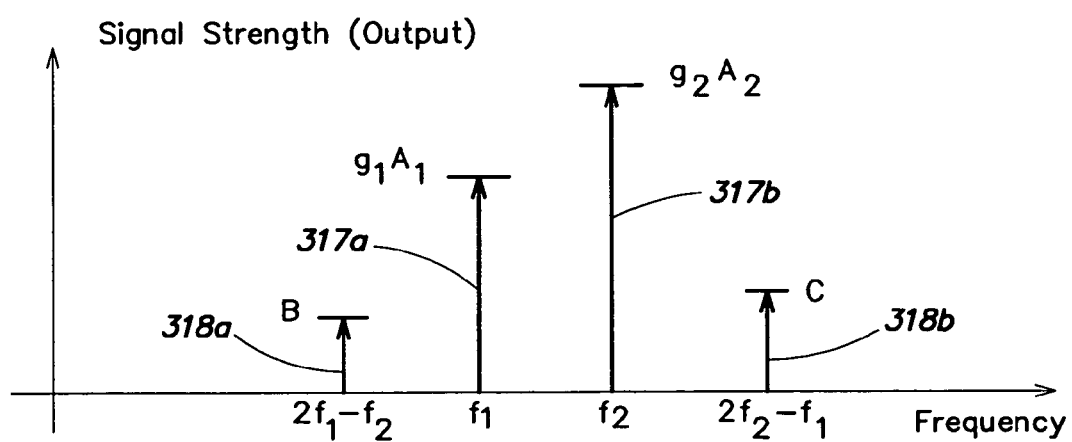
FIG. 26 is an illustration of one example of an output signal from the receiver chain based on the exemplary test input signal of FIG. 25.

When the test input signal is applied to the receiver chain, it is amplified, mixed, filtered, and digitized by the components of the receiver chain, as discussed above. This process may produce an increase in amplitude of the original tones comprising the test input signal by amplification factors g1 and g2 which may determined by the settings of the analog receiver chain. Referring to FIG. 26, the amplified tones are illustrated by lines 316a and 316b in the frequency domain. These tones are generated by the DFT module 300 performing a discrete Fourier transform on the received digitized signal to transform the sampled signal into the frequency domain and allow analysis of the frequency components (tones) of the received signal. In addition, due to the third-order non-linearities present in any receiver components and down-conversion to baseband, the process may cause generation of additional harmonic signals, for example harmonics of amplitudes B and C at frequency locations $2f_1-f_2$ and $2f_2-f_1$ (lines 318a, 318b), as shown in FIG. 26. The amplitude and frequency locations of these harmonic signals are directly related to the linearity behavior of the entire analog receiver chain. Therefore, the BITE module can perform an analysis of the analog receiver chain by monitoring the output of the ADC 120, and its subsequent frequency domain transformation in the DFT block 300. A detailed comparison between the digital output signal DO and the reference signal DT, allows an assessment of the receiver chain.

It should be apparent that different test signals with different input frequencies can be generated based on providing a different digital output from data table 302. As a result, frequency range, frequency stability, gain and linearity can be tested. Gain at the lower end of the band may be determined by comparing the power in the tone at $f_1$ or $f_2$ with the power in the original tone of the test input signal (adjusted for the gain/loss of the internal up-conversion process). Linearity, in the form of third order intercept point (IP3) can be determined by calculating the IM3, namely, the difference in power of $f_1$ and $2f_1-f_2$ or $f_2$ and $2f_2-f_1$, and using the relationship:

$$IP3(dBm)=A(dBm)+IM3/2(dBc)$$

where dBm denotes decibels with respect to milliwatts and dBc are decibel of the carrier frequency, and A is the amplitude in the frequency domain (i.e., power present in tone 294a) of the original test input signal.

Additionally, if $f_{low}$ is varied in discrete steps over the bandwidth of interest (beyond some excess bandwidth factor, nominally equal to the expect center frequency production tolerance of the receiver) and the gain calculation is made at each step, knowledge of the frequency response is developed. From this frequency response data, a good estimate of center frequency and bandwidth of the receiver can be made.

According to one embodiment, a more sophisticated testing situation may involve the generation of a test input signal that includes one or more modulated symbols. Symbols are unique representations of a particular modulation technique such as quadrature amplitude modulation (QAM), binary phase shift keying (BPSK), etc. Symbols may be generated in a transmitter, for example, the transmitter 310 of the BITE module, or the transmitter chain of the RFIC (see FIG. 1). In one example, the symbol(s) may be generated in response to a digital command provided by, for example, the data table 302 or microcontroller 108.

Figure 35:
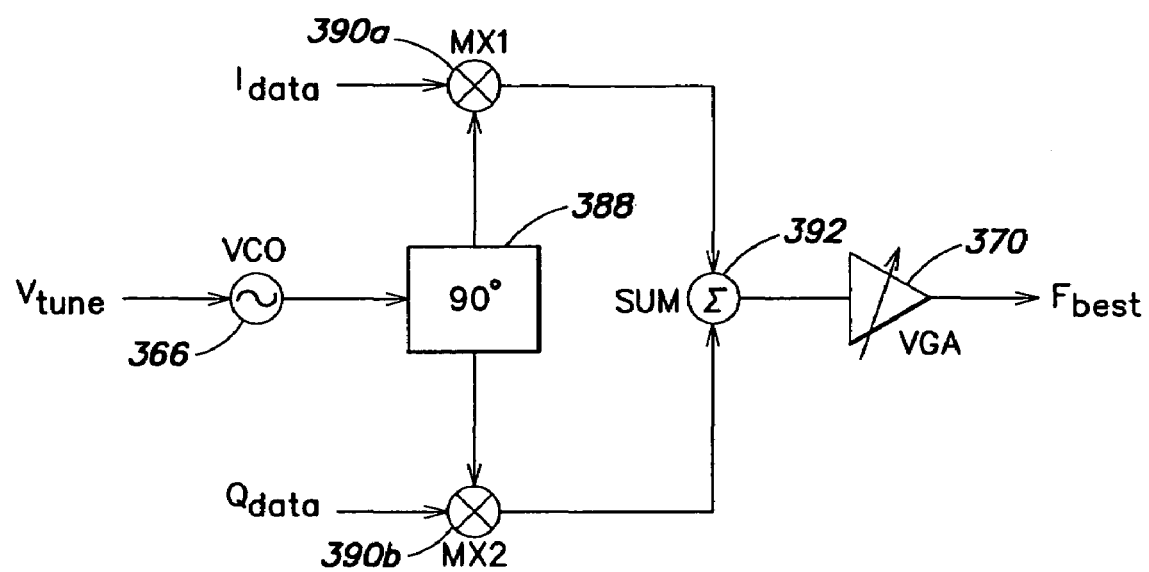
FIG. 35 is a block diagram of one example of a means for generating a modulated test signal according to aspects of the invention.

In one example, the test signal may be modulated using an in-phase (I) and quadrature (Q) modulator. The test signal may be amplitude, frequency or phase modulated. In one example, where no information is contained in the amplitude of the signal (e.g., phase or frequency modulations), a baseband or low frequency, shaped digital or analog signal may be added into the phase locked loop 363 of FIG. 33, usually before or after the loop filter 369. In another example, where some information may be contained in the amplitude of the test signal, an IQ modulator may be used to generate test signal, as shown in FIG. 35. Referring to FIG. 35, the signal generated by the voltage controlled oscillator (VCO) 366 may be fed through a 90-degree phase shifter 388 to two mixers 390$q$, 390$b$. A modulation signal may be combined with the phase-shifted VCO signal in the mixers 390$a$, 390$b$. As shown in FIG. 35, an I data stream (of the modulation signal) may be mixed in mixer 390$a$ and a Q data stream (of the modulation signal) may be mixed in mixer 390$b$. The I and Q data streams may be obtained from the memory 126 (see FIG. 1) under control of the microcontroller 108 (see FIG. 1). The output signals from the mixers may be combined in a summer 392 to generate the test signal $f_{test}$. In one example, the power level of the signal $f_{test}$ may be controlled via a variable gain amplifier 370 as discussed in reference to FIG. 34.

Figure 27:
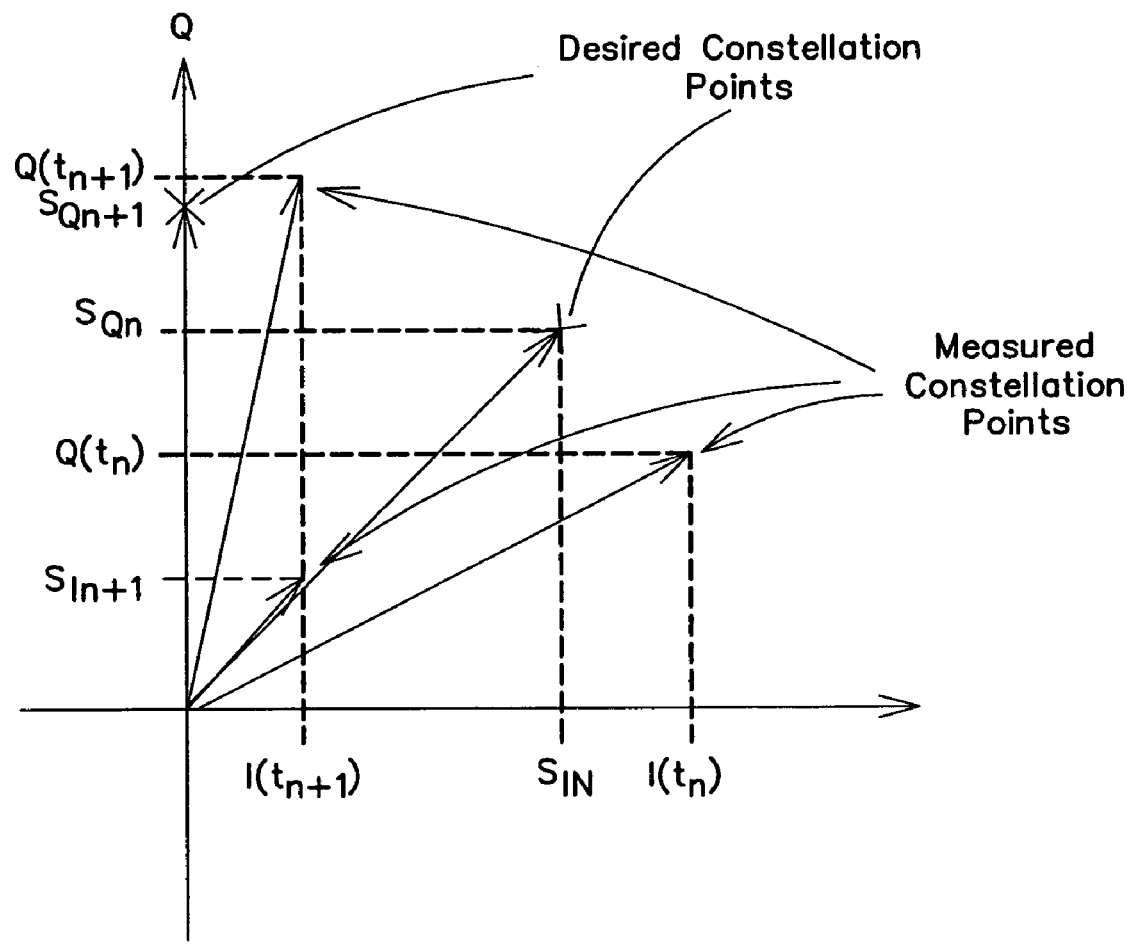
FIG. 27 is a constellation diagram showing two desired constellation points and actually recorded constellation points.

Referring to FIG. 27, there is illustrated one example of a constellation diagram generated from a simulation of the receiver chain illustrated in FIG. 23. As shown in FIG. 27, for each transmitted symbol, both I and Q components can be represented as vectors. Specifically, FIG. 27 depicts two vectors (although it is to be appreciated that the constellation diagram may comprise a plurality of vectors) representing symbols (S) identified by integer subscripts n and n+1 and located in the diagram at locations $S_{In}$, $S_{Qn}$ and $S_{In+1}$, $S_{Qn+1}$. The BITE module records the actual signal response via the monitor signal path 298, subjects the digital data to a discrete Fourier transform operation, and records a digital output signal DO. This digital output will provide the information I($t_n$), Q($t_n$) and I($t_{n+1}$), Q($t_{+1}$), corresponding to the actually received symbols (S) labeled with subscripts n and n+1, illustrated in FIG. 27.

Referring again to FIG. 28, a next step in the process may be a compare mode 323. The purpose of the compare mode is to determine the amount of error that exists in the current performance configuration when compared to the desired response. Once the test mode is completed, the digital output signal (Do) is provided from the DFT module 300 to the comparator 304 to be compared with a reference digital signal DT. The reference digital signal DT may be stored in the data table 302 and is related to the telecommunication standard of interest. This reference digital signal may include a target center frequency, a target bandwidth for the signal, a target gain and a target IP3. In addition to the target values, each parameter may have an acceptable error bar associated with it. In one embodiment, these values may have been derived from a statistics-based reference design which implies that overall system performance compliance will occur when actual values are equal to the target values within the acceptable error bar.

In one embodiment, at each time increment $t_n$, $t_{n+1}$, the comparator 304 compares the measured output of the analog chain (DO) against the reference signal (DT) to generate an error vector magnitude signal EVM. The time increments may be defined, for example, by the sampling rate of the digital output signal which may be derived from the master clock frequency. According to one embodiment, the error vector magnitude (EVM) can be computed for each symbols based, for example, on the so-called "L2" norm, according to the formulas:

$$EVM_n = \sqrt{|I(t_n)-S_{In}|^2 + |Q(t_n)-S_{Qn}|^2}$$

and $$EVM_{n+1} = \sqrt{|I(t_n)-S_{In+}|^2 + |Q(t_n)-S_{Qn}|^2}$$

However, it is to be appreciated that the invention is not limited to the use of the L2 norm and other norms can be defined as well. The comparator 304 may monitor the entire constellation diagram representation of the digital output signal DO provided by the DFT module 200 and the reference signal DT provided by the data table 302. The comparator checks for deviations between the signals DO and DT, that is, whether or not DO=DT within some defined error tolerance threshold. Referring again to FIG. 24, if the comparator does not encounter a deviation (e.g., DO=DT within some tolerance), then branch Y is taken, which prompts the serial to parallel conversion circuit 308 to reissue the content of the digital register that set the performance parameters for the analog receiver chain. The serial to parallel conversion module converts the serial digital signal received on line 312 into parallel signal that may be applied to each of the components in the analog receiver chain via the digital bus 114, as shown in FIG. 23. If the comparator encounters a deviation, then branch N is taken. In this case, the comparator provides the EVM signal to the macro model 306. In one example, the compare mode may be complete once the current values and errors have been calculated for at least one iteration of the test mode and these values have been sent to the macro model module 306.

Referring again to FIG. 28, a next process step may be a calculate mode 326. The purpose of the Calculate Mode is to determine the next set of register values to be set based on the error between the measured and the desired responses. In one embodiment, the purposes of the calculate mode may be primarily fulfilled by the macro model 306. In many cases, the receiver chain may have a complex transfer function that may be modeled (in hardware or software) in order to determine the causes of the effects (e.g., deviations) seen in the compare mode. Therefore, the macro model 306 may contain a model of the receiver chain. In one embodiment, the macro model computes, based on a mathematical algorithm, adjustments to correct the receiver chain performance. These adjustments may comprise new values for a digital register, the contents of which may be issued to the various analog blocks via the serial to parallel conversion module 308, causing an adjustment of the functionality of one or more of the components in the receiver chain. In one example, the macro model 306 may be implemented as a finite state machine.

For example, if a current compare mode test has determined that the center frequency of the programmable LNA 116 is low by 20%, the macro model 306 may calculate the digital register values required to switch out some discrete parallel capacitance of the LC resonant circuit 136 associated with the input matching of the LNA 116 to increase the center frequency of the LNA 116 by 20% according to the well-known Thompson resonance formula:

$$f_{center} = 1/2\pi\sqrt{LC}$$

where L and C are the combined inductance and capacitance, respectively, presented by the LNA circuitry and the LC resonant circuit.

Figure 29:
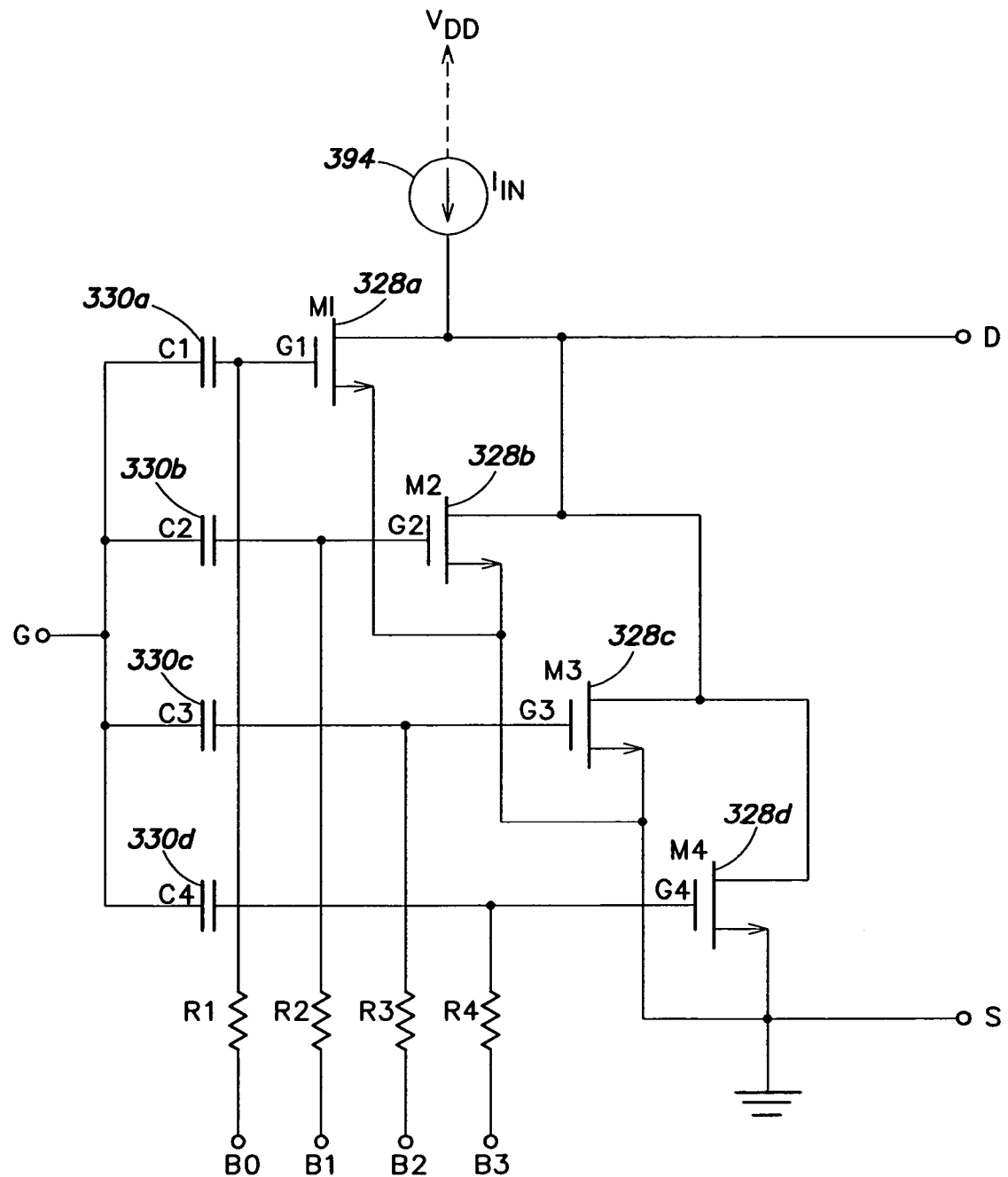
FIG. 29 is a circuit diagram of one embodiment of a gate switching technique that can be used to vary gate width of a component such as an LNA.

Alternatively, the center frequency of the LNA 116 may be retuned by decreasing the total device width used in the LNAs input circuitry by implementing a gate switching technique. Referring to FIG. 29, there is illustrated one embodiment of the LNA 116 including four interconnected MOS transistors 328*a*, 328*b*, 328*c* and 328*d*. The LNA 116 also includes four capacitors 330*a*, 330*b*, 330*c* and 330*d* that isolate the input gate (G) of each MOS transistor from the binary digital inputs B0-B3. The individual gate contacts G1, G2, G3, G4 are combined via the coupling capacitors to a total gate contact G. In one example, the coupling capacitors may have a capacitance value of approximately 0.5 pF. The digital connections B0-B3 couple the programmable digital bus 110 (see FIG. 23) to the individual gate contacts of the four MOS transistors via resistors R0-R3, as shown in FIG. 29. In one example, these resistors may have a value of about 3 kΩ each. The individual drains of each transistor are coupled together to provide an overall drain (D) contact which provides the output of the LNA 116. The individual source contacts of each transistor are also coupled together to form an the overall source (S) contact which is used for setting the appropriate DC bias conditions.

According to one embodiment, each of the four MOS transistors 328*a*, 328*b*, 328*c* and 328*d* may have a particular gate width, referred to herein as W1 (for MOS transistor 328*a*), W2 (for MOS transistor 328*b*), W3 (for MOS transistor 328*c*), and W4 (for MOS transistor 328*d*). Generally, the gate width dimensions of the transistors may vary over a wide range depending on the circuit layout and the CMOS process technology used to fabricate the RFIC. In one example, the gate widths may vary in a range from about 80 microns to about 700 microns. Because the gates of the individual transistors are isolated (by the capacitors 330*a*, 330*b*, 330*c* and 330*d*), the digital programming of either a logical "0" or logical "0" to each of the four binary inputs B0-B3 may produce an overall device behavior whose composite gate width can vary to be any of sixteen different sizes.

In one example, the signal voltage levels may be selected such that a logical "0" on any input B0-B3 implies a voltage below the transistor's threshold voltage, and a logical "1" implies a voltage above the transistor's threshold voltage. Thus, if a logical "0" is applied to the individual gate of any transistor 328*a*-*d*, its function is turned off, whereas is a logical "1" is applied to a gate, the corresponding transistor is turned on. The total gate width for the LNA may be determined by summing the individual gate widths of each transistor that is turned on. Therefore, depending on the digital bit pattern that controls the values of B0-B3, the overall gate width can be controlled to any one of sixteen values, as shown in Table 3 below.

TABLE 3

Total programmable device width based on four digital input signals.

| B3 | B2 | B1 | B0 | Wtotal |
|---|---|---|---|---|
| 0 | 0 | 0 | 0 | 0 |
| 0 | 0 | 0 | 1 | W1 |
| 0 | 0 | 1 | 0 | W2 |
| 0 | 0 | 1 | 1 | W1 + W2 |
| 0 | 1 | 0 | 0 | W3 |
| 0 | 1 | 0 | 1 | W3 + W1 |
| 0 | 1 | 1 | 0 | W3 + W2 |
| 0 | 1 | 1 | 1 | W3 + W2 + W1 |
| 1 | 0 | 0 | 0 | W4 |
| 1 | 0 | 0 | 1 | W4 + W1 |
| 1 | 0 | 1 | 0 | W4 + W2 |
| 1 | 0 | 1 | 1 | W4 + W2 + W1 |

TABLE 3-continued

Total programmable device width based on four digital input signals.

| B3 | B2 | B1 | B0 | Wtotal |
|---|---|---|---|---|
| 1 | 1 | 0 | 0 | W4 + W3 |
| 1 | 1 | 0 | 1 | W4 + W3 + W1 |
| 1 | 1 | 1 | 0 | W4 + W3 + W2 |
| 1 | 1 | 1 | 1 | W4 + W3 + W2 + W1 |

If each of W1, W2, W3 and W4 are different, Table 3 illustrates how the overall device width of the LNA can be programmed to be any one of sixteen values. However, it is to be appreciated that the invention is not limited the example of four transistors with four gate widths and four digital inputs as shown in the above table. Rather, the principles of the invention may be applied to any number of transistors and digital input signals and the gate widths of different transistors may be the same or different.

In addition, referring again to FIG. 29, a current source, 394 may be adjusted based on the applied digital pattern (and therefore, the number of "on" transistors) such that an appropriate bias current may be set by summing the individual currents to the sources of each activated transistor. For example, if bit pattern 1011 is applied, then bias current corresponding to the sum of the individual bias currents for each of transistors 328*a*, 328*b* and 328*d* may be supplied.

As is known to those skilled in the art, by decreasing or increasing the total gate width, the center frequency of the LNA can be increased or decreased, respectively. The digital values applied to each of the binary inputs B0-B3 may be controlled by the macro model to set an appropriate gate width based on a desired center frequency. In addition, the gain of the programmable LNA 116, and thus of the overall receiver chain can be adjusted by changing the bias current to the LNA, through a bias control circuit and through control of the load impedance as shown with the equation:

$$A = -gm*Z1$$

where A is the gain, gm is the transconductance and Z1 is the load impedance. As discussed above, the load impedance may be controlled, for example, through the use of a programmable LC resonant circuit 136. Controlling the impedance can, in turn, be used to modify or program the gain of the LNA.

In many cases, the linearity of the LNA 116 can have a large impact on the linearity of the overall receiver chain. The parameters with the most direct effect on linearity for a given LNA topology are usually bias current and load line. Referring to FIG. 27 if, for example, the linearity is low and the gain is high, an adjustment can be made in both the bias current and the load impedance to find a configuration that will be sufficient for both conditions. In one embodiment, the degree of linearity and gain can be assessed, for example, by observing the signal output DO as discussed above with reference to FIG. 26. The smaller the influence of B and C with respect to g1A1 and g2A2, the better the linearity of the LNA. Furthermore, by observing the output signals g1A1 and g2A2 in relationship with the input signal strengths A1 and A2, one can determine the gain g1 and g2 at frequencies f1 and f2.

In some embodiments, there may be complex interactions between components within the receiver chain which may not allow discrete parameter adjustment for each functional block in the receiver chain. In such cases, the macro model 306 may calculate a set of register values based on a particular error function and its evolution over time. This may typically involve an iterative process adjustment process. For example, referring to FIG. 28, the test mode 322, compare mode 323 and calculate modes 326 may be repeated until the digital output signal DO is within the defined tolerance of the reference signal DT.

As discussed above, in one embodiment the macro model 306 may be implemented as a state machine. This provides a high degree of built-in flexibility for adjustment calculations. For example, factory calibration can be used to generate the initial register values. In addition, register values can be updated once a real-time solution is found such that the new values can be used the next time a configuration is initialized. In other words, the macro model 306 may be capable of a type of learning process to adapt to the performance of the radio transceiver.

Once the digital output signal matches the reference signal DT within acceptable tolerances, the BITE module 106 may enter a "hold" mode 327, see FIG. 28. The purpose of hold mode is to hold the registers at their current values until the microcontroller (or baseband processor) issues a next command to monitor or to change to a different telecommunication standard. In addition, the current register values may be written into the memory 126 as the new initial values to be used next time the initialize mode is called.

As discussed above, the BITE module 106 may monitor and adjust any or all of the components of the receiver chain 286, including the LNA 116, the mixer 280, the bandpass filter 282 and the baseband amplifier 284. It is to be appreciated that a similar process may apply for any of the other components of the receiver chain and for any programmable components of the transmitter chain 324 (see FIG. 1). For example, referring to FIG. 36, there is illustrated a flow diagram of one embodiment of a method for testing performance parameters of the transmitter chain according to aspects of the invention. In a first step 396, a particular telecommunication standard (e.g., CDMA, GSM, etc.) may be selected for which the performance of the transmitter chain is to be tested. The baseband processor may then generate an interrupt to the microcontroller to cause the microcontroller to activate a test mode. The microcontroller 108 (see FIG. 1) may and load initial data values and calibration settings (step 398) that correspond to the selected mode to one or more components of the transmitter chain via the programming bus 110 in a manner similar to that discussed above in reference to the receiver chain. In one example, these initial values may be obtained from the memory 126. The microcontroller may then activate the BITE module 106 and begin testing/evaluating one or more components of the transmitter chain.

Figure 36:
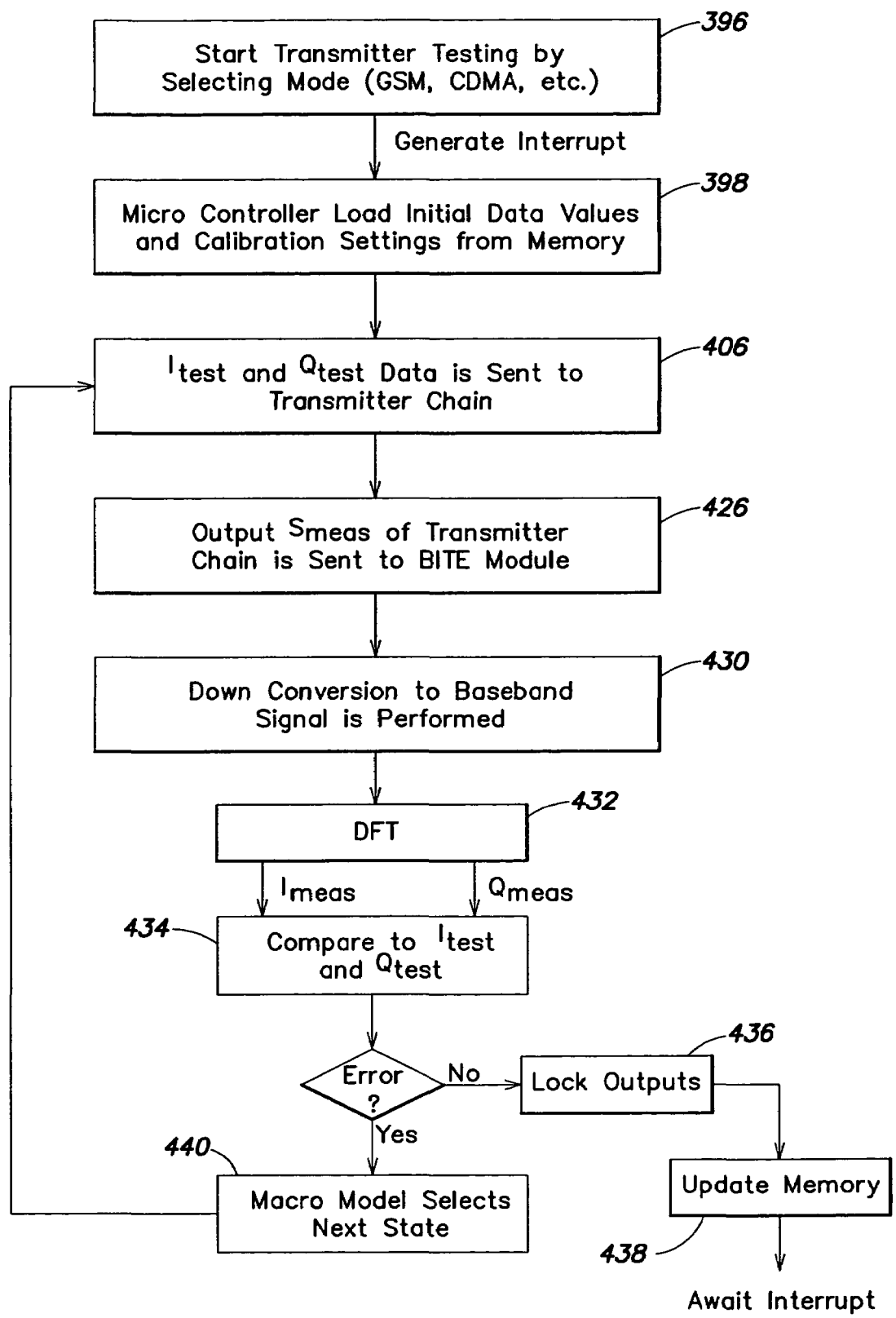
FIG. 36 is a flow diagram illustrating one example of a method for testing a transmitter chain of a radio transceiver according to aspects of the invention.
Figure 37:
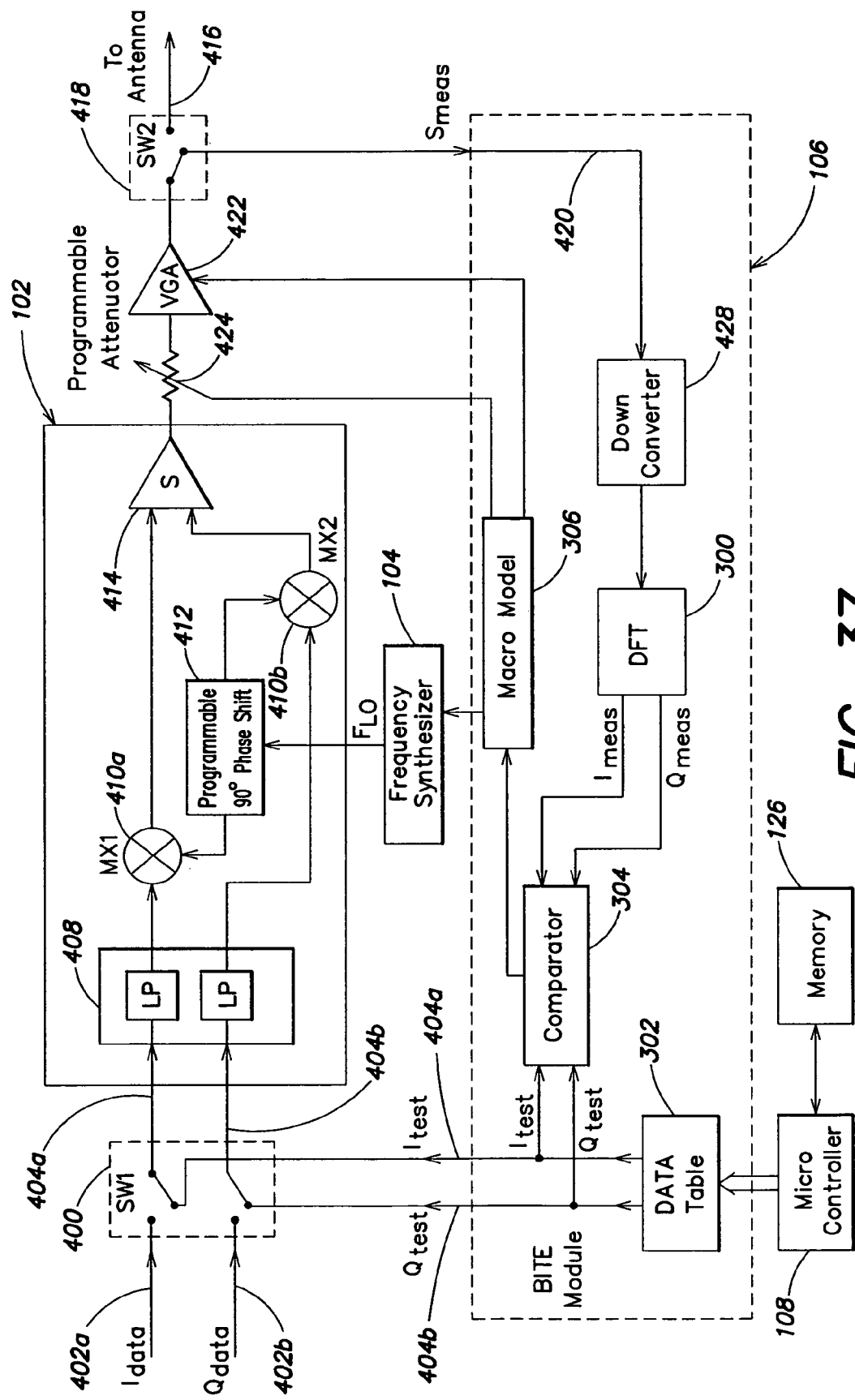
FIG. 37 is a block diagram of one embodiment of a built-in test and evaluation module being used to test a transmitter chain, according to aspects of the invention.

Referring to FIG. 37, there is illustrated a block diagram of one embodiment of a BITE module 106 coupled to the transmitter chain of the RFIC according to aspects of the invention. When the microcontroller 108 activates the BITE module 106, a control signal may also be sent to switch 400 to interrupt the normal data stream $I_{data}$ and $Q_{data}$ being sent to the transmitter 102 on lines 402a, 402b, and instead allow test data ($I_{test}$ and $Q_{test}$) to be sent from the BITE module to the transmitter 102 on lines 404a, 404b, as shown (step 406 in FIG. 36). The test data ($I_{test}$ and $Q_{test}$) may be generated from information stored in the data table 302 in a manner similar to that discussed above in reference to generating the test signal to test the receiver chain. The test data may also be fed to the comparator 304. In one example, the digital test may be filtered via a low pass filter 408 and mixed with a local oscillator signal $f_{lo}$ in mixers 410a, 410b. The local oscillator signal $f_{lo}$ may be generated by the frequency synthesizer 104 as discussed above. The local oscillator signal may also be fed to the mixers 410a, 410b via a programmable 90-degree phase shifter 412 in order to generate appropriate in-phase and quadrature signals. These resulting in-phase and quadrature signals from the outputs of mixers 410a and 410 be may be added together in a combiner 414 to generate a composite output signal from the transmitter 102.

Under normal operation (i.e., the signals $I_{data}$ and $Q_{data}$ are fed to the transmitter), the output signal from the transmitter 102 would be sent to the antenna module 174 (see FIG. 1) on line 416. In testing mode, the microcontroller may send a control signal to a switch 418 to decouple the output of the transmitter from the antenna and instead cause the output signal from the transmitter (referred to herein as $S_{meas}$ because it is a measured signal) to be fed to the BITE module 106 on line 420 (step 426 in FIG. 36). In one example, the output signal from the transmitter may be amplified by a variable gain amplifier 422, and/or attenuated by a programmable attenuator 424 before being fed to either the antenna or the BITE module.

According to one embodiment, the signal from the transmitter, $S_{meas}$, may be down-converted by a down-converter 428 in the BITE module to translate the radio frequency signal to a lower baseband frequency for processing (step 430 in FIG. 36). In one example, the down-converter 428 may be include a standard mixer, as known to those skilled in the art. The down-converted signal may then be supplied to the Discrete Fourier Transform (DFT) module 300 for digital processing. The DFT module 300 may process the received signal and perform a Fourier transform on the signal, as discussed above in reference to testing the receiver chain, to generate measured digital data streams Imeas and Qmeas (step 432 in FIG. 36) which represent in-phase and quadrature digital signal components, respectively. These digital signals Imeas and Qmeas may be fed to the comparator 304 where they can then be compared against the test data $I_{test}$ and $Q_{test}$ (step 434 in FIG. 36) in a manner similar to that described above in reference to the receiver chain. If the comparison of the between the measured data Imeas, Qmeas and the test data ($I_{test}$, $Q_{test}$) is within an acceptable margin of error, the BITE module may enter the "hold" mode, as discussed above. In the hold mode the digital registers may be locked at their current values (step 436 in FIG. 36) until the microcontroller (or baseband processor) issues a next command to monitor or to change to a different telecommunication standard. In addition, the current register values may be written into the memory 126 (step 438 in FIG. 36) as the new initial values to be used the next time testing is initiated.

If the comparator detects a difference in the digital data, it may initiates the macro model 306 to execute a software algorithm that computes adjustments, as discussed above. The macro model may compute new settings for transmitter chain components, such as, for example, the programmable attenuator 422, the VGA 424, or the frequency synthesizer 104. The adjustment may result in, for example, a frequency and phase shift due to a digital input to the programmable frequency synthesizer 104, signal attenuation due to an input to the programmable attenuator 424, or a variable gain adjustment due to an input to the programmable VGA 422. In addition, the macro model may signal that the test data may be re-sent to the transmitter 102 for another iteration of testing (step 440 in FIG. 36).

Having thus described several aspects of at least one embodiment of this invention, it is to be appreciated various alterations, modifications, and improvements will readily occur to those skilled in the art. Such and other alterations, modifications, and improvements are intended to be part of this disclosure and are intended to be within the scope of the invention. Accordingly, the foregoing description and draw- ings are by way of example only and are not intended to be limiting. The scope of the invention should be determined from proper construction of the appended claims, and their equivalents.

What is claimed is:

1. An integrated evaluation and test module for a radio transceiver implemented on a semiconductor substrate, the radio transceiver comprising a receiver chain that generates a radio frequency signal, the integrated evaluation and test module being integrated on the semiconductor substrate with the radio transceiver and the integrated evaluation and test module comprising:
    a control input adapted to receive a digital control signal;
    a signal input adapted to receive a digitized version of the radio frequency signal from the receiver chain of the radio transceiver;
    a processing module coupled to the signal input and adapted to receive and process the digitized version of the radio frequency signal from the receiver chain of the radio transceiver, and to provide a digital output signal;
    a reference generator adapted to generate a digital reference signal based on information contained in the digital control signal;
    a comparator coupled to the reference generator and to the processing module and adapted to receive the digital output signal and the digital reference signal, the comparator being configured to compare the digital output signal with the digital reference signal and to generate an error signal that identifies discrepancies between the digital output signal and the digital reference signal; and
    an adjustment module coupled to the comparator and adapted to receive the error signal from the comparator and to generate digital adjustment data based at least in part on the error signal, the adjustment module being further adapted to provide the digital adjustment data to at least one component of the receiver chain of the radio transceiver to adjust at least one parameter of the at least one component so as to modify the radio frequency signal to reduce the error signal.

2. The integrated evaluation and test module of claim 1, wherein the processing module comprises a processor configured to perform a Fourier transform on the digitized version of the radio frequency signal from the receiver chain of the radio transceiver to provide the digital output signal comprising frequency domain information about the radio frequency signal.

3. The integrated evaluation and test module of claim 1, wherein the digital reference signal contains frequency domain information corresponding to desired characteristics of the radio frequency signal.

4. The integrated evaluation and test module of claim 3, wherein the comparator is configured to compare the frequency domain information from the digital output signal with the frequency domain information contained in the digital reference signal and to generate the error signal which contains information about frequency domain variations between the digital output signal and the digital reference signal.

5. The integrated evaluation and test module of claim 4, wherein the adjustment module includes a finite state machine.

6. A method of testing performance of at least one component of a receiver chain for compliance with a selected communication standard, using an integrated evaluation and test module that is integrated on a semiconductor substrate with the receiver chain, the method comprising:
    receiving at the integrated evaluation and test module a digital control signal;
    receiving at the integrated evaluation and test module a digitized version of a radio frequency signal from the receiver chain;
    processing the digitized version of the radio frequency signal from the receiver chain to provide a digital output signal;
    generating a digital reference signal based on information contained in the digital control signal;
    comparing the digital output signal with the digital reference signal;
    generating an error signal based on the comparison that identifies discrepancies between the digital output signal and the digital reference signal;
    generating digital adjustment data based on the error signal; and
    providing the digital adjustment data from the integrated evaluation and test module to the at least one component of the receiver chain to adjust at least one parameter of the at least one component so as to modify the radio frequency signal to reduce the error signal.

7. The method of claim 6, wherein processing the digitized version of the radio frequency signal includes performing a Fourier transform on the digitized version of the radio frequency signal to provide the digital output signal comprising frequency domain information about the radio frequency signal.

8. The method of claim 6, wherein generating the digital reference signal Includes generating a digital reference signal containing frequency domain information corresponding to desired characteristics of the radio frequency signal.

9. The method of claim 8, wherein comparing the digital output signal with the digital reference signal includes comparing the frequency domain information from the digital output signal with the frequency domain information contained in the digital reference signal, and wherein generating the error signal includes generating an error signal that contains information about frequency domain variations between the digital output signal and the digital reference signal.

10. The method of claim 6, wherein the receiver chain is part of a radio transceiver that also comprises a transmitter chain, the method further comprising:
    generating a transmit radio frequency signal with the transmitter chain; and
    processing the transmit radio frequency signal with the receiver chain to generate the radio frequency signal.

* * * * *

UNITED STATES PATENT AND TRADEMARK OFFICE
CERTIFICATE OF CORRECTION

PATENT NO. : 7,580,684 B2
APPLICATION NO. : 11/055589
DATED : August 25, 2009
INVENTOR(S) : Russell J. Cyr et al.

It is certified that error appears in the above-identified patent and that said Letters Patent is hereby corrected as shown below:

In column 14, line 38, "O" should be changed to --Q--

In column 32, line 11, " $EVM_{n+1} = \sqrt{|I(t_n) - S_{In} +|^2 + |Q(t_n) - S_{Qn}|^2}$ ,"

should be changed to -- $EVM_{n+1} = \sqrt{|I(t_{n+1}) - S_{In+1}|^2 + |Q(t_{n+1}) - S_{Qn+1}|^2}$ --

In column 38, line 39, in claim 8, "Includes" should be changed to --includes--

Signed and Sealed this
Eighteenth Day of October, 2011

David J. Kappos
*Director of the United States Patent and Trademark Office*